US012336403B2

(12) United States Patent
Yu et al.

(10) Patent No.: US 12,336,403 B2
(45) Date of Patent: *Jun. 17, 2025

(54) DISPLAY SUBSTRATE, METHOD OF MANUFACTURING THE SAME, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Pengfei Yu, Beijing (CN); Haigang Qing, Beijing (CN); Tinghua Shang, Beijing (CN); Jie Dai, Beijing (CN); Lu Bai, Beijing (CN); Chenxing Wan, Beijing (CN); Yang Zhou, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/591,885

(22) Filed: Feb. 29, 2024

(65) Prior Publication Data

US 2024/0206268 A1 Jun. 20, 2024

Related U.S. Application Data

(63) Continuation of application No. 17/418,147, filed as application No. PCT/CN2020/112675 on Aug. 31, 2020, now Pat. No. 11,950,466.

(51) Int. Cl.
*G09G 3/32* (2016.01)
*G09G 3/3233* (2016.01)
(Continued)

(52) U.S. Cl.
CPC ......... *H10K 59/131* (2023.02); *G09G 3/3233* (2013.01); *H10K 50/813* (2023.02);
(Continued)

(58) Field of Classification Search
CPC .... H10K 59/131; H10K 50/813; H10K 71/00; H10K 59/1201; H10K 59/351;
(Continued)

(56) References Cited

U.S. PATENT DOCUMENTS 11,574,595 B2    2/2023   Zhang et al.
2017/0062546 A1  5/2017   Kim et al.
(Continued)

FOREIGN PATENT DOCUMENTS

CN    107946337 A    4/2018
CN    108538884 A    9/2018
(Continued)

OTHER PUBLICATIONS

Corrected Notice of Allowability for copending U.S. Appl. No. 17/418,147, dated Dec. 6, 2023, 3 Pages.
(Continued)

*Primary Examiner* — Chanh D Nguyen
*Assistant Examiner* — Nguyen H Truong
(74) *Attorney, Agent, or Firm* — BROOKS KUSHMAN P.C.

(57) ABSTRACT

A display substrate, and a display apparatus are provided. Multiple subpixels in the display substrate include first and second subpixels. Each subpixel includes a power signal line pattern and a light-emitting element. The power signal line pattern includes first and second power line portions. At least a part of the first power line portion extends in a second direction. The light-emitting element includes an anode pattern. The second power line portion includes a body portion, a first end portion, and a second end portion. Each
(Continued)

of the subpixels further includes a power compensation pattern, and the power compensation pattern forms an integral structure with the body portion and the first power line portion.

18 Claims, 42 Drawing Sheets

(51) Int. Cl.
| | |
|---|---|
| *H10K 50/813* | (2023.01) |
| *H10K 59/131* | (2023.01) |
| *H10K 59/80* | (2023.01) |
| *H10K 71/00* | (2023.01) |
| *H10K 59/12* | (2023.01) |
| *H10K 59/35* | (2023.01) |
| *H10K 59/65* | (2023.01) |

(52) U.S. Cl.
CPC ....... *H10K 59/80515* (2023.02); *H10K 71/00* (2023.02); *G09G 2300/0426* (2013.01); *G09G 2300/0842* (2013.01); *G09G 2310/08* (2013.01); *H10K 59/1201* (2023.02); *H10K 59/351* (2023.02); *H10K 59/65* (2023.02)

(58) Field of Classification Search
CPC ............. H10K 59/80515; H10K 59/65; H10K 50/865; H10K 59/12; H10K 59/35; H10K 59/38; H10K 59/88; H10K 59/121; H10K 59/122; H10K 59/124; H10K 59/126; H10K 59/873; H10K 59/1315; H10K 59/813; H10K 59/1213; H10K 59/1216; H10K 59/80516; H10K 59/8792; H10K 71/70; G09G 3/3233; G09G 2300/0426; G09G 2300/0842; G09G 2310/08; G09G 3/32; G09G 3/00; G09G 3/10; G09G 3/3225; G09G 3/3291; G09G 3/3258; G09G 3/3266
USPC ......................................... 345/156, 173, 174
See application file for complete search history.

(56) References Cited

U.S. PATENT DOCUMENTS

| | | | |
|---|---|---|---|
| 2017/0365647 A1* | 12/2017 | Choi | ................... H10D 86/481 |
| 2018/0102381 A1 | 4/2018 | Chen et al. | |
| 2018/0254304 A1 | 9/2018 | Hong et al. | |
| 2018/0342570 A1 | 11/2018 | Hong et al. | |
| 2019/0114459 A1 | 4/2019 | Ma et al. | |
| 2020/0105849 A1* | 4/2020 | Kim | ..................... H10K 59/126 |
| 2020/0211473 A1 | 7/2020 | Kim et al. | |
| 2021/0159292 A1 | 5/2021 | Zhang et al. | |
| 2021/0174746 A1 | 6/2021 | Zhang et al. | |
| 2021/0408153 A1 | 12/2021 | Sun et al. | |
| 2022/0123056 A1 | 4/2022 | Li et al. | |
| 2022/0157248 A1 | 5/2022 | Zhang et al. | |
| 2022/0181402 A1 | 6/2022 | Huang et al. | |
| 2022/0285458 A1 | 9/2022 | Shang et al. | |
| 2022/0320225 A1 | 10/2022 | Yu et al. | |
| 2022/0336566 A1 | 10/2022 | Chen et al. | |
| 2022/0375409 A9 | 11/2022 | Zhang et al. | |
| 2024/0266359 A1* | 8/2024 | Umezaki | ............. H01L 27/1222 |
| 2024/0276813 A1* | 8/2024 | Du | ....................... H10K 59/353 |

FOREIGN PATENT DOCUMENTS

| | | |
|---|---|---|
| CN | 108922469 A | 11/2018 |
| CN | 108933155 A | 12/2018 |
| CN | 110021654 A | 7/2019 |
| CN | 110707139 A | 1/2020 |
| CN | 111477669 A | 7/2020 |
| CN | 111584599 A | 8/2020 |
| KR | 20180062897 A | 6/2018 |

OTHER PUBLICATIONS

First Office Action for Chinese Application No. 202080001747.2, dated Feb. 22, 2023, 8 Pages (including English Translation).
International Search Report and Written Opinion for Application No. PCT/CN2020/112675, dated May 28, 2021, 15 Pages (including English Translation).
Non-final Rejection for copending U.S. Appl. No. 17/418,147, dated Mar. 29, 2023, 7 Pages.
Final Rejection for copending U.S. Appl. No. 17/418,147, dated Sep. 13, 2023, 8 Pages.
Notice of Allowance and Fees due for copending U.S. Appl. No. 17/418,147, dated Mar. 29, 2023, 13 Pages.

* cited by examiner

DISPLAY SUBSTRATE, METHOD OF MANUFACTURING THE SAME, AND DISPLAY APPARATUS

CROSS-REFERENCE TO RELATED APPLICATIONS

This application is a continuation of U.S. patent application Ser. No. 17/418,147 filed on Jun. 24, 2021, which is the U.S. national phase of PCT Application No. PCT/CN2020/112675 filed on Aug. 31, 2020, which are incorporated herein by reference in their entireties.

TECHNICAL FIELD

The present disclosure relates to the field of display technologies, and in particular, to a display substrate, a method of manufacturing the display substrate, and a display apparatus.

BACKGROUND

With the continuous development of display technologies, the application range of a display screen with a fingerprint recognition function becomes increasingly wide. Such a display screen usually uses an optical fingerprint recognition technology. That is, the principles of refraction and reflection of light are used to implement user fingerprint recognition.

When such a display screen is used to perform fingerprint recognition, a finger is placed on the display screen. Light rays emitted by an internal light source located under an array substrate in the display screen are reflected at different angles by uneven patterns on the finger pulp, such that intensities of light rays received by sensing elements located in the back side of the display screen are different, so as to further generate different photocurrents; based on the magnitudes of the photocurrents, a fingerprint pattern may be detected, and comparison and recognition may be performed.

SUMMARY

An objective of the present disclosure is to provide a display substrate, a method of manufacturing the display substrate, and a display apparatus.

A first aspect of the present disclosure provides a display substrate, including a base and a plurality of subpixels distributed in an array on the base, where the plurality of subpixels include a first subpixel and a second subpixel, and each subpixel includes:

a power signal line pattern, where the power signal line pattern includes a first power line portion and a second power line portion; and at least a part of the first power line portion extends in a second direction; and a light-emitting element, where the light-emitting element includes an anode pattern; and in the display substrate:

an overlap between the anode pattern of the first subpixel and the power signal line pattern is larger in area than an overlap between the anode pattern of the second subpixel and the power signal line pattern, and an overlap between the anode pattern of the first subpixel and the first power line portion is larger in area than an overlap between the anode pattern of the first subpixel and the second power line portion.

Optionally, the plurality of subpixels are divided into a plurality of pixel units, and each pixel unit includes one red subpixel, one blue subpixel, a first green subpixel, and a second green subpixel; and the first subpixel includes the red subpixel, and the second subpixel includes the blue subpixel, the first green subpixel or the second green subpixel.

Optionally, the plurality of subpixels are divided into a plurality of pixel units, and each pixel unit includes one red subpixel, one blue subpixel, a first green subpixel, and a second green subpixel; and an overlap between the anode pattern of the first green subpixel and the second power line portion is larger in area than an overlap between the anode pattern of the second green subpixel and the second power line portion.

Optionally, a length of the anode pattern of the first subpixel in the second direction is greater than a spacing distance between two adjacent second power line portions in the second direction.

Optionally, the second power line portion includes a body portion, a first end portion, and a second end portion, the body portion is spaced from the first power line portion in a first direction, the first direction intersects the second direction, the first end portion and the second end portion are disposed opposite to each other in the second direction, the first end portion is separately coupled to one end of the body portion and the first power line portion, the second end portion is separately coupled to the other end of the body portion and the first power line portion, and a hole is provided between the first power line portion and the second power line portion.

Optionally, the plurality of subpixels are divided into a plurality of pixel units, and each pixel unit includes one red subpixel, one blue subpixel, a first green subpixel, and a second green subpixel;

in pixel units located in the same row in the first direction, the anode patterns included in the red subpixels, the anode patterns included in the blue subpixels, and the anode patterns included in the first green subpixels in the pixel units are distributed in one row, and the anode patterns included in the second green subpixels in the pixel units are distributed in another row;

the hole includes a first hole, and a part of an orthographic projection of the first hole onto the base is located inside an orthographic projection of the anode pattern included in the first green subpixel onto the base;

another part of the orthographic projection of the first hole onto the base is located between an orthographic projection of the anode pattern included in the red subpixel onto the base and the orthographic projection of the anode pattern included in the first green subpixel onto the base; the anode pattern included in the red subpixel and the anode pattern included in the first green subpixel are located in the same row; and the another part of the orthographic projection of the first hole onto the base is located between an orthographic projection of the anode pattern included in the blue subpixel onto the base and the orthographic projection of the anode pattern included in the first green subpixel onto the base; the anode pattern included in the blue subpixel and the anode pattern included in the first green subpixel are located in two adjacent rows.

Optionally, the area of the part of the orthographic projection of the first hole onto the base is less than 50% of the overall area of the orthographic projection of the first hole onto the base.

Optionally, the plurality of subpixels are divided into a plurality of pixel units, and each pixel unit includes one red subpixel, one blue subpixel, a first green subpixel, and a second green subpixel;

in pixel units located in the same row in the first direction, the anode patterns included in the red subpixels, the anode patterns included in the blue subpixels, and the anode patterns included in the first green subpixels in the pixel units are distributed in one row, and the anode patterns included in the second green subpixels in the pixel units are distributed in another row; and the hole includes a second hole, an orthographic projection of the second hole onto the base is located between an orthographic projection of the anode pattern included in the first green subpixel onto the base and an orthographic projection of the anode pattern included in the blue subpixel onto the base, and the orthographic projection of the second hole onto the base and an orthographic projection of the anode pattern included in the red subpixel onto the base do not overlap; the anode pattern included in the first green subpixel and the anode pattern included in the blue subpixel are located in the same row, and the anode pattern included in the red subpixel and the anode pattern included in the first green subpixel are located in two adjacent rows.

Optionally, the plurality of subpixels are divided into a plurality of pixel units, and each pixel unit includes one red subpixel, one blue subpixel, a first green subpixel, and a second green subpixel;

in pixel units located in the same row in the first direction, the anode patterns included in the red subpixels, the anode patterns included in the blue subpixels, and the anode patterns included in the first green subpixels in the pixel units are arranged in one row, and the anode patterns included in the second green subpixels in the pixel units are arranged in another row;

the hole includes a third hole, and a part of an orthographic projection of the third hole onto the base is located inside an orthographic projection of the anode pattern included in the blue subpixel onto the base; and another part of the orthographic projection of the third hole onto the base is located between the orthographic projection of the anode pattern included in the blue subpixel onto the base and an orthographic projection of the anode pattern included in the second green subpixel onto the base; the anode pattern included in the blue subpixel and the anode pattern included in the second green subpixel are located in two adjacent rows.

Optionally, the area of the part of the orthographic projection of the third hole onto the base is less than 30% of the overall area of the orthographic projection of the third hole onto the base.

Optionally, the plurality of subpixels are divided into a plurality of pixel units, and each pixel unit includes one red subpixel, one blue subpixel, a first green subpixel, and a second green subpixel;

in pixel units located in the same row in the first direction, the anode patterns included in the red subpixels, the anode patterns included in the blue subpixels, and the anode patterns included in the first green subpixels in the pixel units are arranged in one row, and the anode patterns included in the second green subpixels in the pixel units are arranged in another row;

the hole includes a fourth hole, and a part of an orthographic projection of the fourth hole onto the base is located inside an orthographic projection of the anode pattern included in the red subpixel onto the base; and another part of the orthographic projection of the fourth hole onto the base is located between the orthographic projection of the anode pattern included in the red subpixel onto the base and an orthographic projection of the anode pattern included in the second green subpixel onto the base; and the anode pattern included in the red subpixel and the anode pattern included in the second green subpixel are located in two adjacent rows.

Optionally, the area of the part of the orthographic projection of the fourth hole onto the base is less than 75% of the overall area of the orthographic projection of the fourth hole onto the base.

Optionally, the subpixel further includes a power compensation pattern, at least a part of the power compensation pattern extends in the first direction, and the power compensation pattern is separately coupled to the body portion and a first power line portion in a subpixel adjacent in the first direction to the subpixel to which the power compensation pattern belongs.

Optionally, the power compensation pattern is a strip-like structure extending in the first direction.

Optionally, in a plane parallel to the base, in a direction perpendicular to the first direction, an end of the power compensation pattern that is directly coupled to the first power line portion has a first width, and in a direction toward the first power line portion, the first width gradually increases.

Optionally, the subpixel further includes: a reset signal line pattern, a gate line pattern, and a light-emitting control signal line pattern that are distributed in sequence in the second direction; and at least a part of the reset signal line pattern extends in the first direction, at least a part of the gate line pattern extends in the first direction, and at least a part of the light-emitting control signal line pattern extends in the first direction; and an orthographic projection of the power compensation pattern onto the base is located between an orthographic projection of the gate line pattern onto the base and an orthographic projection of the light-emitting control signal line pattern onto the base.

Optionally, the subpixel further includes a light-emitting control signal line pattern, and at least a part of the light-emitting control signal line pattern extends in the first direction; and an orthographic projection of the light-emitting control signal line pattern onto the base partially overlaps an orthographic projection of the hole onto the base.

Optionally, the light-emitting control signal line pattern includes a first light-emitting control portion and a second light-emitting control portion, and an orthographic projection of the first light-emitting control portion onto the base separately overlaps an orthographic projection of the body portion onto the base, the orthographic projection of the hole onto the base, and an orthographic projection of the first power line portion onto the base; in the second direction, an orthographic projection of the second light-emitting control portion onto the base is opposite to an orthographic projection of the power compensation pattern onto the base; and in a plane parallel to the base, in a direction perpendicular to the first direction, a width of the second light-emitting control portion is less than a width of the first light-emitting control portion.

Optionally, the subpixel further includes a light-emitting element, the light-emitting element includes an anode pattern, and an orthographic projection of the anode pattern onto the base overlaps an orthographic projection of the power compensation pattern onto the base.

Optionally, the body portion includes a first body portion and a second body portion, the first body portion is close to the first end portion, the second body portion is close to the second end portion, and in a plane parallel to the base, in a direction perpendicular to the second direction, a width of the first body portion is greater than a width of the second body portion; and the subpixel further includes a subpixel driving circuit, the subpixel driving circuit includes a driving transistor and a storage capacitor, a first plate of the storage capacitor is coupled to a gate electrode of the driving transistor, an orthographic projection of a second plate of the storage capacitor onto the base overlaps an orthographic projection of the first body portion onto the base, and the second plate of the storage capacitor is coupled to the first body portion through a via hole provided at the overlap.

Optionally, the orthographic projection of the second plate of the storage capacitor onto the base does not overlap an orthographic projection of the hole onto the base.

Optionally, the plurality of subpixels are divided into a plurality of rows of subpixels, and each row of subpixels includes a plurality of subpixels arranged in sequence in the first direction; and the subpixel further includes:

a first data line pattern and a second data line pattern that are disposed opposite to each other in the first direction, where at least a part of the first data line pattern and at least a part of the second data line pattern both extend in the second direction; and an orthographic projection of the first data line pattern onto the base overlaps an orthographic projection of a first power line portion in a subpixel, adjacent in the first direction to the subpixel to which the first data line pattern belongs, onto the base, and an orthographic projection of the second data line pattern onto the base overlaps an orthographic projection of the body portion onto the base.

Optionally, the orthographic projection of the first data line pattern onto the base does not overlap an orthographic projection of the hole onto the base; and/or the orthographic projection of the second data line pattern onto the base does not overlap the orthographic projection of the hole onto the base.

Optionally, the first power line portion includes a second sub-portion and a first sub-portion that is used for defining the hole, and in a plane parallel to the base, in a direction perpendicular to the second direction, a width of the first sub-portion is less than a width of the second sub-portion.

Optionally, the subpixel further includes a light-emitting element, an initialization signal line pattern, a reset signal line pattern, a gate line pattern, and a light-emitting control signal line pattern; and at least a part of the initialization signal line pattern, at least a part of the reset signal line pattern, at least a part of the gate line pattern, and at least a part of the light-emitting control signal line pattern all extend in a first direction; and the subpixel further includes:

a first data line pattern and a second data line pattern that are disposed opposite to each other in the first direction, where at least a part of the first data line pattern and at least a part of the second data line pattern both extend in the second direction; and a subpixel driving circuit, where the subpixel driving circuit includes a first transistor, a second transistor, a third transistor, a fourth transistor, a fifth transistor, a sixth transistor, a seventh transistor, and a storage capacitor, where a gate electrode of the third transistor is coupled to a second electrode of the first transistor, a first electrode of the third transistor is coupled to a second electrode of the fifth transistor, and a second electrode of the third transistor is coupled to a first electrode of the first transistor;

a gate electrode of the first transistor is coupled to the gate line pattern;

a gate electrode of the second transistor is coupled to the reset signal line pattern, a first electrode of the second transistor is coupled to the initialization signal line pattern, and a second electrode of the second transistor is coupled to the gate electrode of the third transistor;

a gate electrode of the fourth transistor is coupled to the gate line pattern; and a first electrode of the fourth transistor is coupled to the first data line pattern or the second data line pattern, and a second electrode of the fourth transistor is coupled to the first electrode of the third transistor;

a gate electrode of the fifth transistor is coupled to the light-emitting control signal line pattern, and a first electrode of the fifth transistor is coupled to the power signal line pattern;

a gate electrode of the sixth transistor is coupled to the light-emitting control signal line pattern, a first electrode of the sixth transistor is coupled to the second electrode of the third transistor, and a second electrode of the sixth transistor is coupled to the light-emitting element;

a gate electrode of the seventh transistor is coupled to the reset signal line pattern of a next subpixel adjacent in the second direction, a first electrode of the seventh transistor is coupled to the initialization signal line pattern of the next subpixel adjacent in the second direction, and a second electrode of the seventh transistor is coupled to the light-emitting element; and a first plate of the storage capacitor is reused as the gate electrode of the third transistor, and the second plate of the storage capacitor is coupled to the power signal line pattern.

Based on the foregoing technical solution of the display substrate, a second aspect of the present disclosure provides a display apparatus, including the foregoing display substrate.

Based on the foregoing technical solution of the display substrate, a third aspect of the present disclosure provides a method of manufacturing a display substrate, including: manufacturing, on a base, a plurality of subpixels distributed in an array, where the plurality of subpixels include a first subpixel and a second subpixel, and steps of manufacturing each subpixel specifically include:

manufacturing a power signal line pattern, where the power signal line pattern includes a first power line portion and a second power line portion; and at least a part of the first power line portion extends in a second direction; and manufacturing a light-emitting element, where the light-emitting element includes an anode pattern; and in the display substrate:

an overlap between the anode pattern of the first subpixel and the power signal line pattern is larger in area than an overlap between the anode pattern of the second subpixel and the power signal line pattern, and an overlap between the anode pattern of the first subpixel and the first power line portion is larger in area than an overlap between the anode pattern of the first subpixel and the second power line portion.

BRIEF DESCRIPTION OF THE DRAWINGS

The accompanying drawings described herein are used to provide a further understanding of the present disclosure and constitute a part of the present disclosure, and the schematic embodiments of the present disclosure and the description thereof are used to explain the present disclosure and do not constitute an improper limitation on the present disclosure. In the accompanying drawings.

DETAILED DESCRIPTION

To further describe a display substrate, a method of manufacturing same, and a display apparatus provided in the embodiments of the present disclosure, detailed description is provided below with reference to the accompanying drawings of the specification.

The structure of an AMOLED display panel includes: a base, a plurality of subpixel driving circuits disposed on the base, and a plurality of light-emitting elements disposed on a side, facing away from the base, of the subpixel driving circuits. The light-emitting elements are in a one-to-one correspondence with the subpixel driving circuits. The subpixel driving circuits are used for driving the corresponding light-emitting elements to emit light, to implement a display function of the display panel.

Figure 1A:
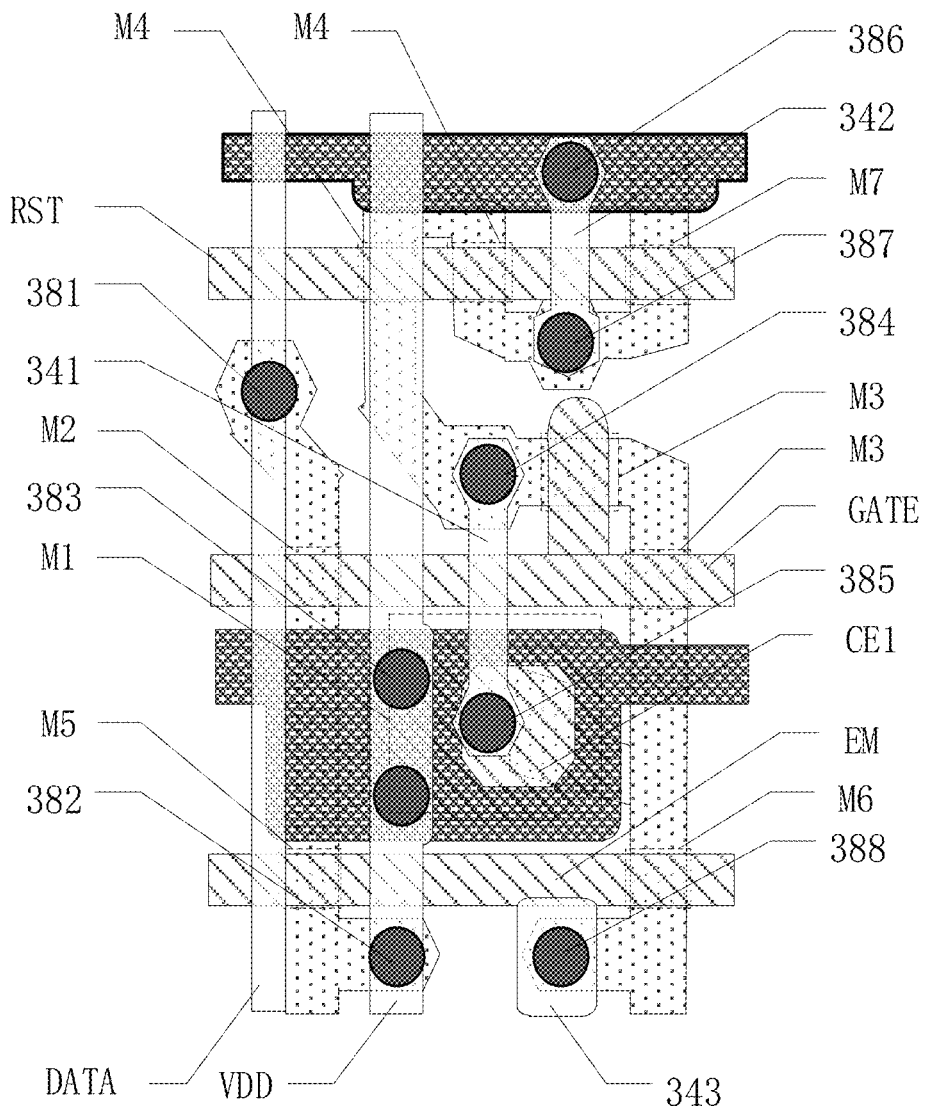
FIG. 1a is a schematic layout diagram of a subpixel in the related art.
Figure 1B:
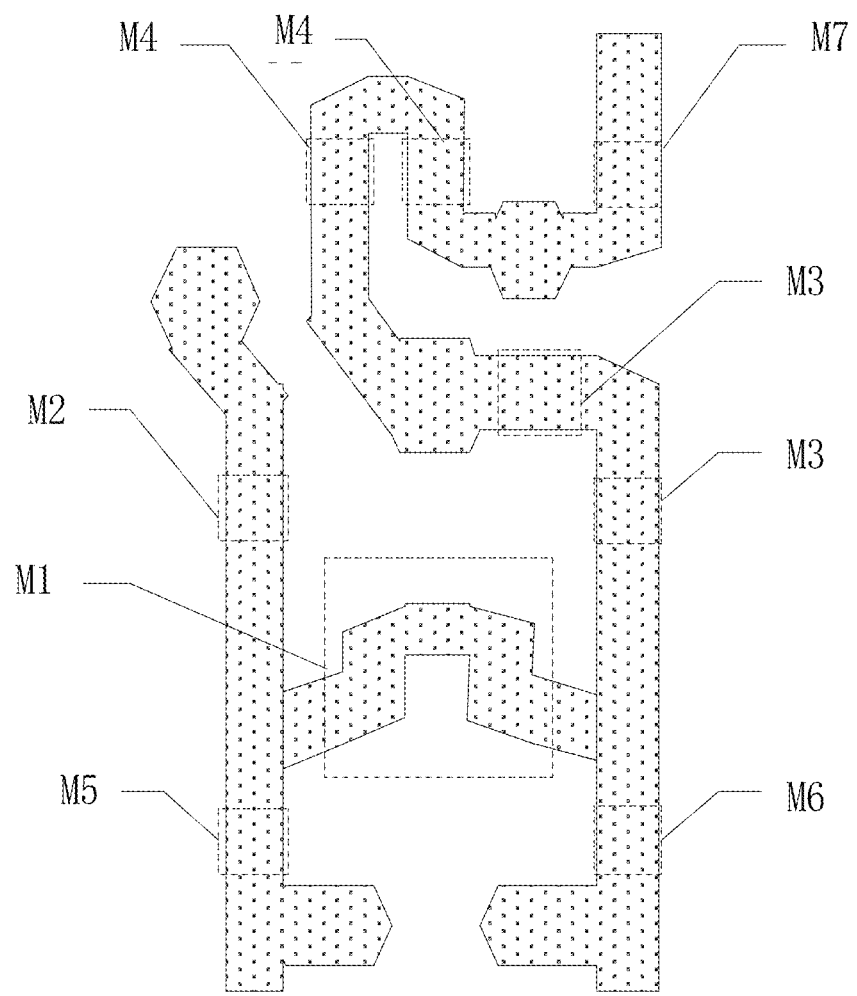
FIG. 1b is a schematic layout diagram of an active layer in FIG. 1.
Figure 1C:
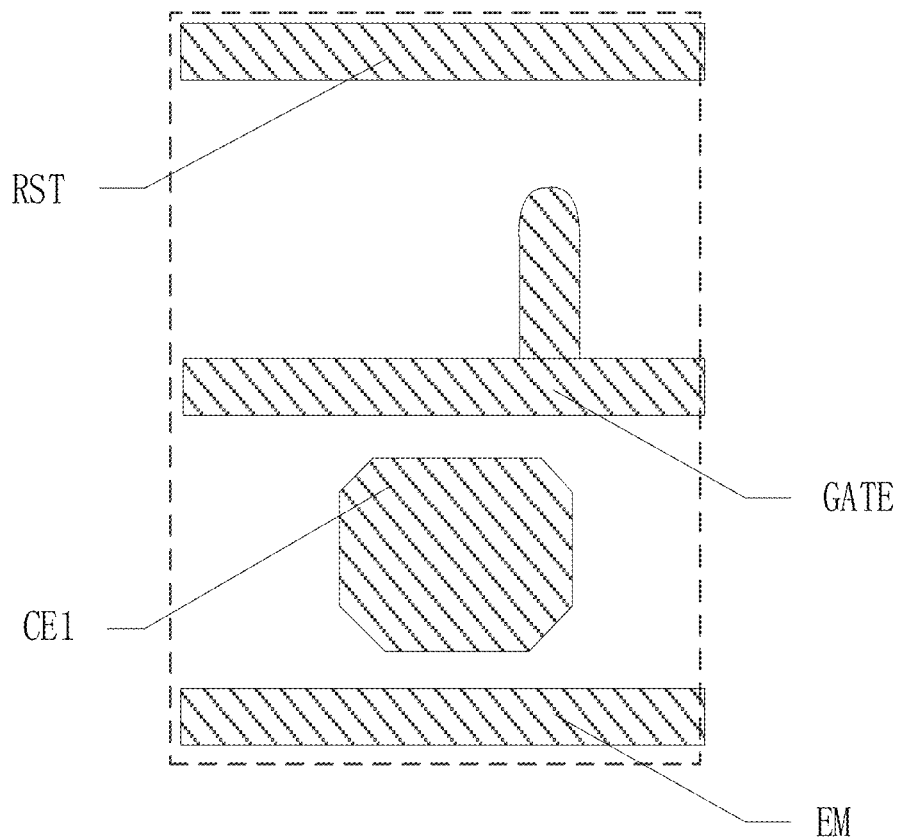
FIG. 1c is a schematic layout diagram of a first gate metal layer in FIG. 1.
Figure 1D:
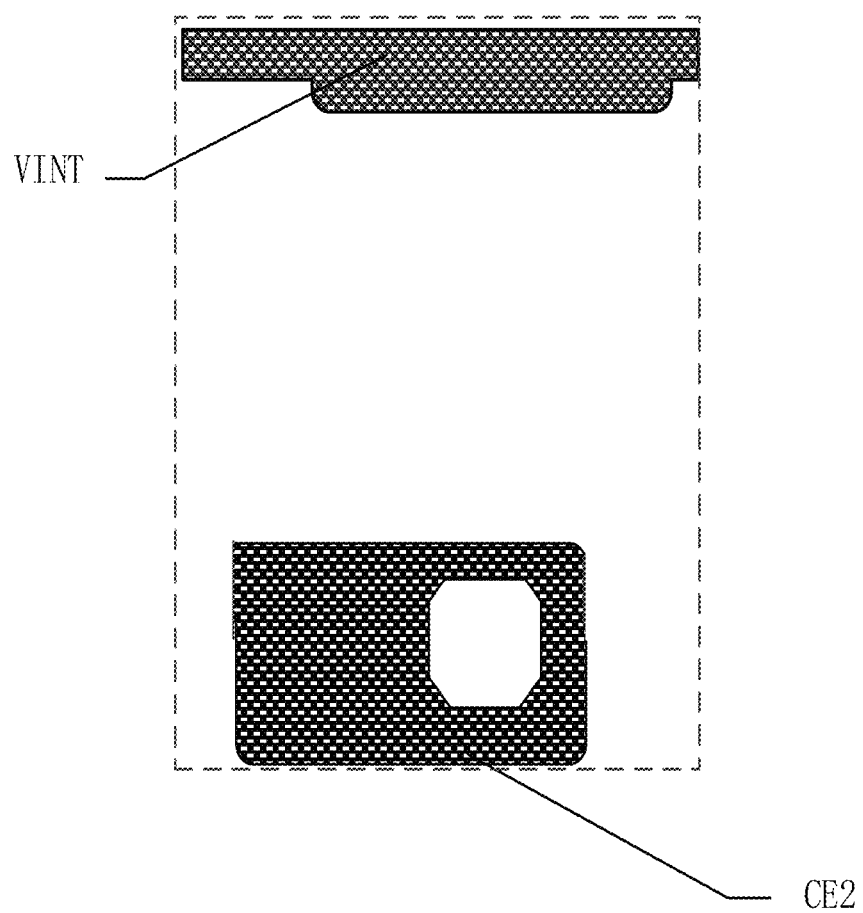
FIG. 1d is a schematic layout diagram of a second gate metal layer in FIG. 1.
Figure 1E:
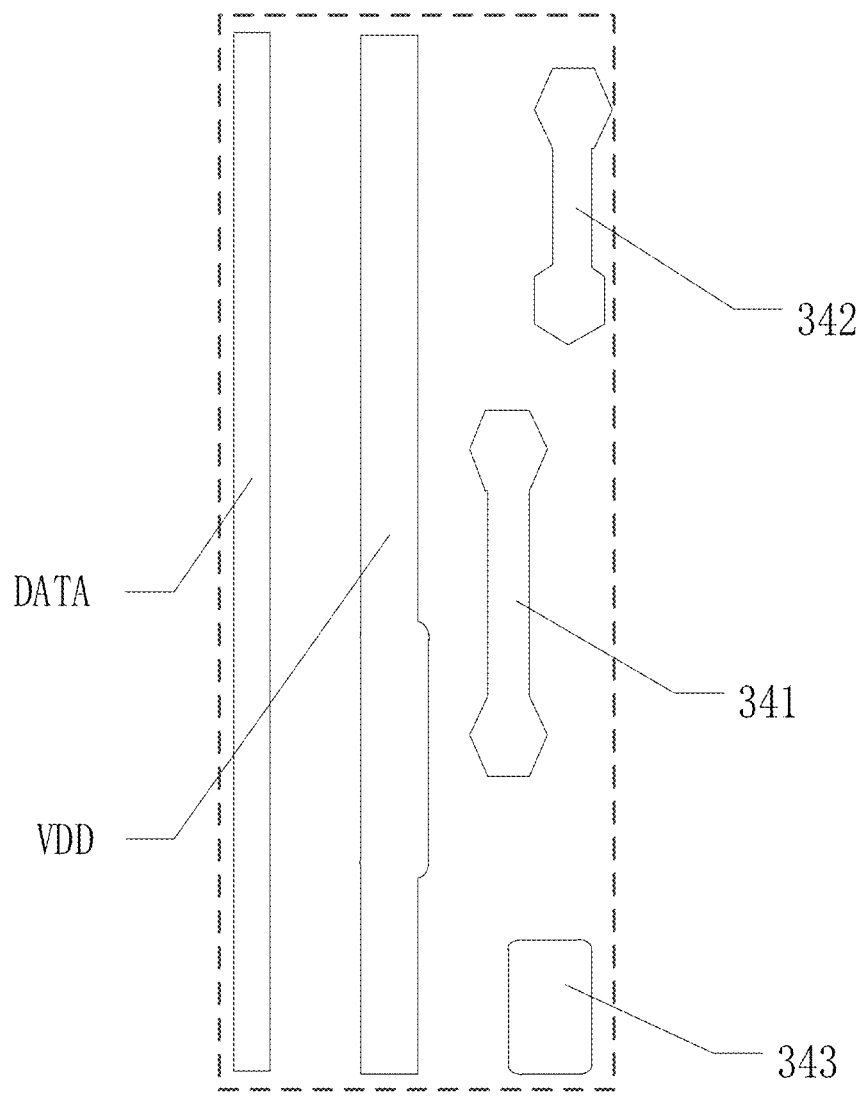
FIG. 1e is a schematic layout diagram of a source-drain metal layer in FIG. 1.

In the related art, the subpixel driving circuit usually includes a plurality of thin-film transistors. As shown in FIG. 1a, FIG. 1a shows a specific layout manner of seven thin-film transistors M1 to M7 when the subpixel driving circuit includes the seven thin-film transistors. In a layout in such a manner, the subpixel driving circuit includes an active layer shown in FIG. 1b, a first metal layer shown in FIG. 1c, a second metal layer shown in FIG. 1d, and a third metal layer shown in FIG. 1e. The active layer includes active patterns (parts in dotted-line boxes shown in FIG. 1b) used for forming channel regions of the thin-film transistors and doped active patterns that are coupled to the active patterns and have electrical conductivity (parts outside dotted-line boxes shown in FIG. 1b). The first metal layer includes gate electrodes of the thin-film transistors, scan signal lines GATE coupled to the gate electrodes, one plate CE1 of a storage capacitor in the subpixel driving circuit, a reset signal line RST, and a light-emitting control signal line EM. The second metal layer includes an initialization signal line VINT and the other plate CE1 of the storage capacitor in the subpixel driving circuit. The third metal layer includes a data line DATA, a power signal line VDD, and some conductive connection portions (for example, labels 341 to 343).

It needs to be noted that as shown in FIG. 1, in a layout of the subpixel driving circuit, to implement couplings between functional patterns disposed in different layers, some via holes (for example, labels 381 to 388) may be further provided.

Figure 2:
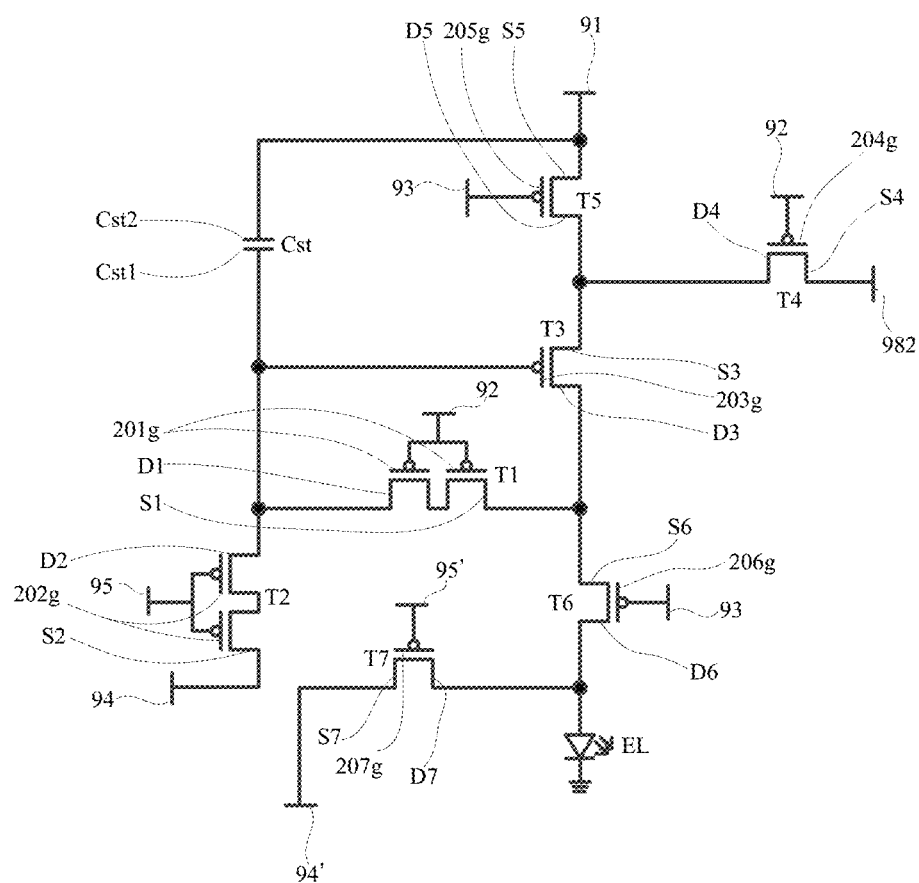
FIG. 2 is a circuit diagram of a subpixel driving circuit according to an embodiment of the present disclosure.
Figure 3:
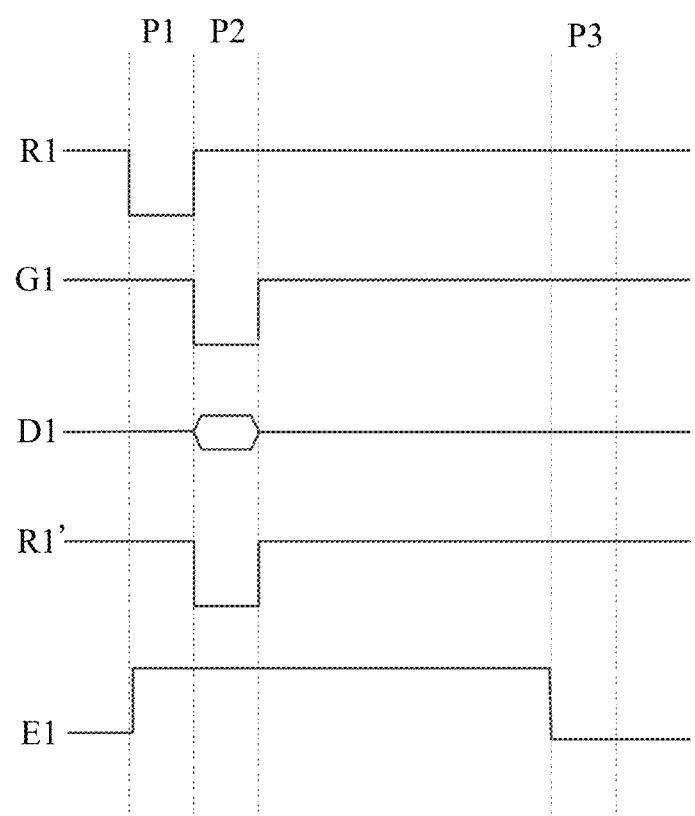
FIG. 3 is an operating timing diagram of a subpixel driving circuit according to an embodiment of the present disclosure.
Figure 4:
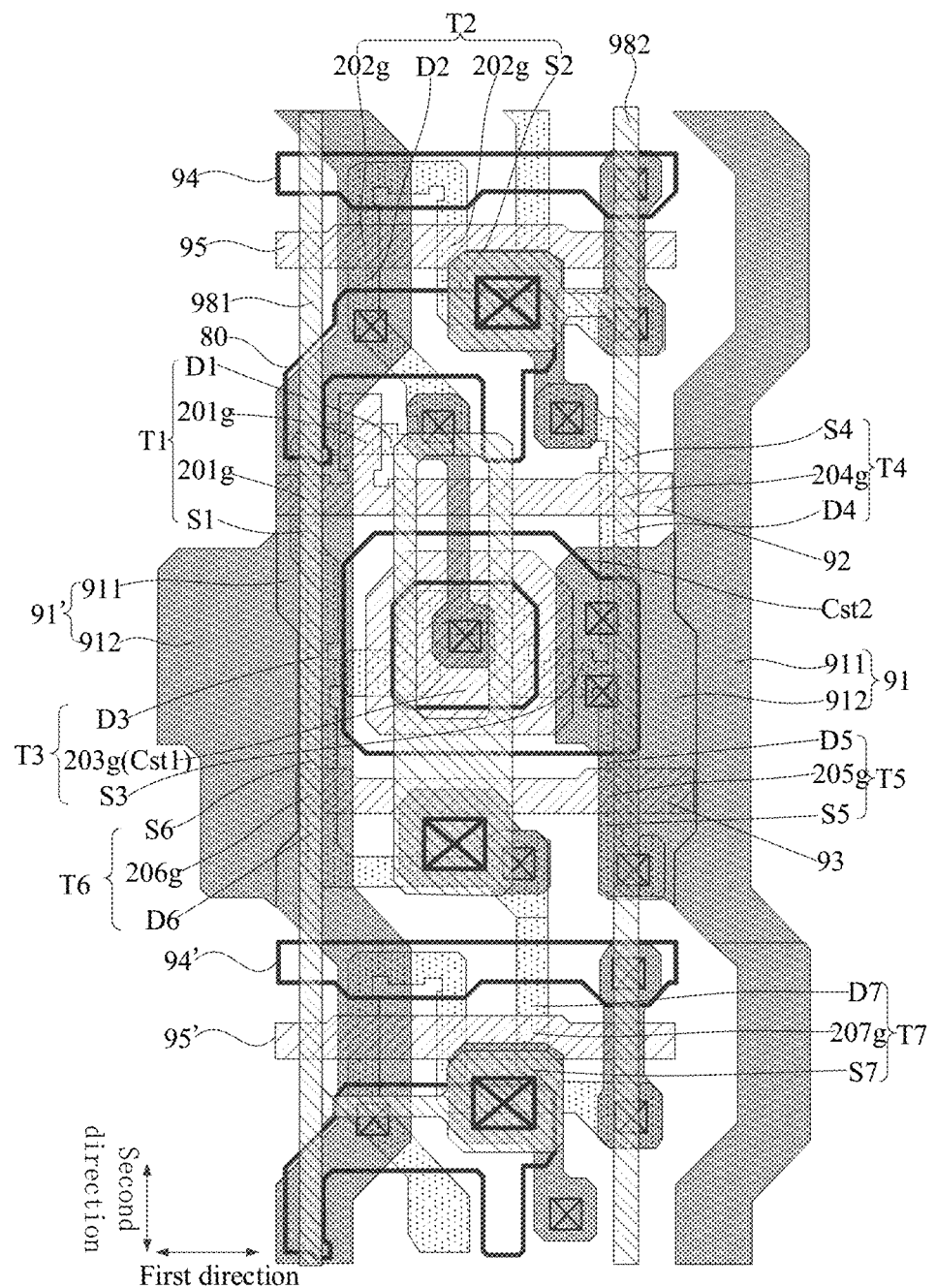
FIG. 4 is a first schematic layout diagram of a subpixel according to an embodiment of the present disclosure.

Referring to FIG. 2 to FIG. 4, the present disclosure provides a display substrate, including a base and a plurality of subpixels distributed in an array on the base. Each subpixel includes a light-emitting element, an initialization signal line pattern 94, a reset signal line pattern 95, a gate line pattern 92, a light-emitting control signal line pattern 93, a power signal line pattern 91, and a first data line pattern 981 and a second data line pattern 982 that are disposed opposite to each other in a first direction.

At least a part of the initialization signal line pattern 94, at least a part of the reset signal line pattern 95, at least a part of the gate line pattern 92, and at least a part of the light-emitting control signal line pattern 93 all extend in a first direction.

At least a part of the power signal line pattern 91, at least a part of the first data line pattern 981, and at least a part of the second data line pattern 982 all extend in a second direction. The first direction intersects the second direction. For example, the first direction includes a direction X, the second direction includes a direction Y.

All the subpixels included in the display substrate can be divided into a plurality of rows of subpixels arranged in sequence in the second direction and a plurality of columns of subpixels arranged in sequence in the first direction. The initialization signal line patterns 94 included in subpixels located in the same row are electrically connected in sequence, to form an integral structure. The gate line patterns 92 included in subpixels located in the same row are electrically connected in sequence, to form an integral structure. The light-emitting control signal line patterns 93 included in subpixels located in the same row are electrically connected in sequence, to form an integral structure. The reset signal line patterns 95 included in subpixels located in the same row are electrically connected in sequence, to form an integral structure. The first data line patterns 981 included in subpixels located in the same column are electrically connected in sequence, to form an integral structure. The second data line patterns 982 included in subpixels located in the same column are electrically connected in sequence, to form an integral structure. The power signal line patterns 91 included in subpixels located in the same column are electrically connected in sequence, to form an integral structure.

Each subpixel further includes a subpixel driving circuit. One subpixel driving circuit is used as an example. The subpixel driving circuit includes seven thin-film transistors and one capacitor. The transistors included in the subpixel driving circuit are all P-type transistors. A first electrode of each transistor includes a source, and a second electrode of each transistor includes a drain.

A first transistor T1 is a double-gate structure. A gate electrode 201g of the first transistor T1 is coupled to the gate line pattern 92. A source electrode S1 of the first transistor T1 is coupled to a drain electrode D3 of a third transistor T3 (that is, a driving transistor). A drain electrode D1 of the first transistor T1 is coupled to a gate electrode 203g of the third transistor T3.

A second transistor T2 is a double-gate structure. A gate electrode 202g of the second transistor T2 is coupled to the reset signal line pattern 95. A source electrode S2 of the second transistor T2 is coupled to the initialization signal line pattern 94. A drain electrode D2 of the second transistor T2 is coupled to the gate electrode 203g of the third transistor T3.

A gate electrode 204g of a fourth transistor T4 is coupled to the gate line pattern 92. A source electrode S4 of the fourth transistor T4 is coupled to the first data line pattern 981 or the second data line pattern 982. A drain electrode D4 of the fourth transistor T4 is coupled to a source electrode S3 of the third transistor T3.

A gate electrode 205g of a fifth transistor T5 is coupled to the light-emitting control signal line pattern 93. A source electrode S5 of the fifth transistor T5 is coupled to the power signal line pattern 91. A drain electrode D5 of the fifth transistor T5 is coupled to the source electrode S3 of the third transistor T3.

A gate electrode 206g of a sixth transistor T6 is coupled to the light-emitting control signal line pattern 93. A source electrode S6 of the sixth transistor T6 is coupled to the drain electrode D3 of the third transistor T3. A drain electrode D6 of the sixth transistor T6 is coupled to an anode of a light-emitting element EL.

A gate electrode 207g of a seventh transistor T7 is coupled to a reset signal line pattern 95' in a next subpixel adjacent in the second direction. A drain electrode D7 of the seventh transistor T7 is coupled to the anode of the corresponding light-emitting element EL. A source electrode S7 of the seventh transistor T7 is coupled to an initialization signal line pattern 94' in the next subpixel adjacent in the second direction.

A first plate Cst1 of a storage capacitor Cst is reused as the gate electrode 203g of the third transistor T3. A second plate Cst2 of the storage capacitor Cst is coupled to the power signal line pattern 91.

As shown in FIG. 3, when the subpixel driving circuit of the foregoing structure operates, each operating cycle includes a reset period P1, a write compensation period P2, and a light-emitting period P3. In FIG. 3, E1 represents a light-emitting control signal transmitted on the light-emitting control signal line pattern 93 in a current subpixel, R1 represents a reset signal transmitted on the reset signal line pattern 95 in the current subpixel, D1 represents a data signal transmitted on a target data line pattern of the current subpixel, G1 represents a gate scan signal transmitted on the gate line pattern 92 in the current subpixel, and R1' represents a reset signal transmitted on the reset signal line pattern 95' in a next subpixel adjacent to the current subpixel in the second direction.

In the first reset period P1, the reset signal inputted from the reset signal line pattern 95 is at an active level, the second transistor T2 is turned on, and an initialization signal transmitted by the initialization signal line pattern 94 is inputted into the gate electrode 203g of the third transistor T3, so that a gate-source voltage Vgs kept on the third transistor T3 in a previous frame is reset, to implement the reset of the gate electrode 203g of the third transistor T3.

In the write compensation period P2, the reset signal inputted in the reset signal line pattern 95 is at a non-active level, the second transistor T2 is cut off, the gate scan signal inputted from the gate line pattern 92 is at an active level to control the first transistor T1 and the fourth transistor T4 to be turned on, and the data signal is written from the target data line pattern and is transmitted to the source electrode S3 of the third transistor T3 through the fourth transistor T4. Meanwhile, the first transistor T1 and the fourth transistor T4 are turned on, to enable the third transistor T3 to form a diode structure. Therefore, the first transistor T1, the third transistor T3, and the fourth transistor T4 operate together, to implement threshold voltage compensation of the third transistor T3. When the time of compensation is long enough, the electric potential of the gate electrode 203g of the third transistor T3 may be controlled to eventually reach Vdata+Vth. Vdata represents a data signal voltage value. Vth represents a threshold voltage of the third transistor T3.

In the write compensation period P2, the reset signal inputted from a reset signal line pattern 95' is at an active level to control the seventh transistor T7 to be turned on, and the initialization signal transmitted by the initialization signal line pattern 94' is inputted into the anode of the light-emitting element EL, to control the light-emitting element EL not to emit light.

In the light-emitting period P3, the light-emitting control signal written from the light-emitting control signal line pattern 93 is at an active level, to control the fifth transistor T5 and the sixth transistor T6 to be turned on, so that a power signal transmitted by the power signal line pattern 91 is inputted into the source electrode S3 of the third transistor T3. Meanwhile, because the gate electrode 203g of the third transistor T3 is kept at Vdata+Vth, the third transistor T3 is turned on. A gate-source voltage corresponding to the third transistor T3 is Vdata+Vth−VDD. VDD is a voltage value corresponding to a power signal. A drain current generated based on the gate-source voltage flows to the anode of the corresponding light-emitting element EL, to drive the corresponding light-emitting element EL to emit light.

During manufacturing of the foregoing subpixel, a layout of film layers corresponding to the subpixel is provided below.

Figure 17:
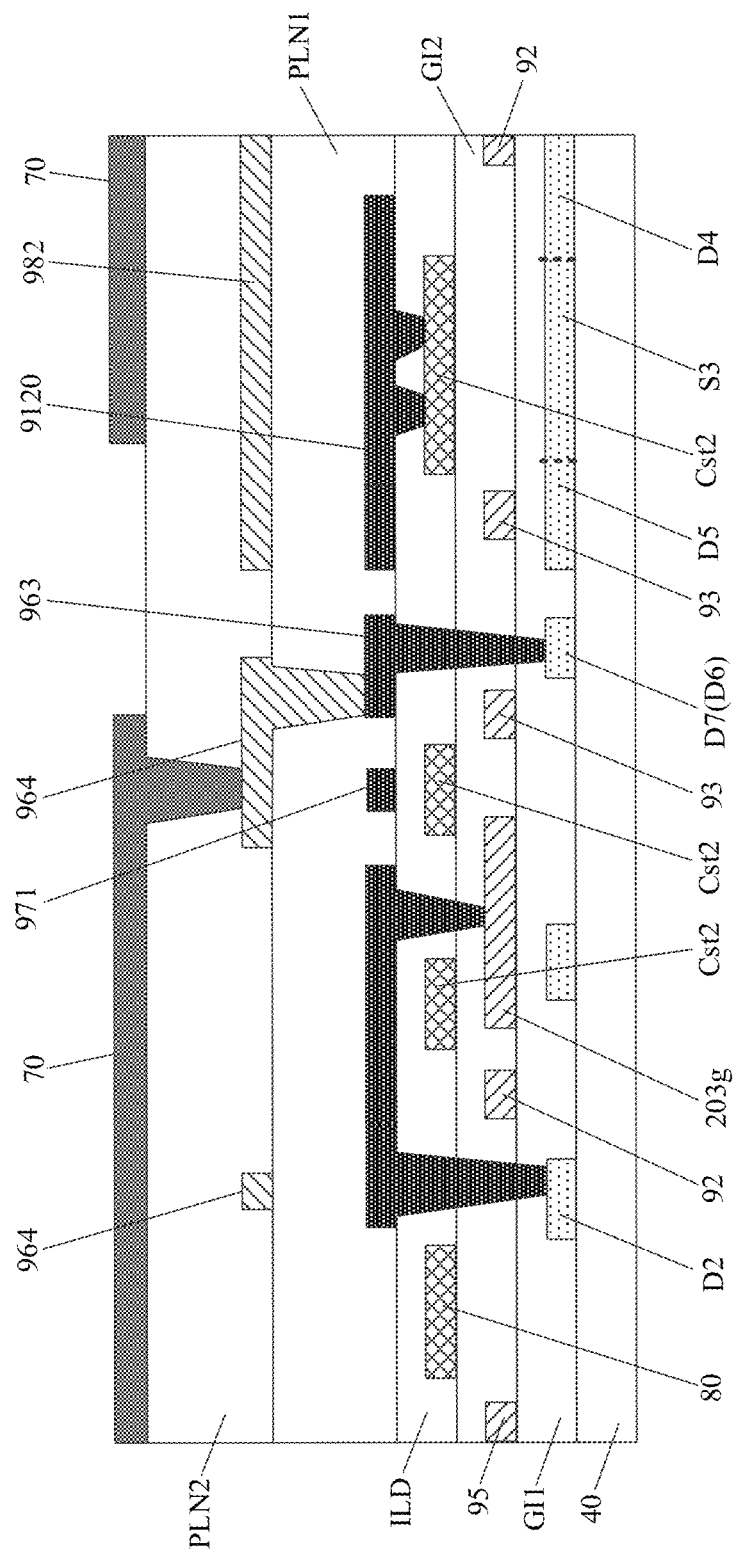
FIG. 17 is a schematic sectional view in a direction A1A2 in FIG. 16.

As shown in FIG. 17, an active film layer, a first gate insulating layer GI1, a first gate metal layer, a second gate insulating layer GI2, a second gate metal layer, an inter-layer insulating layer ILD, a first source-drain metal layer, a first planarization layer PLN1, a second source-drain metal layer, a second planarization layer PLN2, and an anode layer are laminated in sequence in a direction away from the base.

Figure 5:
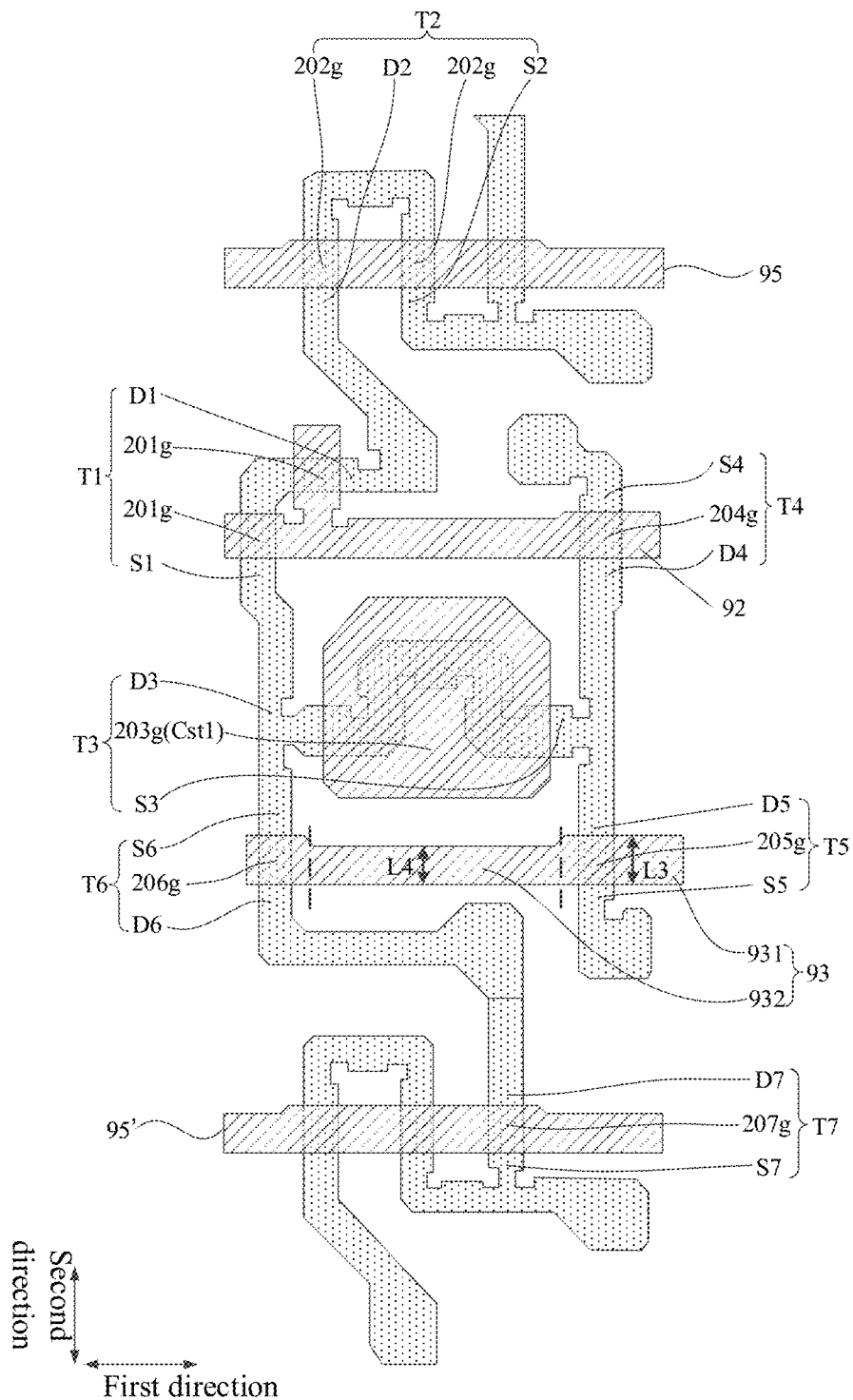
FIG. 5 is a schematic layout diagram of an active layer and a first gate metal layer in FIG. 4.

As shown in FIG. 5, the active film layer is used for forming channel regions (parts covered by the gate electrodes of the transistors) of the transistors in the subpixel driving circuit, the source electrodes (for example, S1 to S7), and the drain electrodes (for example, D1 to D7). Due to a doping effect, the electrical conductivity of an active film layer corresponding to the source electrodes and the drain electrodes are better than the active film layer corresponding to the channel regions. The active film layer may be made of amorphous silicon, polycrystalline silicon, an oxide semiconductor material, or the like. It needs to be noted that the foregoing source electrodes and drain electrodes may be doped with n-type impurities or p-type impurities.

As shown in FIG. 5, the first gate metal layer is used for forming the gate electrodes (for example, 201g to 207g) of the transistors in the subpixel driving circuit and structures such as the gate line pattern 92, the light-emitting control signal line pattern 93, and the reset signal line pattern 95 that are included in the subpixel. The gate electrode 203g of the third transistor T3 in each subpixel driving circuit is reused as a first plate Cst1 of a second storage capacitor Cst in the subpixel driving circuit.

Figure 6:
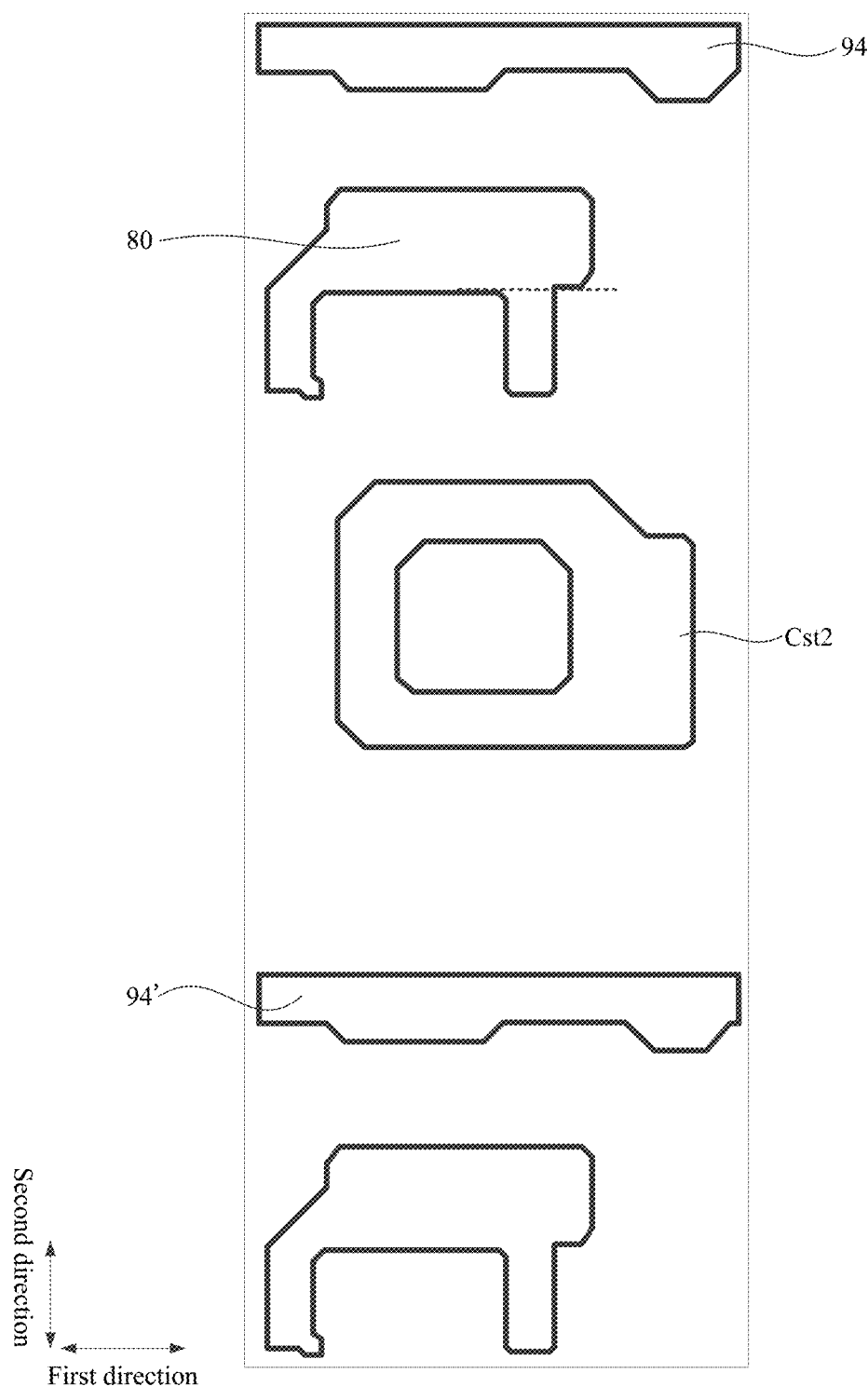
FIG. 6 is a schematic layout diagram of a second gate metal layer in FIG. 4.

As shown in FIG. 6, the second gate metal layer is used for forming the second plate Cst2 of the second storage capacitor Cst, the initialization signal line patterns 94 included in the subpixel, and a shielding pattern 80.

Figure 7:
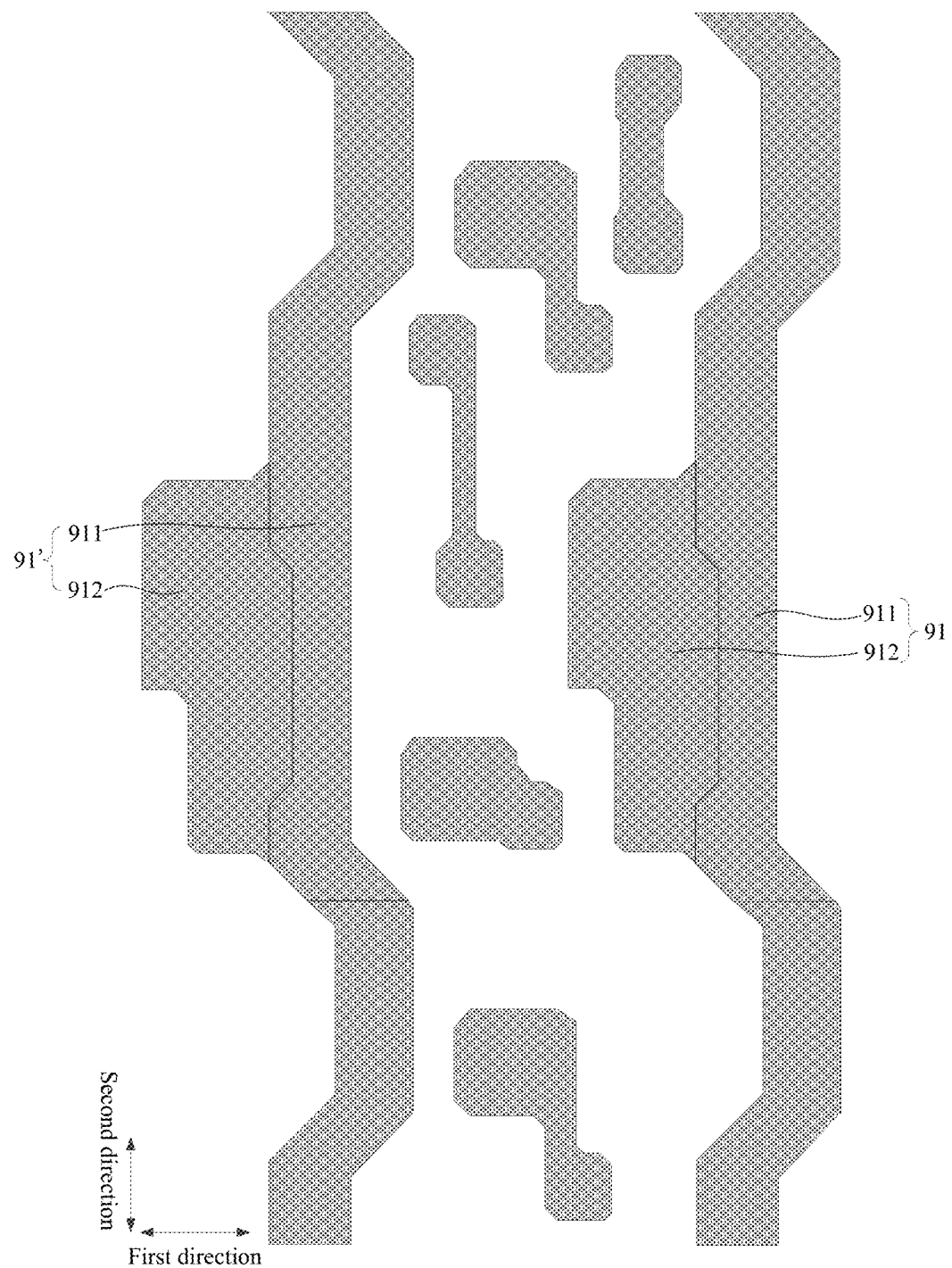
FIG. 7 is a schematic layout diagram of a first source-drain metal layer in FIG. 4.

As shown in FIG. 7, the first source-drain metal layer is used for forming the power signal line pattern 91 and some conductive connection portions included in the subpixel. It needs to be noted that to ensure the stability of the power signal transmitted by the power signal line pattern 91, in a layout of the power signal line pattern 91, under the premise of avoiding the conductive connection portions provided in the same layer and some via holes, a width of the power signal line pattern 91 in a direction perpendicular to an extension direction of the power signal line pattern 91 should be maximized.

Figure 8:
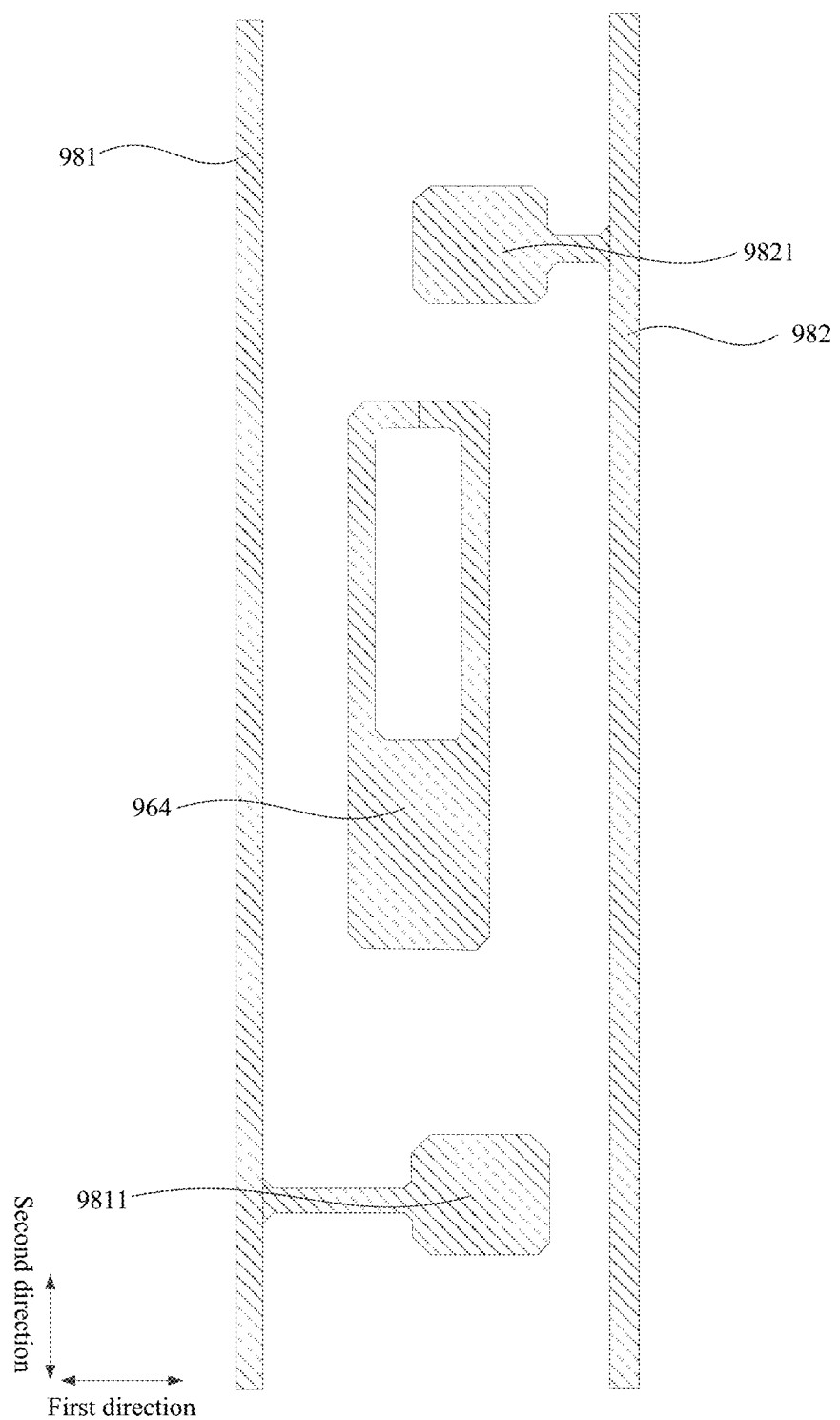
FIG. 8 is a schematic layout diagram of a second source-drain metal layer in FIG. 4.

As shown in FIG. 8, the second source-drain metal layer is used for forming the first data line pattern 981, the second data line pattern 982, and some conductive connection portions that are included in the subpixel.

In addition, as shown in FIG. 4, in the display substrate provided in the present disclosure, in the second direction, the gate electrode 204g of the fourth transistor T4, the gate electrode 201g of the first transistor T1, and the gate electrode 202g of the second transistor T2 are all located on a first side of the gate electrode 203g of the third transistor T3. The gate electrode of the seventh transistor T7, the gate electrode 206g of the sixth transistor T6, and the gate electrode of the fifth transistor T5 are all located on a second side of the gate electrode of the driving transistor. For example, the first side and the second side of the gate electrode of the driving transistor are two opposite sides in the second direction. Further, a first side of the gate electrode 203g of the third transistor T3 may be an upper side of the gate electrode 203g of the third transistor T3. A second side of the gate electrode 203g of the third transistor T3 may be a lower side of the gate electrode 203g of the third transistor T3. For the lower side, for example, a side, used for bonding an IC, of the display substrate, is a lower side of the display substrate. The lower side of the gate electrode 203g of the third transistor T3 is a side, closer to the IC, of the gate electrode 203g of the third transistor T3. The upper side is an opposite side of the lower side, for example, a side, farther away from the IC, of the gate electrode 203g of the third transistor T3.

In the first direction, the gate electrode 204g of the fourth transistor T4 and the gate electrode 205g of the fifth transistor T5 are both located on a third side of the gate electrode 203g of the third transistor T3. The gate electrode 201g of the first transistor T1 and the gate electrode 206g of the sixth transistor T6 are both located on a fourth side of the gate electrode 203g of the third transistor T3. For example, the third side and the fourth side of the gate electrode 203g of the third transistor T3 are two opposite sides in the first direction. Further, the third side of the gate electrode 203g of the third transistor T3 may be a right side of the gate electrode 203g of the third transistor T3, and the fourth side of the gate electrode 203g of the third transistor T3 may be a left side of the gate electrode 203g of the third transistor T3. For the left side and the right side, for example, in the same subpixel, the second data line pattern 982 is located on the right side of the gate electrode 203g of the third transistor T3, and the first data line pattern 981 is located on the left side of the gate electrode 203g of the third transistor T3.

When the display substrate is compatible with an optical fingerprint recognition technology, because of the principle of optical fingerprint recognition, the technology has a particular requirement for the transmittance of the display substrate, that is, a light signal with sufficient intensity is needed to support a response of a light-sensitive sensor (a sensor for short below) to a light ray, thereby shortening a response time of fingerprint recognition.

When the display substrate of the foregoing structure is used to perform under-screen fingerprint recognition, because the display substrate covers the sensor, metal conductors, P—Si semiconductors (used for forming an active layer), and the like that are used as wiring and devices included in the subpixels in the display substrate account for approximately more than 85% of regions in the display substrate. These regions generate a relatively significant shielding effect against electromagnetic waves, a signal-to-noise ratio of optical fingerprint recognition and detection is reduced, and a fingerprint detection speed is restricted.

To increase the transmittance of the display substrate, it may be considered to change a backing plate layout of the display substrate. For example, the transmittance can be increased by reducing a line width of metal wiring, shrinking the size of a light-emitting element, shrinking the size of a transistor or a capacitor, and the like. These foregoing solutions can increase the resolution, but tend to cause negative impact on the performance of the display substrate.

Figure 16:
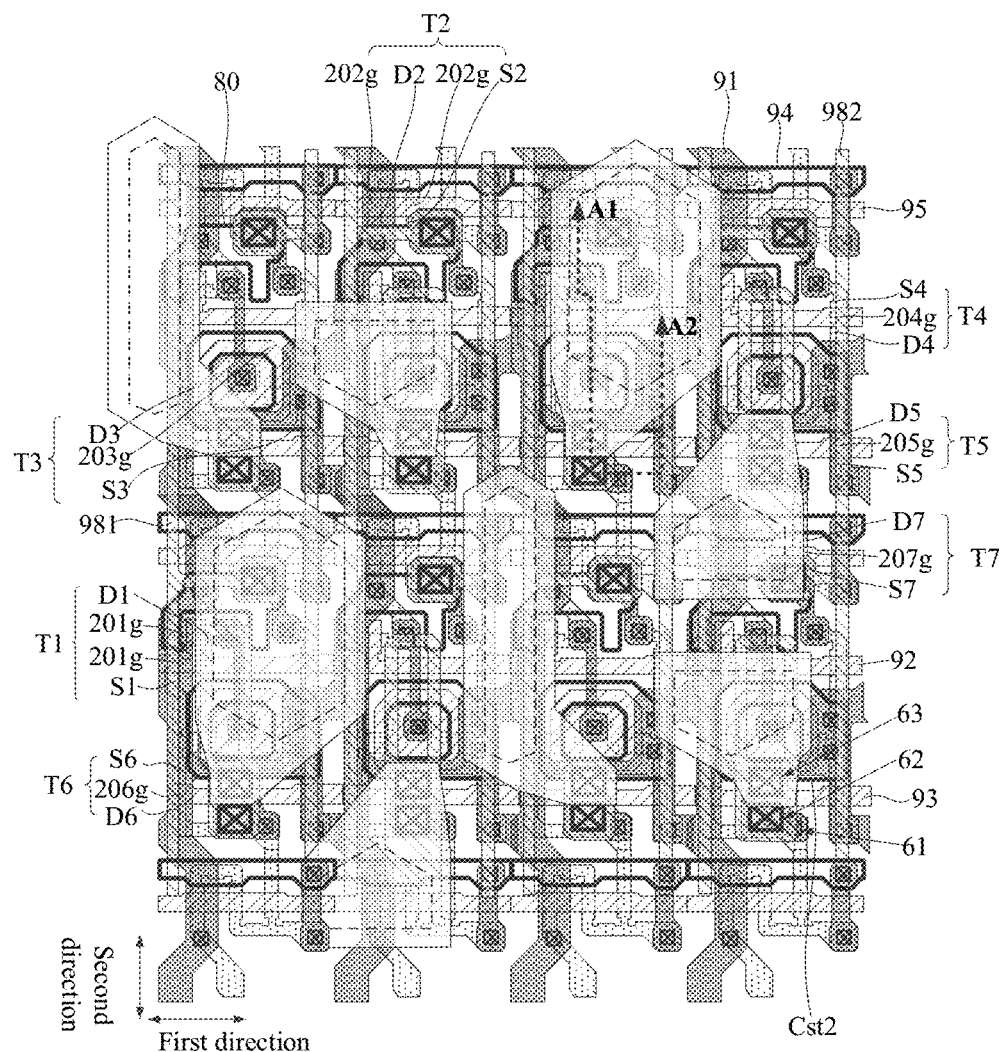
FIG. 16 is a first schematic layout diagram of eight subpixels.
Figure 18:
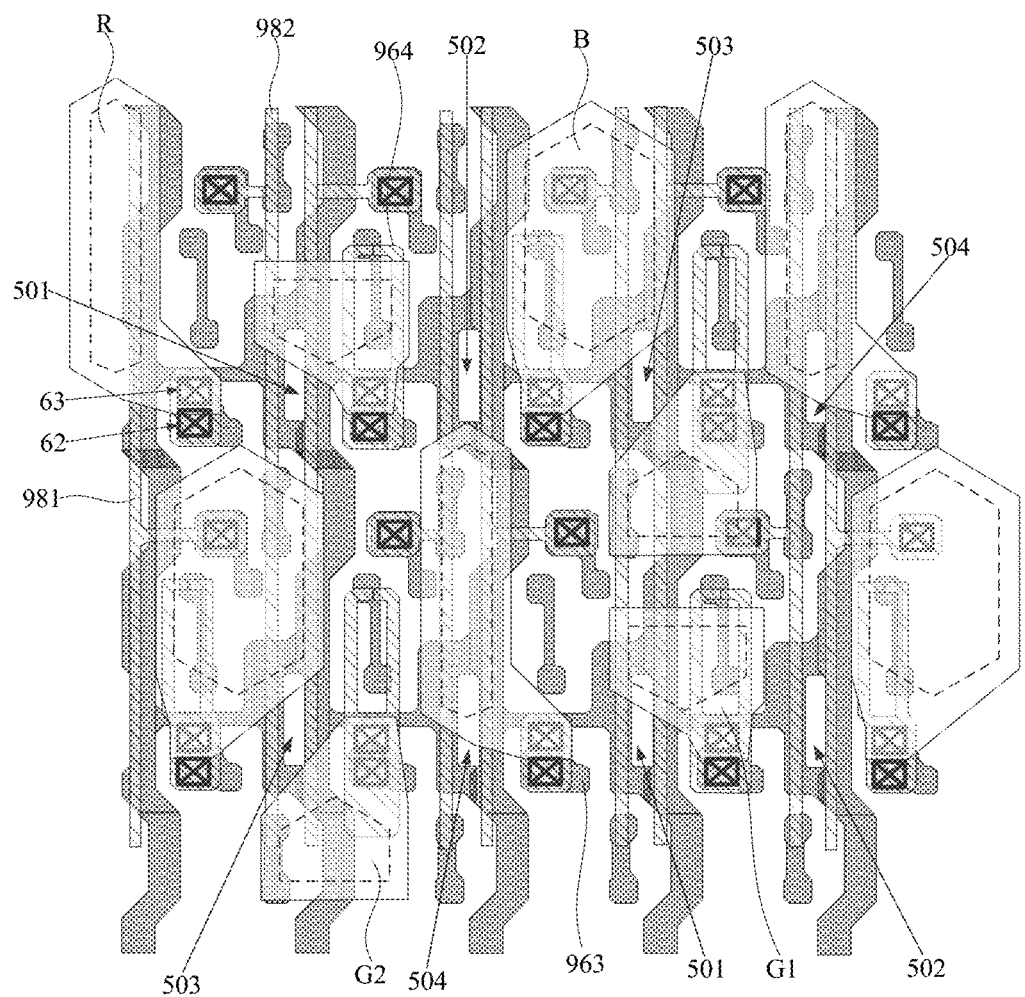
FIG. 18 is a schematic layout diagram of two source-drain metal layers and an anode layer in FIG. 16.
Figure 19:
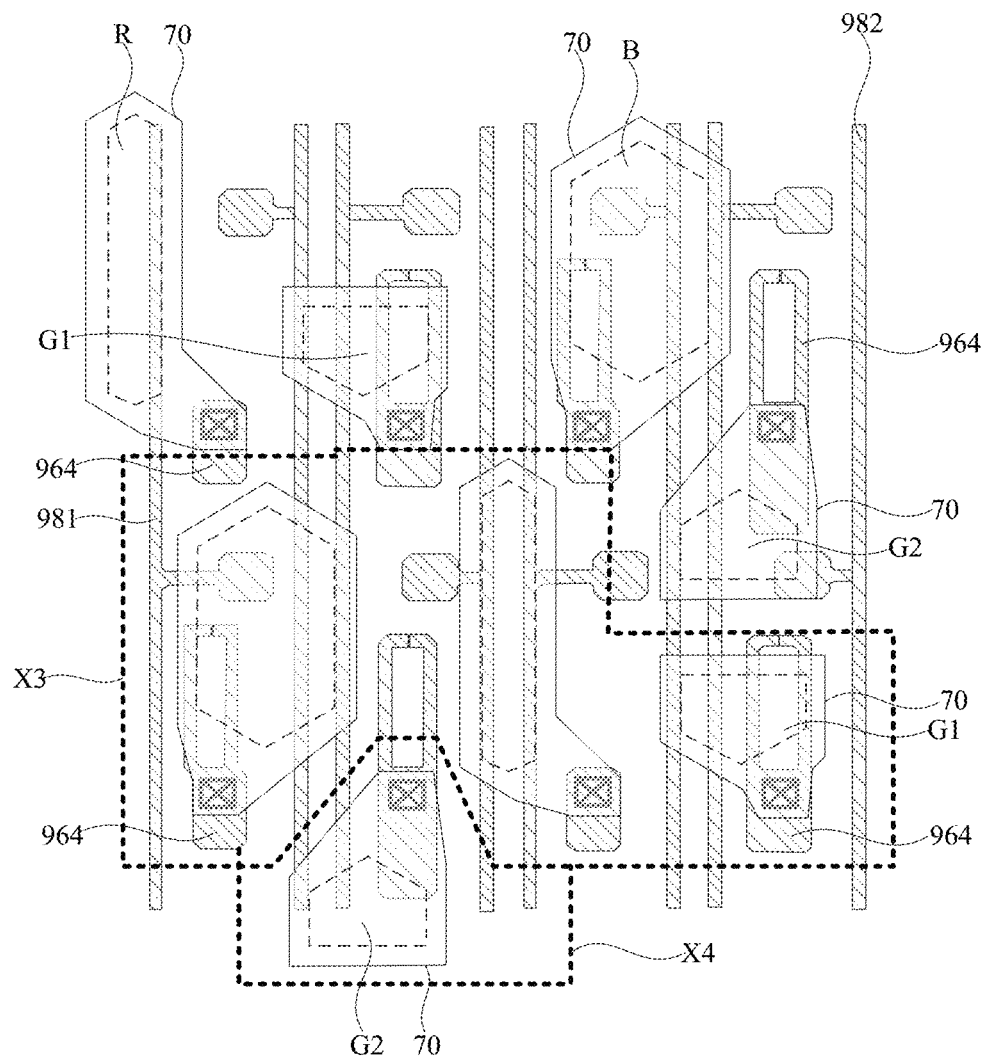
FIG. 19 is a schematic layout diagram of a second source-drain metal layer and an anode layer in FIG. 16.

Referring to FIG. 16 and FIG. 18, an embodiment of the present disclosure provides a display substrate, including a base and a plurality of subpixels distributed in an array on the base. The plurality of subpixels include a first subpixel and a second subpixel. Each subpixel include:

a power signal line pattern 91, where the power signal line pattern 91 includes a first power line portion 911 and a second power line portion 912; and at least a part of the first power line portion 911 extends in a second direction; and a light-emitting element, where the light-emitting element includes an anode pattern; and in the display substrate:

an overlapping area between the anode pattern of the first subpixel and the power signal line pattern 91 is larger than an overlapping area between the anode pattern of the second subpixel and the power signal line pattern 91, and an overlapping area between the anode pattern of the first subpixel and the first power line portion 911 is larger than an overlapping area between the anode pattern of the first subpixel and the second power line portion 912.

Specifically, the display substrate includes a plurality of subpixels distributed in an array on a base. The plurality of subpixels can be divided into a plurality of rows of subpixels and a plurality of columns of subpixels. The plurality of rows of subpixels are arranged in the second direction. Each row of subpixels includes plural subpixels arranged in sequence in a first direction. The plurality of columns of subpixels are arranged in the first direction. Each column of subpixels includes plural subpixels arranged in sequence in the second direction.

Each subpixel includes the power signal line pattern 91. The power signal line pattern 91 includes a first power line portion 911 and a second power line portion 912. At least a part of the first power line portion 911 extends in the second direction. In the same column of subpixels, the first power line portions 911 included in the subpixels are electrically connected in sequence, so that an integral structure can be formed.

For example, the light-emitting element includes an anode pattern, a light-emitting function layer, and a cathode layer. An insulating layer is provided between the anode pattern and the power signal line pattern 91.

For example, an orthographic projection of the anode pattern of the first subpixel onto the base and an orthographic projection of the power signal line pattern 91 onto the base have a first overlapping area. An orthographic projection of the anode pattern of the second subpixel onto the base and the orthographic projection of the power signal line pattern 91 onto the base have a second overlapping area. The first overlapping area is larger than the second overlapping area.

For example, the orthographic projection of the anode pattern of the first subpixel onto the base and an orthographic projection of the first power line portion 911 onto the base have a third overlapping area. The orthographic projection of the anode pattern of the first subpixel onto the base and an orthographic projection of the second power line portion 912 onto the base have a fourth overlapping area. The third overlapping area is larger than the fourth overlapping area.

It is provided in the foregoing that the overlapping area between the anode pattern of the first subpixel and the power signal line pattern 91 is larger than the overlapping area between the anode pattern of the second subpixel and the power signal line pattern 91, and that the overlapping area between the anode pattern of the first subpixel and the first power line portion 911 is larger than the overlapping area between the anode pattern of the first subpixel and the second power line portion 912, so that in a direction perpendicular to the base, the anode pattern of the first subpixel and the power signal line pattern 91 can have a relatively large overlapping area, thereby adequately reducing an area, blocked by the anode pattern of the first subpixel, of other region than the region in which the power signal line pattern 91 is located, to effectively increase the light transmittance of the display substrate. Therefore, when the display substrate provided in the embodiments of the present disclosure is compatible with an optical fingerprint recognition technology, an adequate condition can be provided for the acquisition of a light signal by the sensor, thereby effectively improving the speed and accuracy of fingerprint recognition.

In addition, in the display substrate provided in the embodiments of the present disclosure, only a layout position of the anode pattern of the first subpixel is adjusted, and operations of reducing a line width of metal wiring other than the power signal line pattern 91, shrinking the size of a light-emitting element, shrinking the size of a transistor or a capacitor, and the like are not performed. Therefore, while the resolution is increased, the display substrate provided in the embodiments of the present disclosure does not tend to cause negative impact on the performance of the display substrate.

Referring to FIG. 16 to FIG. 19, in some embodiments, the plurality of subpixels are divided into a plurality of pixel units, and each pixel unit includes one red subpixel R, one blue subpixel B, a first green subpixel G1, and a second green subpixel G2. The first subpixel includes the red subpixel R, and the second subpixel includes the blue subpixel B, the first green subpixel G1 or the second green subpixel G2.

For example, the second subpixel includes one or more of the blue subpixel B, the first green subpixel G1, or the second green subpixel G2.

Referring to FIG. 16 to FIG. 19, in some embodiments, the plurality of subpixels are divided into a plurality of pixel units, and each pixel unit includes one red subpixel R, one blue subpixel B, a first green subpixel G1, and a second green subpixel G2. An overlapping area between the anode pattern of the first green subpixel G1 and the second power line portion 912 is larger than an overlapping area between the anode pattern of the second green subpixel G2 and the second power line portion 912.

Specifically, the plurality of subpixels are divided into a plurality of pixel units, and each pixel unit includes one red subpixel R, one blue subpixel B, a first green subpixel G1, and a second green subpixel G2. For example, in one pixel unit, subpixel driving circuits included in subpixels of various colors are located in the same row in the first direction.

For example, in pixel units located in the same row in the first direction, the anode patterns 70 included in the red subpixels R, the anode patterns 70 included in the blue subpixels B, and the anode patterns 70 included in the first green subpixels G1 in the pixel units are arranged in one row.

For example, an orthographic projection of the anode pattern of the first green subpixel G1 onto the base and the orthographic projection of the second power line portion 912 onto the base have a fifth overlapping area. An orthographic projection of the anode pattern of the second green subpixel G2 onto the base and the orthographic projection of the second power line portion 912 onto the base have a sixth overlapping area. The fifth overlapping area is larger than the sixth overlapping area.

In the display substrate provided in the foregoing embodiments, it is provided that the overlapping area between the anode pattern of the first green subpixel G1 and the second power line portion 912 is larger than the overlapping area between the anode pattern of the second green subpixel G2 and the second power line portion 912, to enable the anode pattern of the first green subpixel G1 and the power signal line pattern 91 to have a relatively large overlapping area, thereby adequately reducing an area of other region, blocked by the anode pattern of the first green subpixel G1, than the region in which the power signal line pattern 91 is located, to effectively increase the light transmittance of the display substrate.

Referring to FIG. 16 to FIG. 19, in some embodiments, it is provided that a length of the anode pattern of the first subpixel in the second direction is greater than a spacing distance between two adjacent second power line portions 912 in the second direction.

The foregoing arrangement manner enables the anode pattern of the first subpixel to have a relatively large length in the second direction. Because the first power line portion 911 extends in the second direction, by providing that the anode pattern of the first subpixel has a relatively large length in the second direction, the anode pattern of the first subpixel and the first power line portion 911 may overlap more, thereby adequately reducing an area, blocked by the anode pattern of the first subpixel, of other region than the region in which the power signal line pattern 91 is located, to effectively increase the light transmittance of the display substrate.

Referring to FIG. 9 to FIG. 11, FIG. 24, FIG. 25, and FIG. 27, in some embodiments, the second power line portion 912 includes a body portion 9120, a first end portion 9121, and a second end portion 9122. The body portion 9120 and the first power line portion 911 are arranged in the first direction. The body portion 9120 is spaced from the first power line portion 911. The first direction intersects the second direction. The first end portion 9121 and the second end portion 9122 are disposed opposite to each other in the second direction. The first end portion 9121 is separately coupled to one end of the body portion 9120 and the first power line portion 911. The second end portion 9122 is separately coupled to the other end of the body portion 9120 and the first power line portion 911. A hole 50 is provided between the first power line portion 911 and the second power line portion 912.

The second power line portion 912 includes a body portion 9120, a first end portion 9121, and a second end portion 9122. For example, at least a part of the body portion 9120 extends in the second direction. For example, in a plane parallel to the base, in a direction perpendicular to the second direction, the thickness of the body portion 9120 is even or uneven. For example, the body portion 9120 and the first power line portion 911 are arranged in the first direction. The body portion 9120 is spaced from the first power line portion 911. In the first direction, a distance between the body portion 9120 and the first power line portion 911 determines a width of the hole 50 in the first direction.

For example, the first end portion 9121 and the second end portion 9122 are disposed opposite to each other in the second direction. The first end portion 9121 is separately coupled to one end of the body portion 9120 and the first power line portion 911. The second end portion 9122 is separately coupled to the other end of the body portion 9120 and the first power line portion 911. The body portion 9120, the first end portion 9121, the second end portion 9122, and the first power line portion 911 jointly define the hole 50. In the second direction, the length of the body portion 9120 and a distance between the first end portion 9121 and the second end portion 9122 determine a length of the hole 50 in the first direction.

For example, the body portion 9120, the first end portion 9121, the second end portion 9122, and the first power line portion 911 form an integral structure. It needs to be noted that an integral structure includes simultaneously forming, by using the same material and a one-time patterning process, the body portion 9120, the first end portion 9121, the second end portion 9122, and the first power line portion 911 that are in contact.

Referring to FIG. 9 to FIG. 11, FIG. 24, FIG. 25, and FIG. 27, an embodiment of the present disclosure provides a display substrate, including a base and a plurality of subpixels distributed in an array on the base. The subpixel includes a power signal line pattern 91. The power signal line pattern 91 includes a first power line portion 911 and a second power line portion 912. At least a part of the first power line portion 911 extends in a second direction. The second power line portion 912 includes the body portion 9120, the first end portion 9121, and the second end portion 9122. The body portion 9120 is spaced from the first power line portion 911. The body portion 9120 is spaced from the first power line portion 911. The first direction intersects the second direction. The first end portion 9121 and the second end portion 9122 are disposed opposite to each other in the second direction. The first end portion 9121 is separately coupled to one end of the body portion 9120 and the first power line portion 911. The second end portion 9122 is separately coupled to the other end of the body portion 9120 and the first power line portion 911. A hole 50 is provided between the first power line portion 911 and the second power line portion 912.

As shown in FIG. 16 to FIG. 19, the subpixel includes a light-emitting element. The light-emitting element includes an anode pattern 70. In the display substrate, an orthographic projection of a part of the anode pattern 70 onto the base partially overlaps an orthographic projection of the hole 50 onto the base. It needs to be noted that the label 40 in FIG. 17 represents the base and some film layers (for example, a buffer layer, and an isolation layer) disposed on the base.

Specifically, the display substrate includes a plurality of subpixels distributed in an array on a base. The plurality of subpixels can be divided into a plurality of rows of subpixels and a plurality of columns of subpixels. The plurality of rows of subpixels are arranged in the second direction. Each row of subpixels includes a plurality of subpixels arranged in sequence in the first direction. The plurality of columns of subpixels are arranged in the first direction. Each column of subpixels includes a plurality of subpixels arranged in sequence in the second direction.

Each subpixel includes the power signal line pattern 91. The power signal line pattern 91 includes a first power line portion 911 and a second power line portion 912. At least a part of the first power line portion 911 extends in the second direction. In the same column of subpixels, the first power line portions 911 included in the subpixels are electrically connected in sequence, so that an integral structure can be formed.

In an actual layout of the subpixels, due to the restriction of a layout space, it may be provided that the orthographic projection of a part of the anode pattern 70 in the display substrate onto the base and the orthographic projection of the hole 50 onto the base partially overlap. For example, the anode pattern 70 may be manufactured by using a transparent conductive material. In this way, even if an orthographic projection of the anode pattern 70 onto the base overlaps the orthographic projection of the hole 50 onto the base, it can also be ensured that a part, covered by the anode pattern 70, of the hole 50 has certain light transmittance.

As can be seen from the specific structure of the foregoing display substrate, in the display substrate provided in the embodiments of the present disclosure, it is provided that the power signal line pattern 91 includes the first power line portion 911 and the second power line portion 912, so that the hole 50 can be formed between the first power line portion 911 and the second power line portion 912, thereby reducing a proportion of an opaque region in the display substrate, to increase the light transmittance of the display substrate. Therefore, when the display substrate provided in the embodiments of the present disclosure is compatible with an optical fingerprint recognition technology, an adequate condition can be provided for the acquisition of a light signal by the sensor, thereby effectively improving the speed and accuracy of fingerprint recognition.

In addition, in the display substrate provided in the embodiments of the present disclosure, the hole is only formed in the power signal line pattern 91, and operations of reducing a line width of metal wiring other than the power signal line pattern 91, shrinking the size of a light-emitting element, shrinking the size of a transistor or a capacitor, and the like are not performed. Therefore, while the resolution is increased, the display substrate provided in the embodiments of the present disclosure does not tend to cause negative impact on the performance of the display substrate.

As shown in FIG. 8, FIG. 12, FIG. 28, and FIG. 29, in some embodiments, the plurality of subpixels are divided into a plurality of rows of subpixels. Each row of subpixels includes a plurality of subpixels arranged in sequence in the first direction. The subpixel further includes:

a first data line pattern 981 and a second data line pattern 982 that are disposed opposite to each other in the first direction, where at least a part of the first data line pattern 981 and at least a part of the second data line pattern 982 both extend in the second direction.

An orthographic projection of the first data line pattern 981 onto the base overlaps the orthographic projection of the first power line portion 911, in a subpixel adjacent in the first direction to the subpixel to which the first data line pattern 981 belongs, onto the base. An orthographic projection of the second data line pattern 982 onto the base overlaps an orthographic projection of the body portion 9120 onto the base.

Specifically, the display substrate includes a plurality of subpixels distributed in an array on a base. The plurality of subpixels can be divided into a plurality of rows of subpixels and a plurality of columns of subpixels. The plurality of rows of subpixels are arranged in the second direction. Each row of subpixels includes a plurality of subpixels arranged in sequence in the first direction. The plurality of columns of subpixels are arranged in the first direction. Each column of subpixels includes a plurality of subpixels arranged in sequence in the second direction.

For example, the first direction includes the horizontal direction, and the second direction includes the vertical direction.

Each subpixel includes a first data line pattern 981 and a second data line pattern 982 that are disposed opposite to each other in the first direction. At least a part of the first data line pattern 981 and at least a part of the second data line pattern 982 both extend in the second direction. The first data line patterns 981 included in subpixels located in the same column of subpixels are electrically connected in sequence, so that an integral structure can be formed. The second data line patterns 982 included in subpixels located in the same column of subpixels are electrically connected in sequence, so that an integral structure can be formed.

Figure 28:
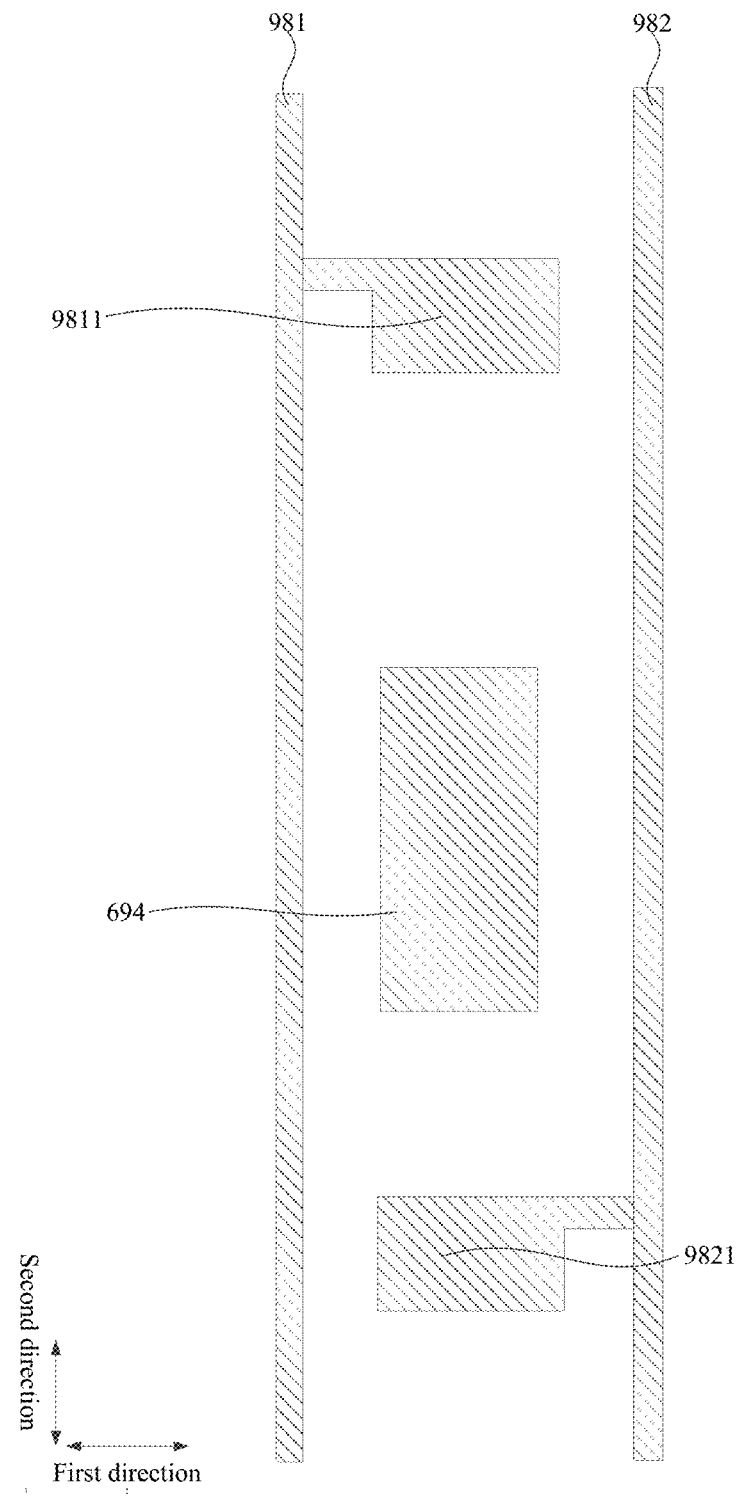
FIG. 28 is a schematic layout diagram of a second source-drain metal layer in FIG. 24.
Figure 29:
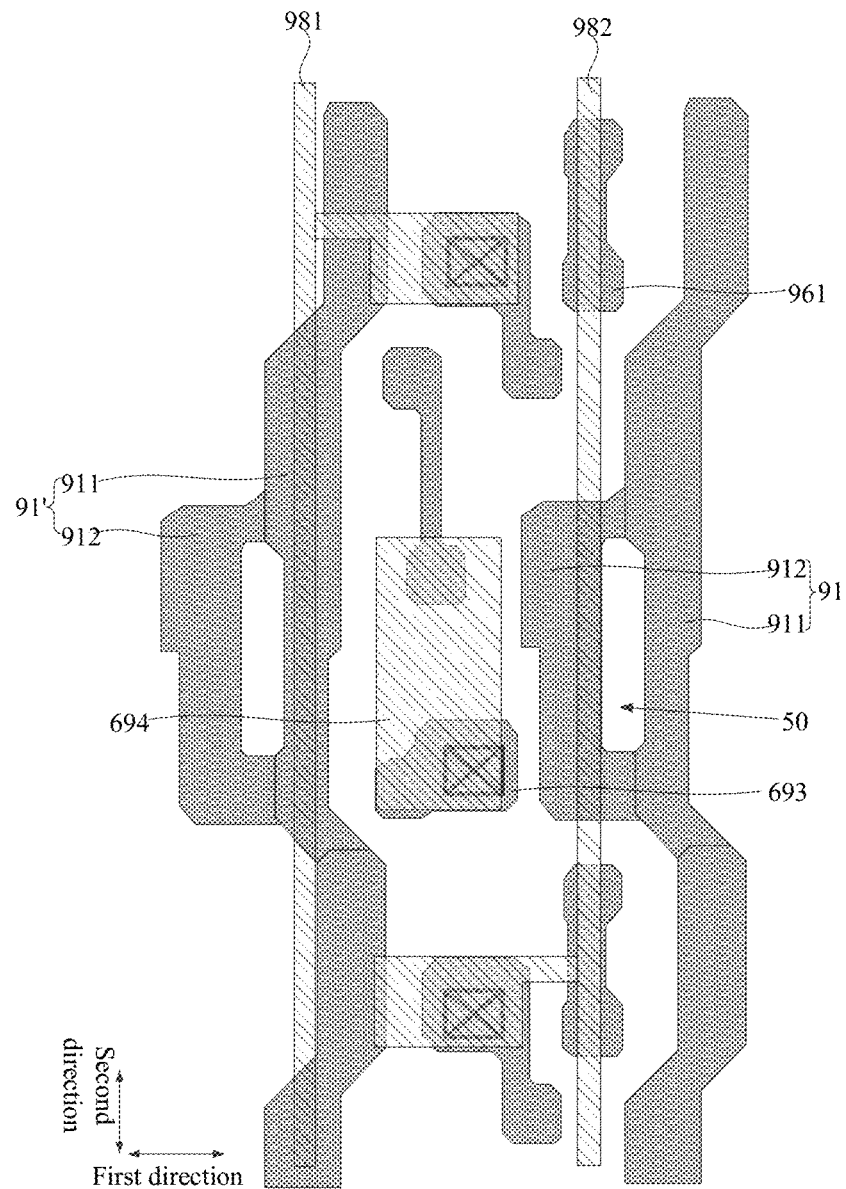
FIG. 29 is a schematic layout diagram of a first source-drain metal layer and a second source-drain metal layer in FIG. 24.

As shown in FIG. 8 and FIG. 28, for example, the first data line pattern 981 includes a first bump 9811, and the second data line pattern 982 includes a second bump 9812. The first bump 9811 and the second bump 9812 are used for being electrically connected to a first electrode S4 of the fourth transistor T4 in the subpixel driving circuit.

For example, in the same column of subpixels, an odd-numbered subpixel receives a data signal provided by a first data line pattern 981 included in the subpixel, and an even-numbered subpixel receives a data signal provided by a second data line pattern 982 included in the subpixel.

For example, in the same column of subpixels, an even-numbered subpixel receives a data signal provided by a first data line pattern 981 included in the subpixel, and an odd-numbered subpixel receives a data signal provided by a second data line pattern 982 included in the subpixel.

Figure 9:
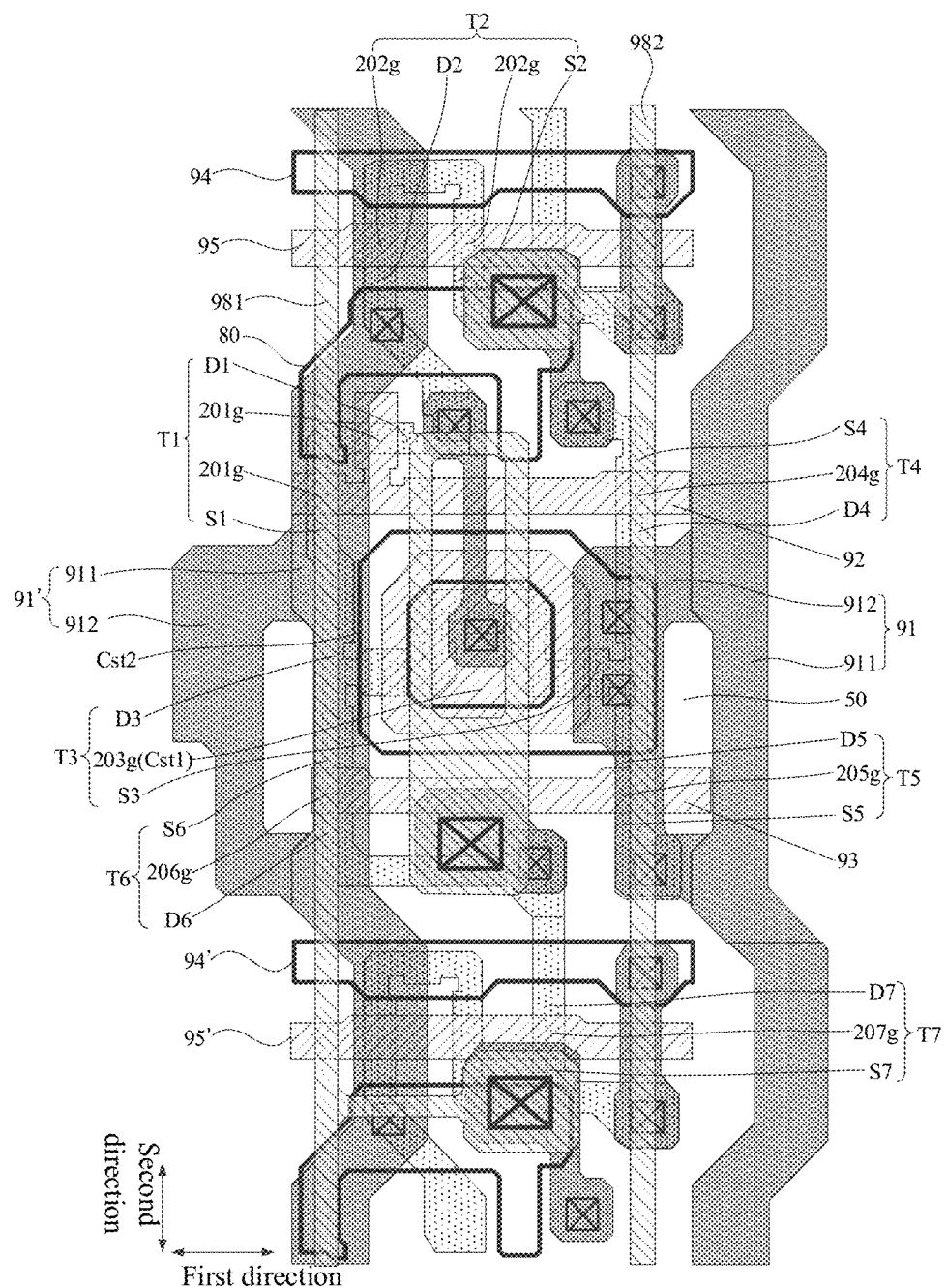
FIG. 9 is a second schematic layout diagram of a subpixel according to an embodiment of the present disclosure.
Figure 24:
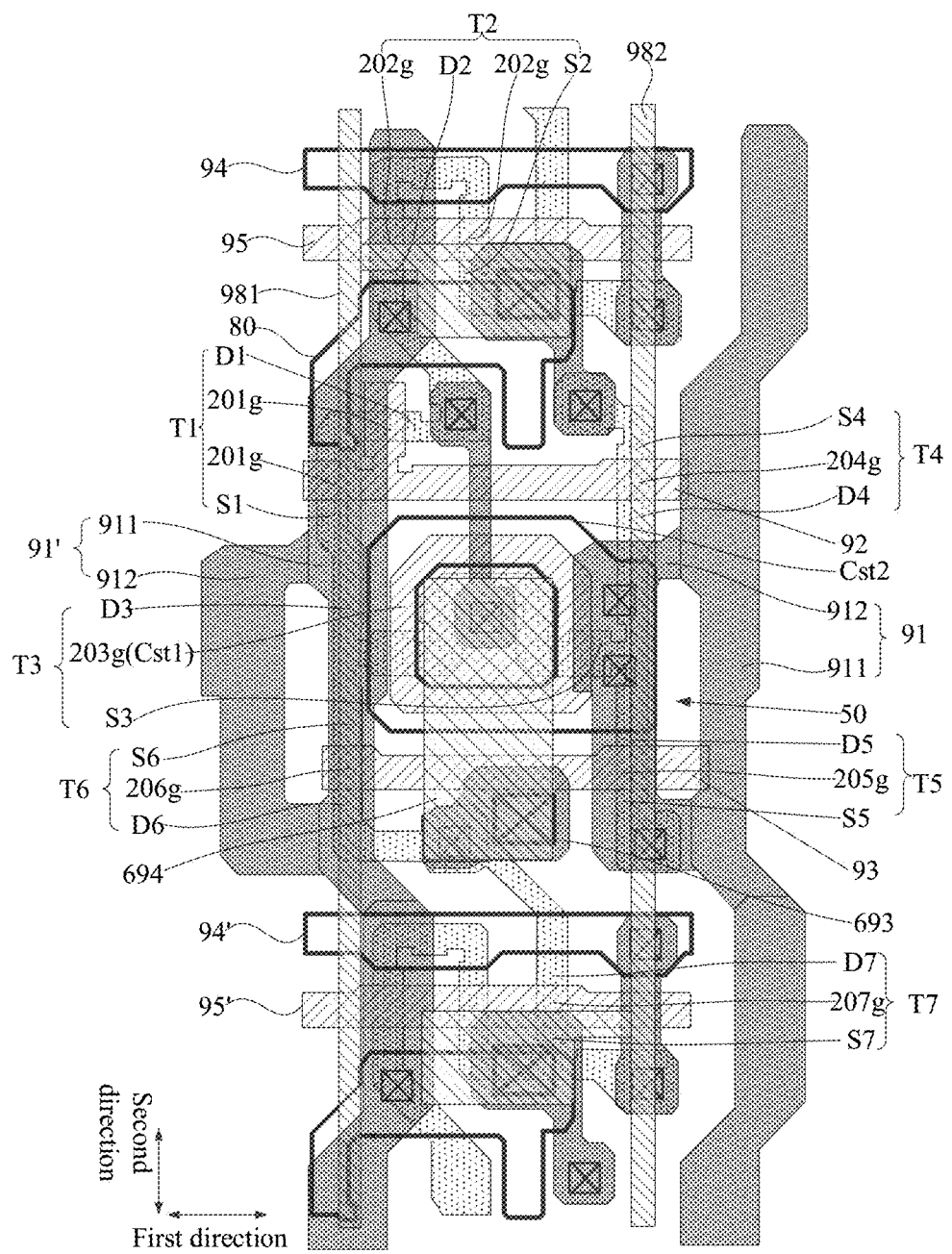
FIG. 24 is a fourth schematic layout diagram of a subpixel according to an embodiment of the present disclosure.

Each subpixel includes a subpixel driving circuit. The subpixel driving circuit includes a storage capacitor and a plurality of thin-film transistors. As shown in FIG. 2, FIG. 9, and FIG. 24, for example, the subpixel driving circuit includes 7T1C, that is, seven transistors and one storage capacitor. The subpixel driving circuit is used for generating a driving signal for driving the light-emitting element to emit light.

For example, the subpixel driving circuit includes a driving transistor (that is, the third transistor) and a data write transistor (that is, the fourth transistor T4). A first electrode of the data write transistor is coupled to the first data line pattern 981 or the second data line pattern 982, and can receive a data signal provided by a first data line pattern 981 or a second data line pattern 982. A second electrode of the data write transistor is coupled to a first electrode of the driving transistor. The data write transistor can transmit a data signal that is received by the first electrode of the data write transistor to the first electrode of the driving transistor.

In the same column of subpixels, data line patterns coupled to first electrodes of data write transistors in adjacent subpixels are different. More specifically, in the same column of subpixels, a first electrode of a data write transistor included in one of adjacent subpixels is coupled to the first data line pattern 981. A first electrode of a data write transistor included in the other of the adjacent subpixels is coupled to the second data line pattern 982.

In the display substrate provided in the foregoing embodiments, it is provided that each subpixel includes the first data line pattern 981 and the second data line pattern 982, and in the same column of subpixels, data line patterns coupled to data write transistors in adjacent subpixels are different, to implement that in the same column of subpixels, different data line patterns provide data signals to adjacent subpixels, so that it is ensured that each subpixel has sufficient data signal write time, thereby resolving a problem that each row of subpixels do not have sufficient data signal write time when the display substrate performs high-frequency display.

Figure 12:
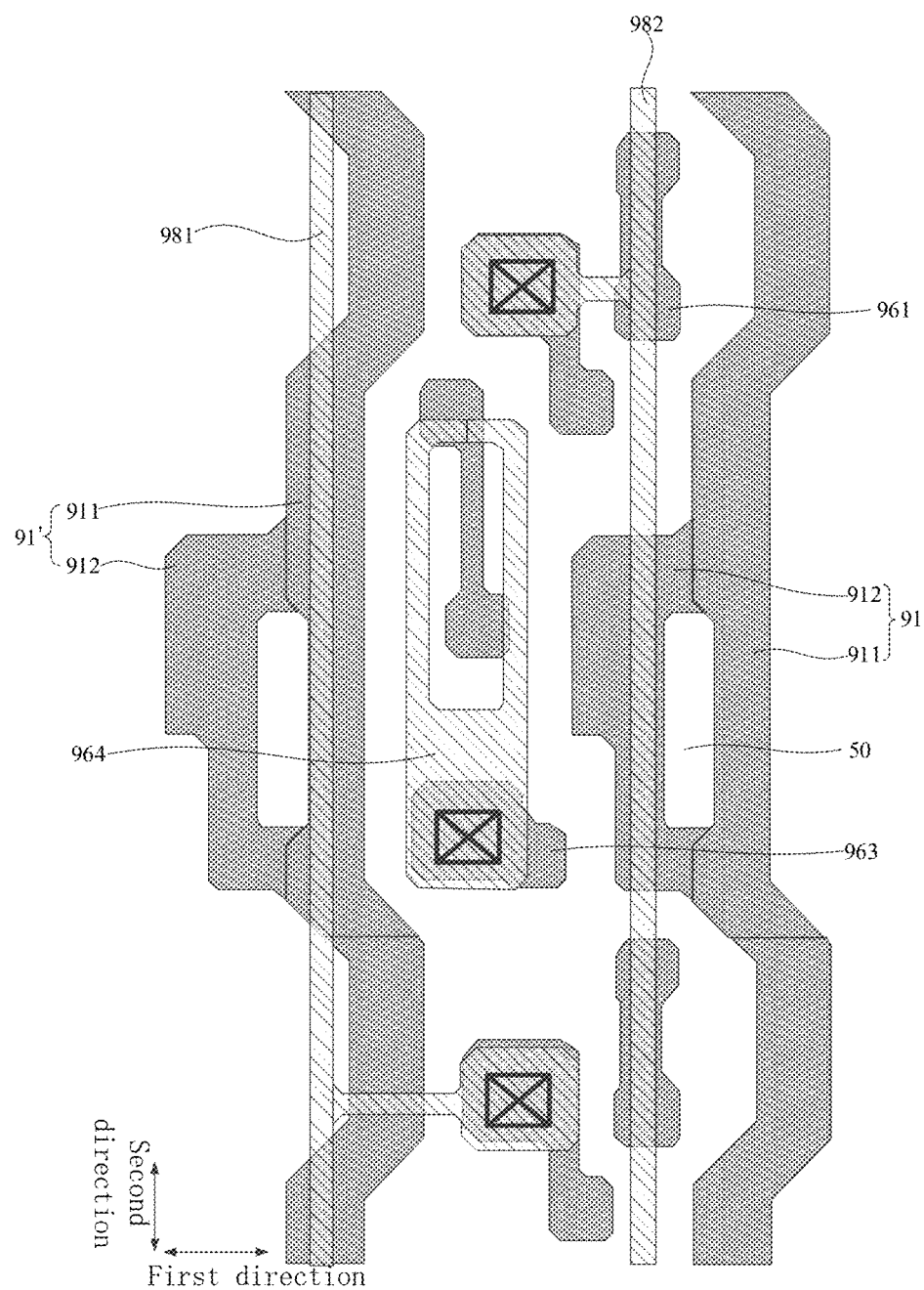
FIG. 12 is a schematic layout diagram of a first source-drain metal layer and a second source-drain metal layer in FIG. 9.

There are a variety of specific layout positions of the hole 50. For example, as shown in FIG. 12, the orthographic projection of the first data line pattern 981 onto the base overlaps the orthographic projection of the first power line portion 911 (that is, the first power line portion 911 included in the power signal line pattern 91'), in a previous subpixel adjacent in the first direction to the subpixel to which the first data line pattern 981 belongs, onto the base, and the orthographic projection of the second data line pattern 982 onto the base overlaps an orthographic projection of the body portion 9120 onto the base. Such a layout manner enables the hole 50 to be located near a second data line pattern 982 in the subpixel to which the hole 50 belongs and near a first data line pattern 981 in a next subpixel adjacent to the subpixel in the first direction.

The foregoing layout manner further enables an overlapping area between the orthographic projection of the first data line pattern 981 onto the base and an orthographic projection of a functional pattern provided with a fixed potential onto the base to be similar to an overlapping area between the orthographic projection of the second data line pattern 982 onto the base and the orthographic projection of the functional pattern provided with the fixed potential onto the base, thereby effectively reducing a load difference between the first data line pattern 981 and the second data line pattern 982.

It needs to be noted that as shown in FIG. 9, FIG. 12, FIG. 29, and FIG. 30, the functional pattern provided with the fixed potential includes a power signal line pattern 91, an initialization signal line pattern 94, a conductive functional pattern 961 that is coupled to the power signal line pattern 91 or the initialization signal line pattern 94, and the like.

As shown in FIG. 8, FIG. 12, FIG. 28, and FIG. 29, in some embodiments, it is provided that the orthographic projection of the first data line pattern 981 onto the base does not overlap the orthographic projection of the hole 50 onto the base; and/or the orthographic projection of the second data line pattern 982 onto the base does not overlap the orthographic projection of the hole 50 onto the base.

By providing that the orthographic projection of the first data line pattern 981 onto the base does not overlap the orthographic projection of the hole 50 onto the base, the first data line pattern 981 is prevented from blocking the hole 50, thereby better ensuring light ray transmittance of the hole 50.

Similarly, by providing that the orthographic projection of the second data line pattern 982 onto the base does not overlap the orthographic projection of the hole 50 onto the base, the second data line pattern 982 is prevented from blocking the hole 50, thereby better ensuring the light ray transmittance of the hole 50.

As shown in FIG. 5, FIG. 9, FIG. 11, FIG. 24, FIG. 26, and FIG. 27, in some embodiments, the subpixel further includes a light-emitting control signal line pattern 93. At least a part of the light-emitting control signal line pattern 93 extends in the first direction. An orthographic projection of the light-emitting control signal line pattern 93 onto the base partially overlaps an orthographic projection of the hole 50 onto the base.

Specifically, the subpixel further includes a light-emitting control signal line pattern 93. The light-emitting control signal line pattern 93 is used for transmitting a light-emitting control signal. At least a part of the light-emitting control signal line pattern 93 extends in the first direction. The light-emitting control signal line patterns 93 included in subpixels in the same row in the first direction are electrically connected in sequence, so that an integral structure can be formed.

It is provided in the foregoing that the orthographic projection of the light-emitting control signal line pattern 93 onto the base partially overlaps the orthographic projection of the hole 50 onto the base, to reduce an overlapping area between the light-emitting control signal line pattern 93 and the power signal line pattern 91 provided with a fixed potential, thereby effectively reducing the load of the light-emitting control signal line pattern 93 and power consumption caused by the load.

Figure 11:
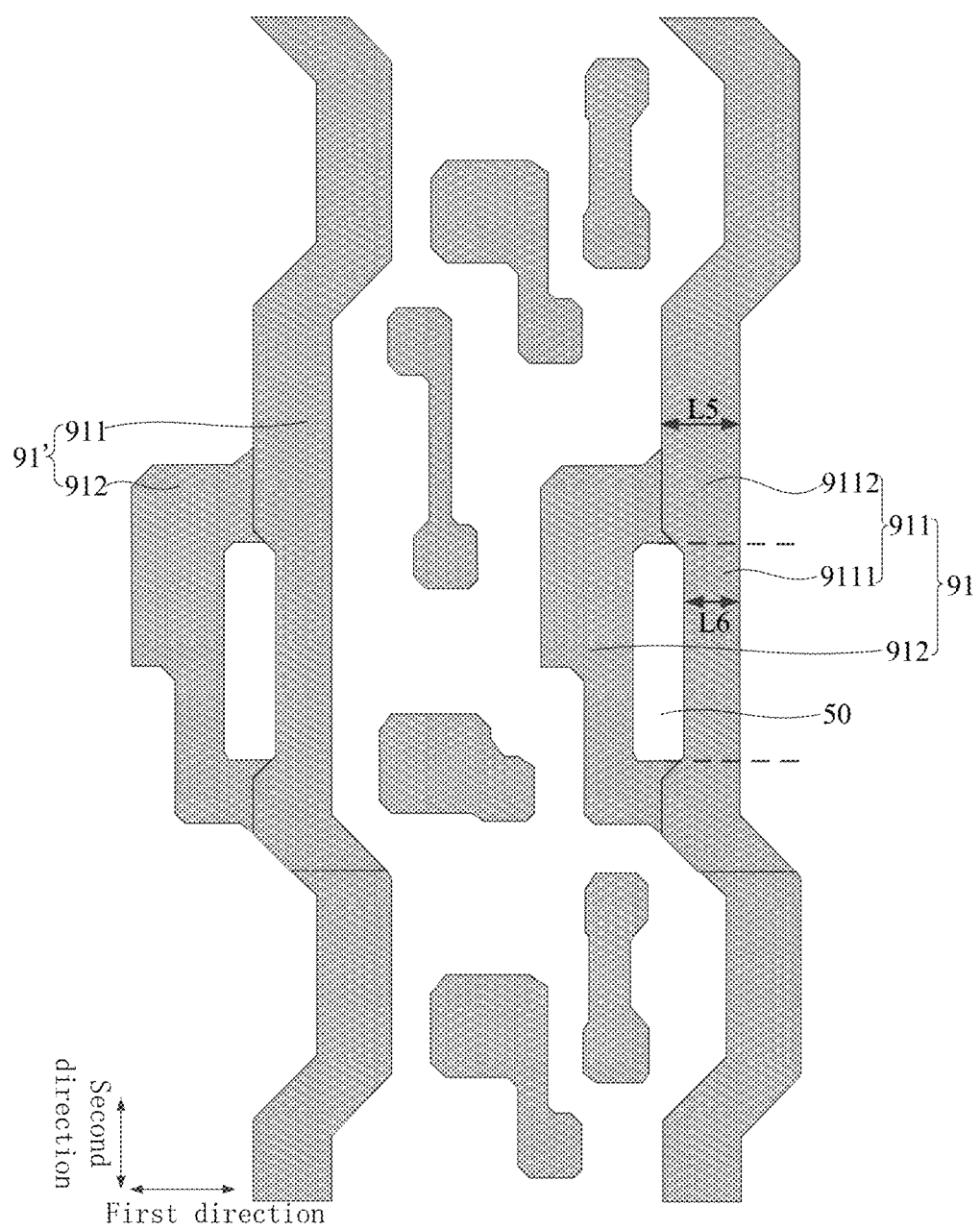
FIG. 11 is a schematic layout diagram of a first source-drain metal layer in FIG. 9.
Figure 27:
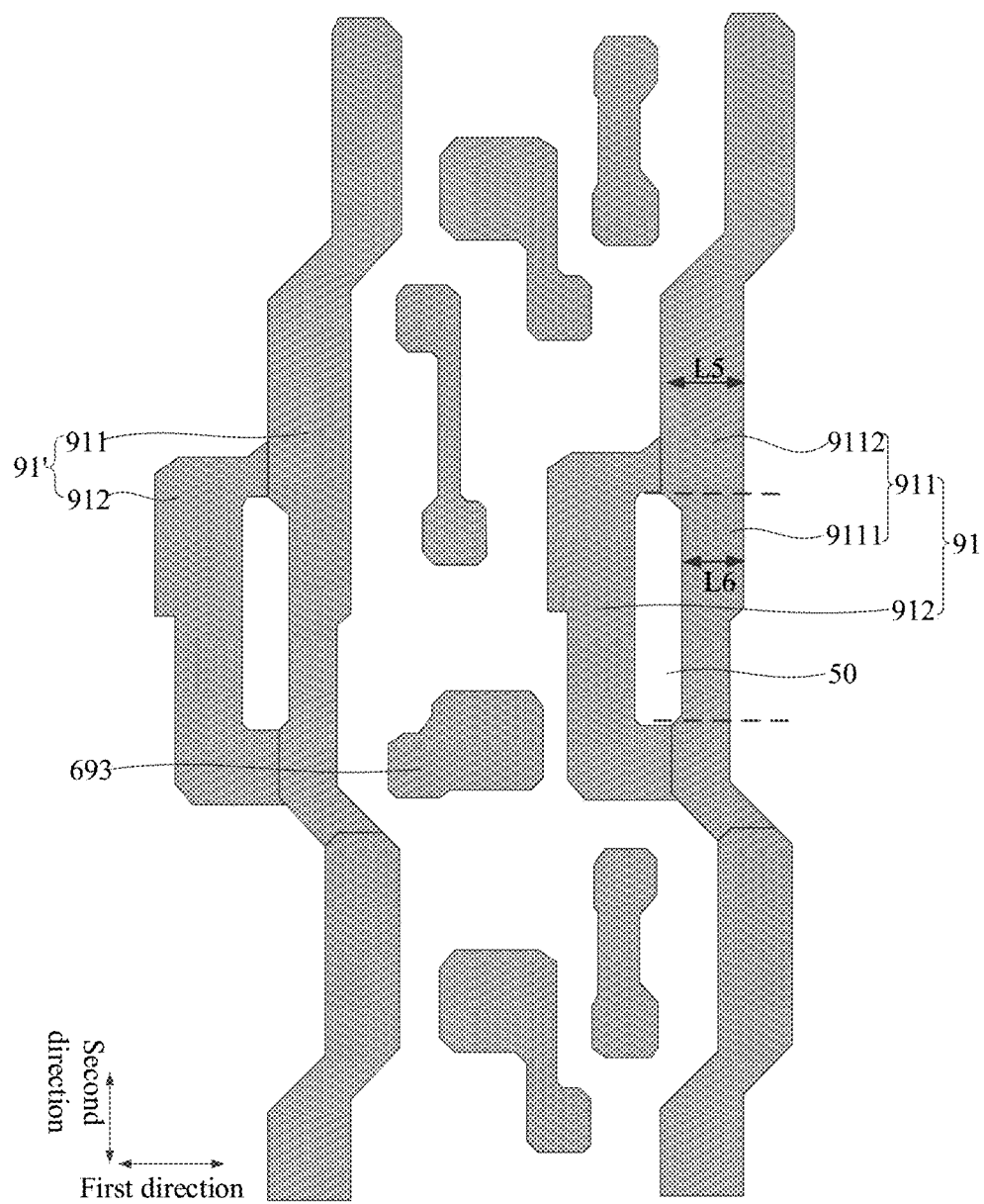
FIG. 27 is a schematic layout diagram of a first source-drain metal layer in FIG. 24.

As shown in FIG. 11 and FIG. 27, in some embodiments, the first power line portion 911 includes a first sub-portion 9111 that is used for defining the hole 50 and the remaining second sub-portion 9112; in a plane parallel to the base, in a direction perpendicular to the second direction, a width L6 of the first sub-portion 9111 is less than a width L5 of the second sub-portion 9112.

Specifically, the first power line portion 911 includes a first sub-portion 9111 that is used for defining the hole 50, and the remaining second sub-portion 9112 that is not used for defining the hole 50. For example, the first sub-portion 9111 and the second sub-portion 9112 form an integral structure. For example, the second power line portion 912 is directly coupled to the second sub-portion 9112.

It is provided in the foregoing that in a plane parallel to the base, in a direction perpendicular to the second direction, the width L6 of the first sub-portion 9111 is less than the width L5 of the second sub-portion 9112, so that in the first direction, a distance between the body portion 9120 and the first power line portion 911 increases, so that the width of the hole 50 in the first direction is increased, thereby further increasing the transmittance of the display substrate.

Figure 33:
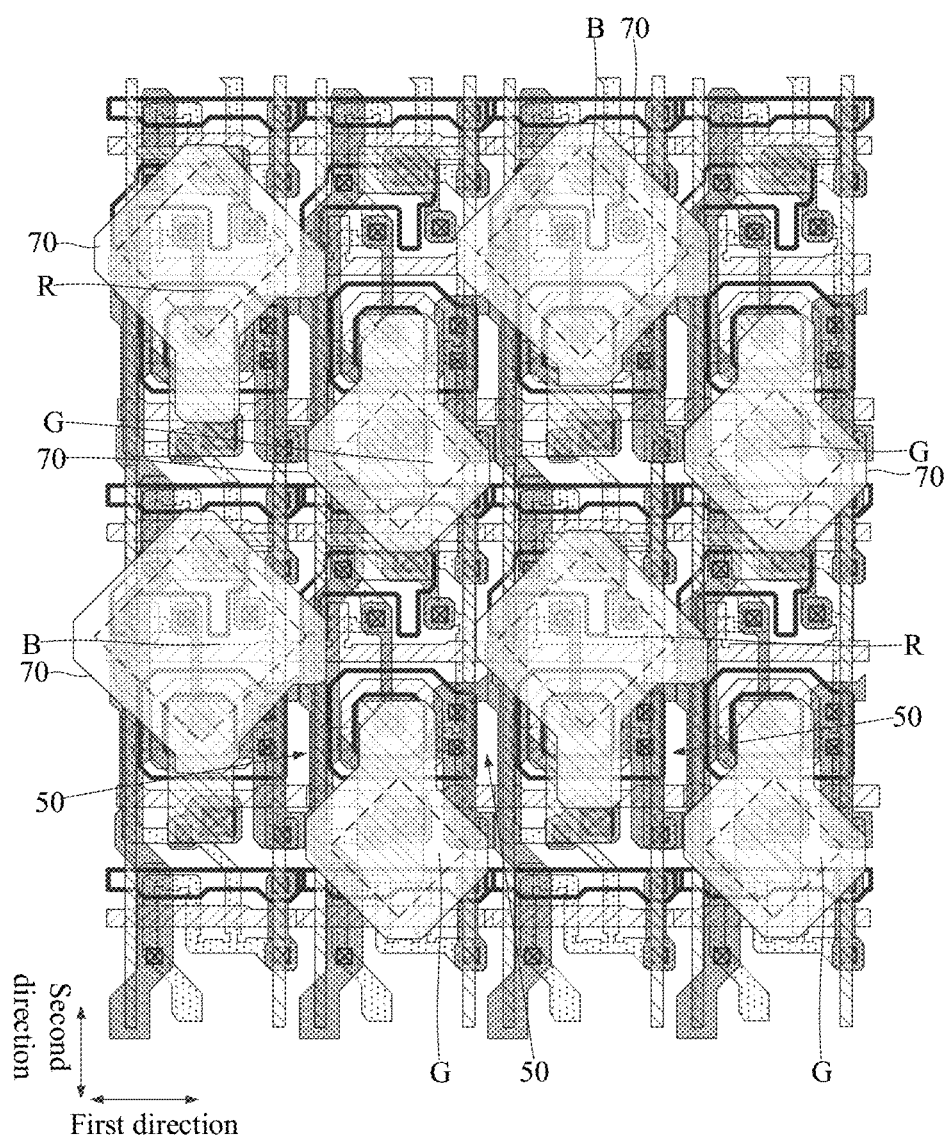
FIG. 33 is a second schematic layout diagram of eight subpixels.
Figure 34:
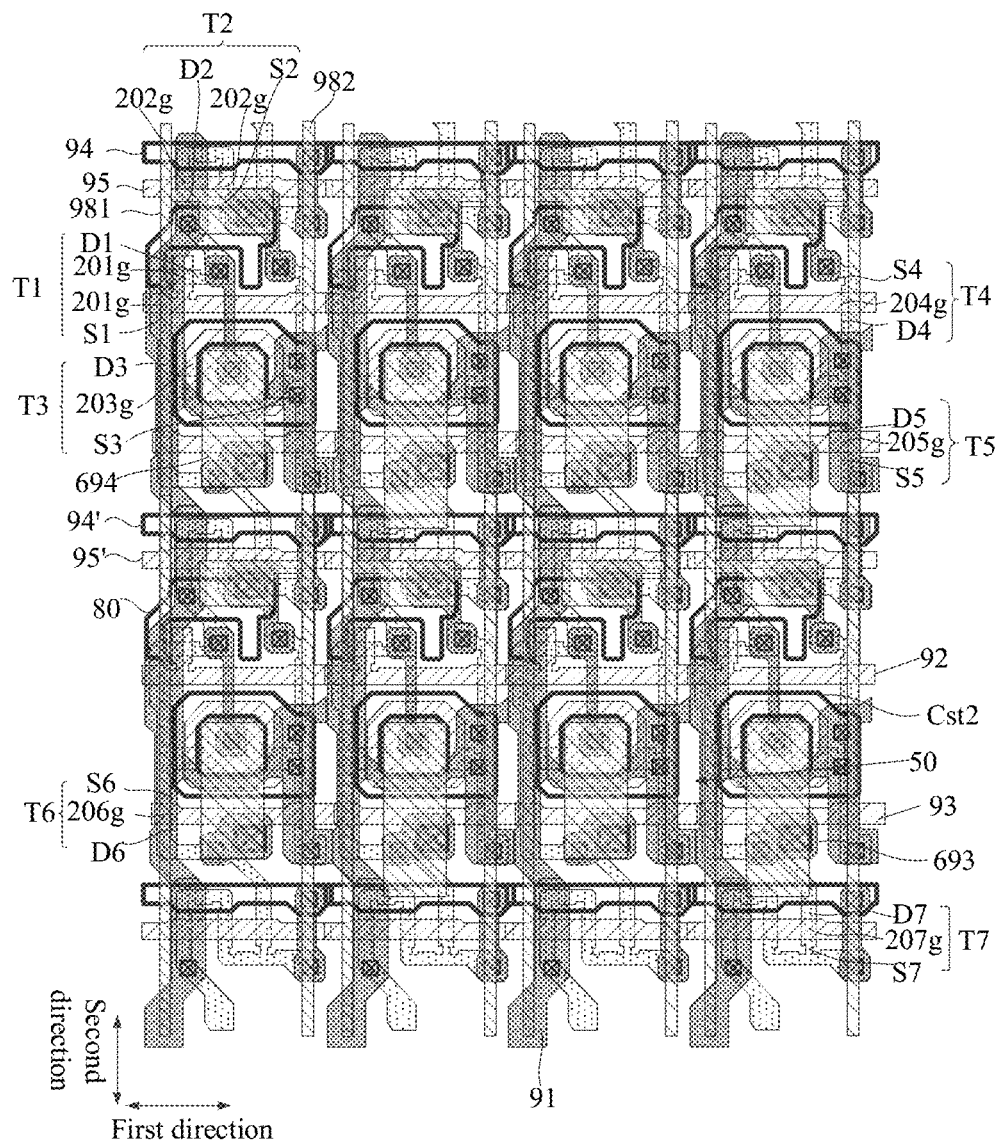
FIG. 34 is a schematic diagram of subpixel driving circuits included in the eight subpixels in FIG. 33.

As shown in FIG. 33 and FIG. 34, in some embodiments, the subpixel further includes a light-emitting element. The light-emitting element includes an anode pattern 70. The orthographic projection of a part of the anode pattern 70 onto the base does not overlap the orthographic projection of the hole 50 onto the base.

Specifically, the light-emitting element includes an anode pattern 70, a light-emitting function layer, and a cathode that are laminated in sequence in a direction away from the base. The anode pattern 70 is coupled to a subpixel driving circuit in the subpixel to which the anode pattern 70 belongs, and receives a driving signal provided by the subpixel driving circuit. The light-emitting function layer includes an organic light-emitting material layer. In addition, the light-emitting function layer may further include common layers of integral layer structure such as an electron transport layer (ETL), an electron injection layer (EIL), a hole transport layer (HTL), and a hole injection layer (HIL). The cathode is coupled to a negative power signal line VSS in the display substrate, and receives a negative power signal provided by the negative power signal line VSS. The light-emitting function layer emits light under the joint effect of the anode pattern 70 and the cathode, to implement a display function of the display substrate.

It is provided in the foregoing that the orthographic projection of the anode pattern 70 onto the base does not overlap the orthographic projection of the hole 50 onto the base, to prevent the anode pattern 702 from blocking the hole 50, thereby better ensuring the light ray transmittance of the hole 50.

Figure 38:
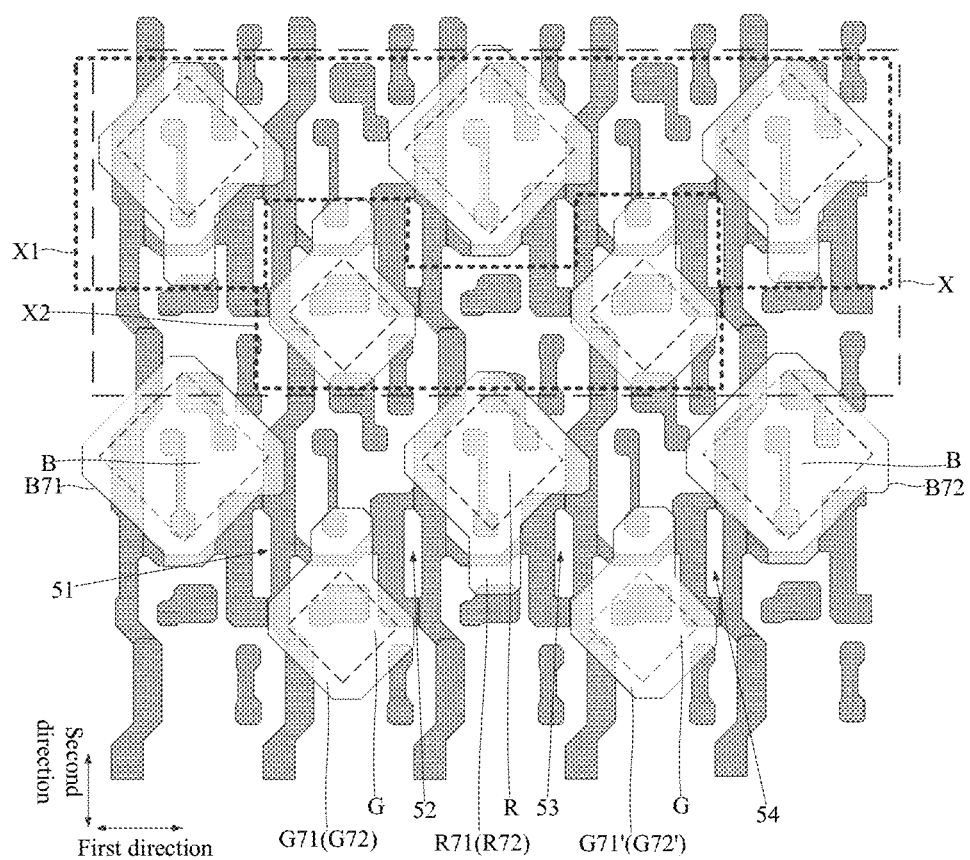
FIG. 38 is a schematic layout diagram of a first source-drain metal layer and an anode layer according to an embodiment of the present disclosure.

As shown in FIG. 33, FIG. 34, and FIG. 38, in some embodiments, the orthographic projection of the hole 50 onto the base is located between an orthographic projection of a first anode pattern onto the base and an orthographic projection of a second anode pattern onto the base. The subpixel to which the hole 50 belongs includes the first anode pattern, and a next subpixel adjacent to the subpixel in the first direction includes the second anode pattern.

Specifically, each subpixel includes a subpixel driving circuit and a light-emitting element located on a side, facing away from the base, of the subpixel driving circuit. For example, the structure of the subpixel driving circuit is shown in FIG. 2. The anode pattern included in the light-emitting element is coupled to the drain electrode D6 of the sixth transistor T6 in the subpixel driving circuit, and receives a driving signal outputted by the drain electrode D6 of the sixth transistor T6.

There are a variety of layout relationships between the hole 50 and the anode pattern 70. For example, the orthographic projection of the hole 50 onto the base is located between an orthographic projection of the first anode pattern onto the base and an orthographic projection of the second anode pattern onto the base. The first anode pattern is the anode pattern 70 included in the subpixel to which the hole 50 belongs. The second anode pattern is the anode pattern 70 included in a next subpixel adjacent to the subpixel in the first direction.

For example, the first anode pattern and the second anode pattern are arranged in a third direction, and the third direction intersects both the first direction and the second direction. For example, the third direction is at 45 degrees to the first direction. For example, the third direction is at 135 degrees to the first direction.

For example, the orthographic projection of the hole 50 onto the base does not overlap the orthographic projection of the first anode pattern onto the base, and the orthographic projection of the hole 50 onto the base does not overlap the orthographic projection of the second anode pattern onto the base.

It is provided in the foregoing that the orthographic projection of the hole 50 onto the base is located between the orthographic projection of the first anode pattern onto the base and the orthographic projection of the second anode pattern onto the base, so that while it is ensured that the hole 50 is not blocked by the first anode pattern and the second anode pattern, a layout space on the display substrate is better utilized, thereby maximizing the size of the hole 50.

As shown in FIG. 33 and FIG. 34, in some embodiments, the plurality of subpixels are divided into a plurality of pixel units, and each pixel unit includes one red subpixel R, one blue subpixel B, and two green subpixels G.

As shown in FIG. 38, in pixel units (for example, the label X) located in the same row in the first direction, the anode patterns (for example, R71/R72) included in the red subpixels R in the pixel units and the anode patterns (for example, B71/B72) included in the blue subpixels B in the pixel units are arranged in one row (for example, the label X1), and the anode patterns (for example, G71/G72/G71'/G72') included in the green subpixels G in the pixel units are arranged in another row (for example, the label X2).

Figure 37:
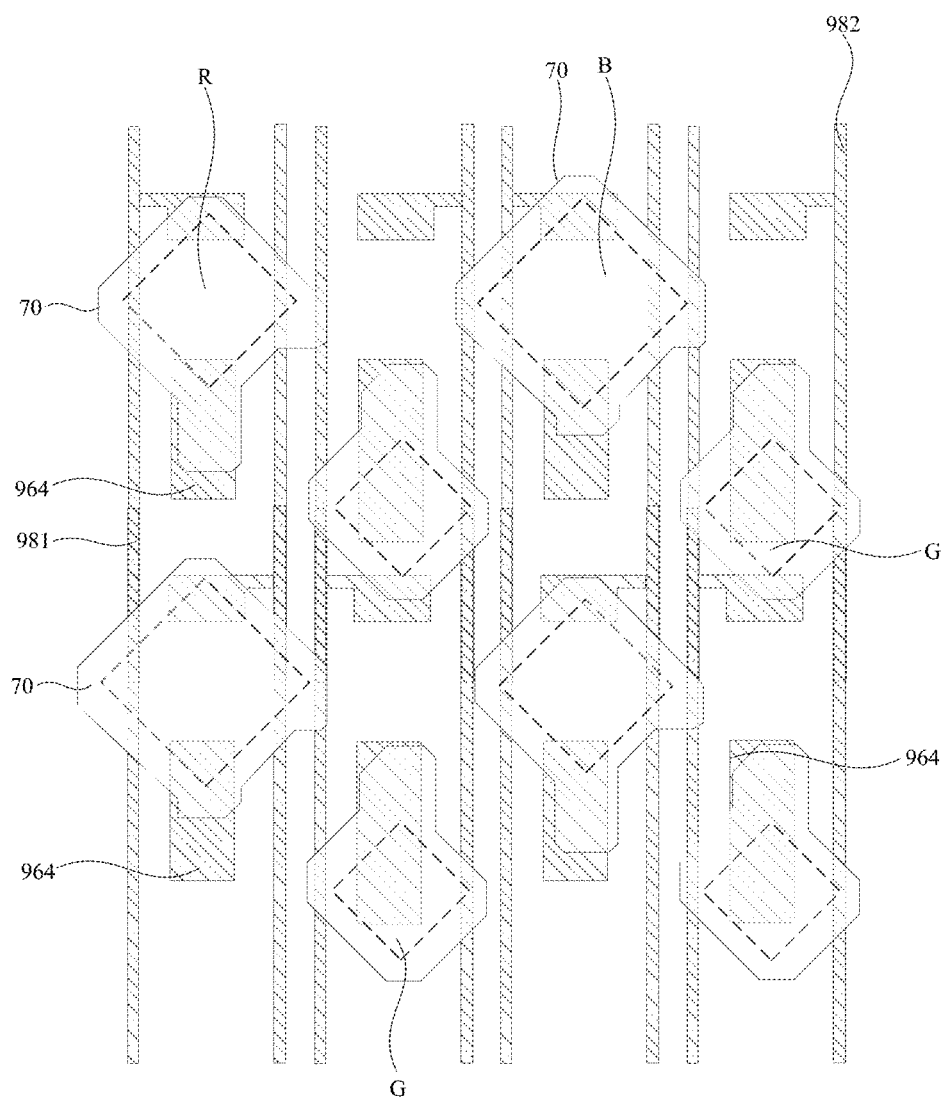
FIG. 37 is a schematic layout diagram of a second source-drain metal layer and an anode layer in FIG. 33.

As shown in FIG. 33 and FIG. 37, in pixel units located in the same row in the first direction, the anode patterns 70 included in the red subpixels R, the anode patterns 70 included in the blue subpixels B, and the anode patterns 70 included in the green subpixels G are alternately distributed in sequence.

In pixel units located in the same row in the first direction, one of a red subpixel R and a green subpixel G that are adjacent includes the first anode pattern, and the other of the red subpixel R and the green subpixel G that are adjacent includes the second anode pattern.

In pixel units located in the same row in the first direction, one of a blue subpixel B and a green subpixel G that are adjacent includes the first anode pattern, and the other of the blue subpixel B and the green subpixel G that are adjacent includes the second anode pattern.

Specifically, the plurality of subpixels are divided into a plurality of pixel units, the plurality of pixel units are distributed in an array, and each pixel unit includes one red subpixel R, one blue subpixel B, and two green subpixels G.

As shown in FIG. 38, for example, in pixel units located in the same row in the first direction, the anode patterns (for example, R71/R72) included in the red subpixels R in the pixel units and the anode patterns (for example, B71/B72) included in the blue subpixels B in the pixel units are arranged in one row, and the anode patterns (for example, G71/G72/G71'/G72') included in the green subpixels G in the pixel units are arranged in another row. That is, in pixel units located in the same row in the first direction, the anode patterns (for example, G71/G72/G71'/G72') included in the green subpixels G and the anode patterns (for example, R71/R72) included in the red subpixels R are staggered in the second direction. In pixel units located in the same row in the first direction, the anode patterns (for example, G71/G72/G71'/G72') included in the green subpixels G and the anode patterns 70 included in the blue subpixels (for example, B71/B72) are staggered in the second direction.

As shown in FIG. 33, for example, in pixel units located in the same row in the first direction, the anode patterns 70 included in the red subpixels R, the anode patterns 70 included in the blue subpixels B, and the anode patterns 70 included in the green subpixels G are alternately distributed in sequence. That is, in pixel units located in the same row in the first direction, all the included subpixels are arranged in a manner of RGBGRGBG, or in pixel units located in the same row in the first direction, all the included subpixels are arranged in a manner of BGRGBGRG.

When the display substrate uses the pixel unit of the foregoing structure, for example, it may be provided that in pixel units located in the same row in the first direction, one of a red subpixel R and a green subpixel G that are adjacent includes the first anode pattern, and the other of the red subpixel R and the green subpixel G that are adjacent includes the second anode pattern. More specifically, as shown in FIG. 38, FIG. 38 shows that an orthographic projection of a third hole 53 onto the base is located between an orthographic projection of a first anode pattern R71 included in the red subpixel R onto the base and an orthographic projection of a second anode pattern G72' included in the green subpixel G onto the base. FIG. 38 shows that an orthographic projection of a second hole 52 onto the base is located between an orthographic projection of a first anode pattern G71 included in the green subpixel G onto the base and an orthographic projection of a second anode pattern R72 included in the red subpixel R onto the base.

When the display substrate uses the pixel unit of the foregoing structure, for example, it may be provided that in pixel units located in the same row in the first direction, one of a blue subpixel B and a green subpixel G that are adjacent includes the first anode pattern, and the other of the blue subpixel B and the green subpixel G that are adjacent includes the second anode pattern. More specifically, as shown in FIG. 38, FIG. 38 shows that an orthographic projection of a fourth hole 54 onto the base is located between an orthographic projection of a first anode pattern G71' included in the green subpixel G onto the base and an orthographic projection of a second anode pattern B72 included in the blue subpixel B onto the base. FIG. 38 shows that an orthographic projection of a first hole 51 onto the base is located between an orthographic projection of a first anode pattern B71 included in the blue subpixel B onto the base and an orthographic projection of a second anode pattern G72 included in the green subpixel G onto the base.

It is provided in the foregoing that the orthographic projection of the hole 50 onto the base is located between the orthographic projection of the first anode pattern onto the base and the orthographic projection of the second anode pattern onto the base, so that while it is ensured that the hole 50 is not blocked by the first anode pattern and the second anode pattern, the layout space on the display substrate is better utilized, thereby maximizing the size of the hole 50.

As shown in FIG. 16 to FIG. 19, in some embodiments, the plurality of subpixels are divided into a plurality of pixel units, and each pixel unit includes one red subpixel R, one blue subpixel B, a first green subpixel G1, and a second green subpixel G2.

In pixel units located in the same row in the first direction, the anode patterns 70 included in the red subpixels R, the anode patterns 70 included in the blue subpixels B, and the anode patterns 70 included in the first green subpixels G1 in the pixel units are arranged in one row (for example, the label X3), and the anode patterns 70 included in the second green subpixels G2 in the pixel units are arranged in another row (for example, the label X4).

The hole 50 includes a first hole 501. A part of an orthographic projection of the first hole 501 onto the base is located inside an orthographic projection of the anode pattern 70 included in the first green subpixel G1 onto the base.

Another part of the orthographic projection of the first hole 501 onto the base is located between an orthographic projection of the anode pattern 70 included in the red subpixel R onto the base and the orthographic projection of the anode pattern 70 included in the first green subpixel G1 onto the base. The anode pattern 70 included in the red subpixel R and the anode pattern 70 included in the first green subpixel G1 are located in the same row.

Another part of the orthographic projection of the first hole 501 onto the base is located between an orthographic projection of the anode pattern 70 included in the blue subpixel B onto the base and the orthographic projection of the anode pattern 70 included in the first green subpixel G1 onto the base. The anode pattern included in the blue subpixel B and the anode pattern included in the first green subpixel G1 are located in two adjacent rows.

Specifically, the plurality of subpixels are divided into a plurality of pixel units, and each pixel unit includes one red subpixel R, one blue subpixel B, a first green subpixel G1, and a second green subpixel G2. For example, in one pixel unit, subpixel driving circuits included in subpixels of various colors are located in the same row in the first direction.

For example, in pixel units located in the same row in the first direction, the anode patterns 70 included in the red subpixels R, the anode patterns 70 included in the blue subpixels B, and the anode patterns 70 included in the first green subpixels G1 in the pixel units are arranged in one row.

The hole 50 includes a first hole 501. For example, a part of the orthographic projection of the first hole 501 onto the base is located inside the orthographic projection of the anode pattern 70 included in the first green subpixel G1 onto the base, another part of the orthographic projection of the first hole 501 onto the base does not overlap the orthographic projection of the anode pattern 70 included in the first green subpixel G1 onto the base. For example, a proportion of the part is less than ½ of the entire first hole 501. For example, the proportion of the part is generally ⅓ of the entire first hole 501.

For example, another part of the orthographic projection of the first hole 501 onto the base is located between the orthographic projection of the anode pattern 70 included in the red subpixel R onto the base and the orthographic projection of the anode pattern 70 included in the first green subpixel G1 onto the base. The anode pattern 70 of the first green subpixel G1 can cover a part of the first hole 501. For example, the anode pattern 70 included in the red subpixel R and the anode pattern included in the first green subpixel G1 are located in the same row in the first direction. For example, the first hole 501 belongs to the red subpixel R.

The another part of the orthographic projection of the first hole 501 onto the base is further located between the orthographic projection of the anode pattern 70 included in the blue subpixel B onto the base and the orthographic projection of the anode pattern 70 included in the first green subpixel G1 onto the base. For example, the anode pattern 70 included in the blue subpixel B is located in a next row adjacent to the anode pattern 70 included in the first green subpixel G1. For example, the anode pattern 70 included in the blue subpixel B and the anode pattern 70 included in the first green subpixel G1 are arranged in a fourth direction. The fourth direction intersects both the first direction and the second direction.

In some embodiments, the area of the part of the orthographic projection of the first hole 501 onto the base is less than 50% of the overall area of the orthographic projection of the first hole 501 onto the base.

As shown in FIG. 16 to FIG. 19, in some embodiments, the plurality of subpixels are divided into a plurality of pixel units, and each pixel unit includes one red subpixel R, one blue subpixel B, a first green subpixel G1, and a second green subpixel G2.

In pixel units located in the same row in the first direction, the anode patterns 70 included in the red subpixels R, the anode patterns 70 included in the blue subpixels B, and the anode patterns 70 included in the first green subpixels G1 in the pixel units are arranged in one row (for example, the label X3), and the anode patterns 70 included in the second green subpixels G2 in the pixel units are arranged in another row (for example, the label X4).

The hole includes a second hole 502. An orthographic projection of the second hole 502 onto the base is located between the orthographic projection of the anode pattern 70 included in the first green subpixel G1 onto the base and the orthographic projection of the anode pattern 70 included in the blue subpixel B onto the base. The orthographic projection of the second hole 502 onto the base does not overlap the orthographic projection of the anode pattern 70 included in the red subpixel R onto the base. The anode pattern included in the first green subpixel G1 and the anode pattern included in the blue subpixel B are located in the same row. The anode pattern included in the red subpixel R and the anode pattern included in the first green subpixel G1 are located in two adjacent rows.

Specifically, the hole 50 includes a second hole 502. For example, the orthographic projection of the second hole 502 onto the base is located between the orthographic projection of the anode pattern 70 included in the first green subpixel G1 onto the base and the orthographic projection of the anode pattern 70 included in the blue subpixel B onto the base. For example, the second hole 502 belongs to the first green subpixel G1. For example, the anode pattern included in the first green subpixel G1 and the anode pattern included in the blue subpixel B are located in the same row in the first direction.

For example, the orthographic projection of the second hole 502 onto the base does not overlap the orthographic projection of the anode pattern 70 included in the first green subpixel G1 onto the base. The orthographic projection of the second hole 502 onto the base does not overlap the orthographic projection of the anode pattern 70 included in the blue subpixel B onto the base. The orthographic projection of the second hole 502 onto the base does not overlap the orthographic projection of the anode pattern 70 included in the red subpixel R onto the base. For example, the anode pattern included in the red subpixel R is located in a next row adjacent to the anode pattern included in the first green subpixel G1. The anode pattern included in the red subpixel R and the anode pattern included in the first green subpixel G1 are staggered in the second direction. The anode pattern 70 included in the red subpixel R and the anode pattern 70 included in the blue subpixel B are staggered in the second direction. For example, the anode pattern 70 included in the red subpixel R and the anode pattern 70 included in the blue subpixel B are staggered in the second direction.

As shown in FIG. 16 to FIG. 19, in some embodiments, the plurality of subpixels are divided into a plurality of pixel units, and each pixel unit includes one red subpixel R, one blue subpixel B, a first green subpixel G1, and a second green subpixel G2.

In pixel units located in the same row in the first direction, the anode patterns 70 included in the red subpixels R, the anode patterns 70 included in the blue subpixels B, and the anode patterns 70 included in the first green subpixels G1 in the pixel units are arranged in one row (for example, the label X3), and the anode patterns 70 included in the second green subpixels G2 in the pixel units are arranged in another row (for example, the label X4).

The hole includes a third hole 503. A part of an orthographic projection of the third hole 503 onto the base is located inside an orthographic projection of the anode pattern included in the blue subpixel B onto the base.

Another part of the orthographic projection of the third hole 503 onto the base is located between the orthographic projection of the anode pattern included in the blue subpixel B onto the base and an orthographic projection of the anode pattern 70 included in the second green subpixel G2 onto the base. The anode pattern included in the blue subpixel B and the anode pattern included in the second green subpixel G2 are located in two adjacent rows.

Specifically, the hole 50 includes a third hole 503. For example, a part of the orthographic projection of the third hole 503 onto the base is located inside the orthographic projection of the anode pattern 70 included in the blue subpixel B onto the base. Another part of the orthographic projection of the third hole 503 onto the base does not overlap the orthographic projection of the anode pattern 70 included in the blue subpixel B onto the base. For example, a proportion of the part is less than ⅓ of the entire third hole 503. For example, the proportion of the part is generally ¼ of the entire third hole 503. For example, the third hole 503 belongs to the blue subpixel B.

For example, another part of the orthographic projection of the third hole 503 onto the base is located between the orthographic projection of the anode pattern 70 included in the blue subpixel B onto the base and the orthographic projection of the anode pattern 70 included in the second green subpixel G2 onto the base. For example, the anode pattern 70 included in the second green subpixel G2 is located in a next row adjacent to the anode pattern 70 included in the blue subpixel B. For example, the anode pattern 70 included in the blue subpixel B and the anode pattern 70 included in the second green subpixel G2 are arranged in a fifth direction. The fifth direction intersects both the first direction and the second direction.

In some embodiments, the area of the part of the orthographic projection of the third hole onto the base is less than 30% of the overall area of the orthographic projection of the third hole onto the base.

As shown in FIG. 16 to FIG. 19, in some embodiments, the plurality of subpixels are divided into a plurality of pixel units, and each pixel unit includes one red subpixel R, one blue subpixel B, a first green subpixel G1, and a second green subpixel G2.

In pixel units located in the same row in the first direction, the anode patterns 70 included in the red subpixels R, the anode patterns 70 included in the blue subpixels B, and the anode patterns 70 included in the first green subpixels G1 in the pixel units are arranged in one row (for example, the label X3), and the anode patterns 70 included in the second green subpixels G2 in the pixel units are arranged in another row (for example, the label X4).

The hole 50 includes a fourth hole 504. A part of an orthographic projection of the fourth hole 504 onto the base is located inside an orthographic projection of the anode pattern included in the red subpixel R onto the base.

Another part of the orthographic projection of the fourth hole 504 onto the base is located between the orthographic projection of the anode pattern included in the red subpixel R onto the base and the orthographic projection of the anode pattern 70 included in the second green subpixel G2 onto the base. The anode pattern included in the red subpixel R and the anode pattern included in the second green subpixel G2 are located in two adjacent rows.

Specifically, the hole 50 includes a fourth hole 504. For example, a part of the orthographic projection of the fourth hole 504 onto the base is located inside the orthographic projection of the anode pattern 70 included in the red subpixel R onto the base. Another part of the orthographic projection of the fourth hole 504 onto the base does not overlap the orthographic projection of the anode pattern 70 included in the red subpixel R onto the base. For example, a proportion of the part is less than ¾ of the entire fourth hole 504. For example, the proportion of the part is generally ⅔ of the entire fourth hole 504.

For example, another part of the orthographic projection of the fourth hole 504 onto the base is located between the orthographic projection of the anode pattern 70 included in the red subpixel R onto the base and the orthographic projection of the anode pattern 70 included in the second green subpixel G2 onto the base. For example, the anode pattern 70 included in the second green subpixel G2 is located in a next row adjacent to the anode pattern 70 included in the red subpixel R. For example, the fourth hole 504 belongs to the green subpixel G.

In some embodiments, the area of the part of the orthographic projection of the fourth hole onto the base is less than 75% of the overall area of the orthographic projection of the fourth hole onto the base.

When the display substrate provided in the foregoing embodiments includes the first hole 501, the second hole 502, the third hole 503, and the fourth hole 504, the light transmittance of the display substrate can be maximized, so that an adequate condition is provided for the acquisition of a light signal by the sensor, thereby effectively improving the speed and accuracy of fingerprint recognition.

Figure 10:
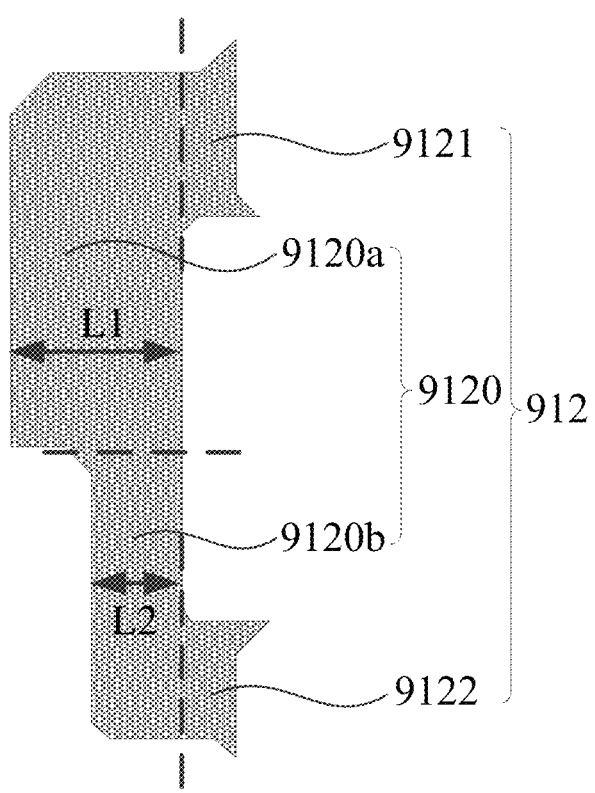
FIG. 10 is a schematic structural diagram of a second power line portion in FIG. 9.
Figure 25:
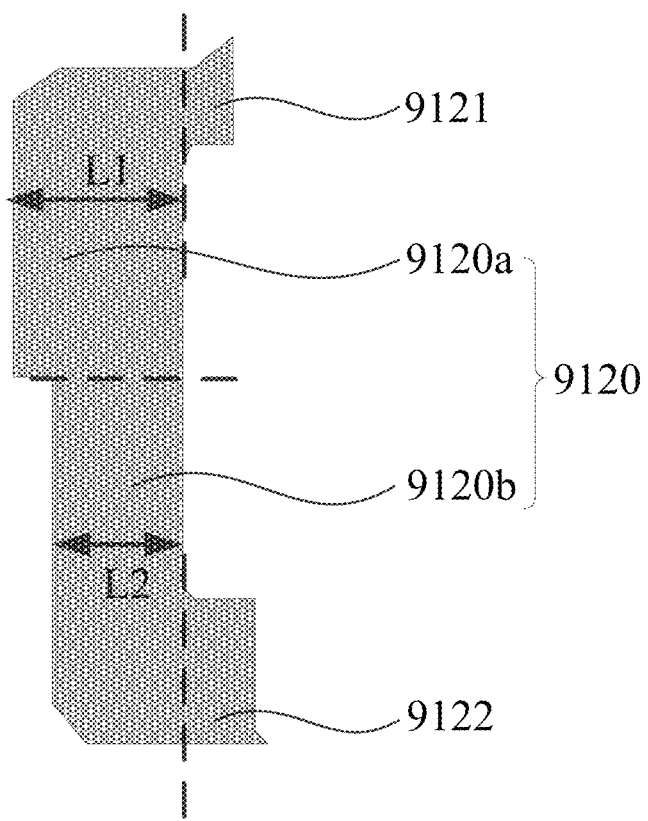
FIG. 25 is a schematic structural diagram of a second power line portion in FIG. 24.

As shown in FIG. 10 and FIG. 25, in some embodiments, the body portion 9120 includes a first body portion 9120*a* and a second body portion 9120*b*. The first body portion 9120*a* is close to the first end portion 9121. The second body portion 9120*b* is close to the second end portion 9122. In a plane parallel to the base, in a direction perpendicular to the second direction, the width L1 of the first body portion 9120*a* is greater than the width L2 of the second body portion 9120*b*.

The subpixel further includes a subpixel driving circuit. The subpixel driving circuit includes a driving transistor (for example, the third transistor T3) and a storage capacitor Cst. A first plate Cst1 of the storage capacitor Cst is coupled to the gate electrode of the driving transistor. An orthographic projection of a second plate Cst2 of the storage capacitor Cst onto the base overlaps an orthographic projection of the first body portion 9120*a* onto the base. The second plate Cst2 of the storage capacitor Cst is coupled to the first body portion 9120*a* by a via hole provided at an overlapping position.

Specifically, it is provided that in a plane parallel to the base, in the direction perpendicular to the second direction, the width L1 of the first body portion 9120*a* is greater than the width L2 of the second body portion 9120*b*, and the orthographic projection of the second plate Cst2 of the storage capacitor Cst onto the base overlaps the orthographic projection of the first body portion 9120*a* onto the base, to enable the second plate Cst2 of the storage capacitor Cst to form an overlapping region of a relatively large area with the first body portion 9120*a*. In this way, when the second plate Cst2 of the storage capacitor Cst and the first body portion 9120*a* are coupled by the via hole provided at the overlapping position, layout difficulty of the via can be reduced, to better improve connection performance between the second plate Cst2 of the storage capacitor Cst and the first body portion 9120*a*.

As shown in FIG. 9 and FIG. 24, in some embodiments, it is provided that the orthographic projection of the second plate Cst2 of the storage capacitor Cst onto the base does not overlap an orthographic projection of the hole 50 onto the base.

The foregoing arrangement manner enables the second plate Cst2 of the storage capacitor Cst not to block the hole 50, thereby better ensuring the light ray transmittance of the hole 50.

As shown in FIG. 13, FIG. 14, FIG. 30, and FIG. 31, in some embodiments, the subpixel further includes a power compensation pattern 971. At least a part of the power compensation pattern 971 extends in the first direction. The power compensation pattern 971 is separately coupled to the body portion 9120 and a first power line portion 911 in a subpixel adjacent in the first direction to the subpixel to which the power compensation pattern 971 belongs.

For example, the power compensation pattern 971 forms an integral structure with the body portion 9120 and the first power line portion 911.

It is provided in the foregoing that the subpixel further includes a power compensation pattern 971, to enable the power signal line patterns 91 included in subpixels located in the same row to be electrically connected together by the power compensation pattern 971, so as to reduce the overall resistance of the power signal line pattern 91, thereby better improving the display uniformity of the display substrate. Further, it is provided that the first power line portions 911 in subpixels located in the same column are electrically connected in sequence, to enable all the power signal line patterns 91 included in the display substrate to jointly form a mesh structure, thereby further improving the display uniformity of the display substrate.

Figure 13:
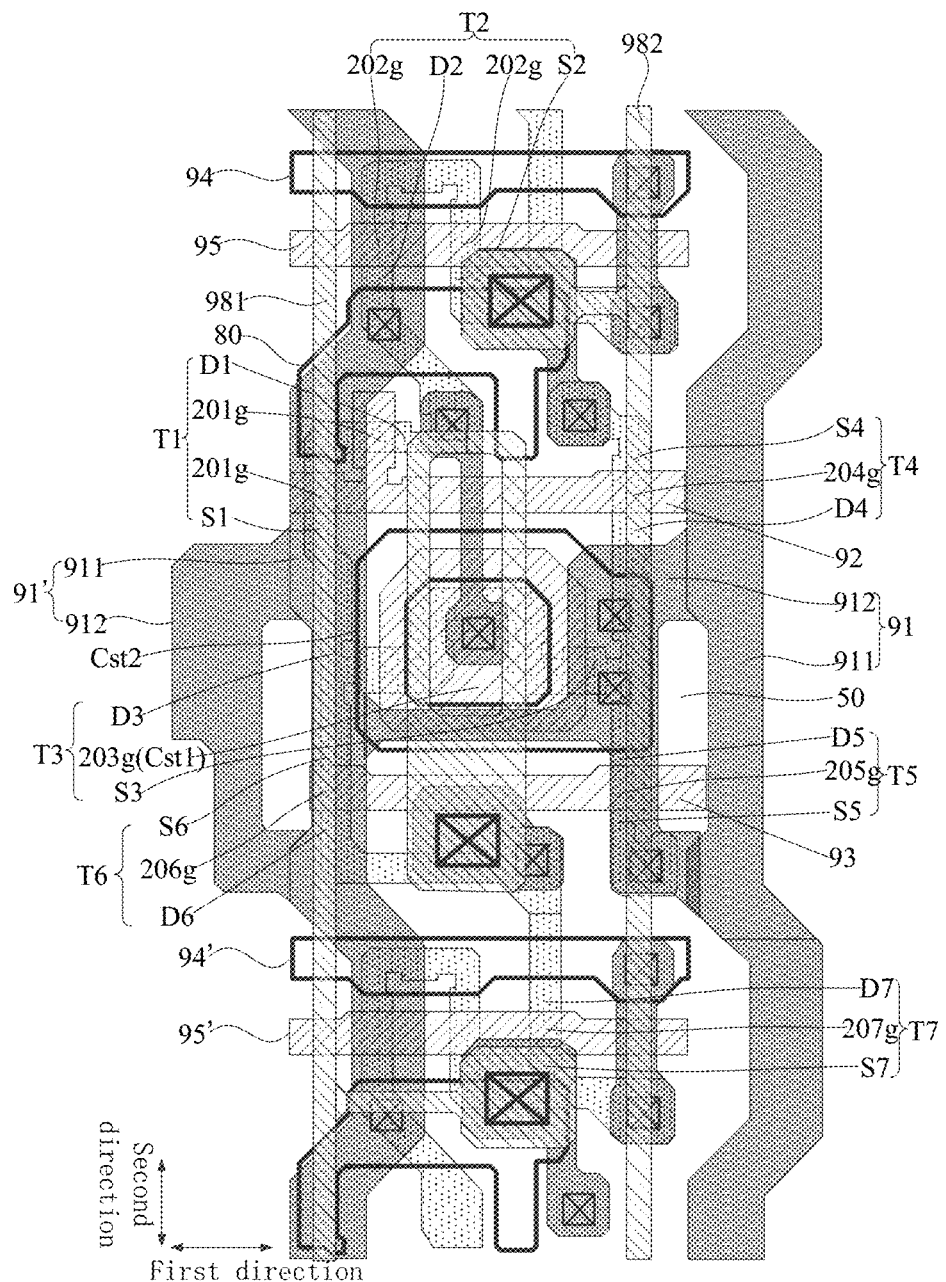
FIG. 13 is a third schematic layout diagram of a subpixel according to an embodiment of the present disclosure.
Figure 30:
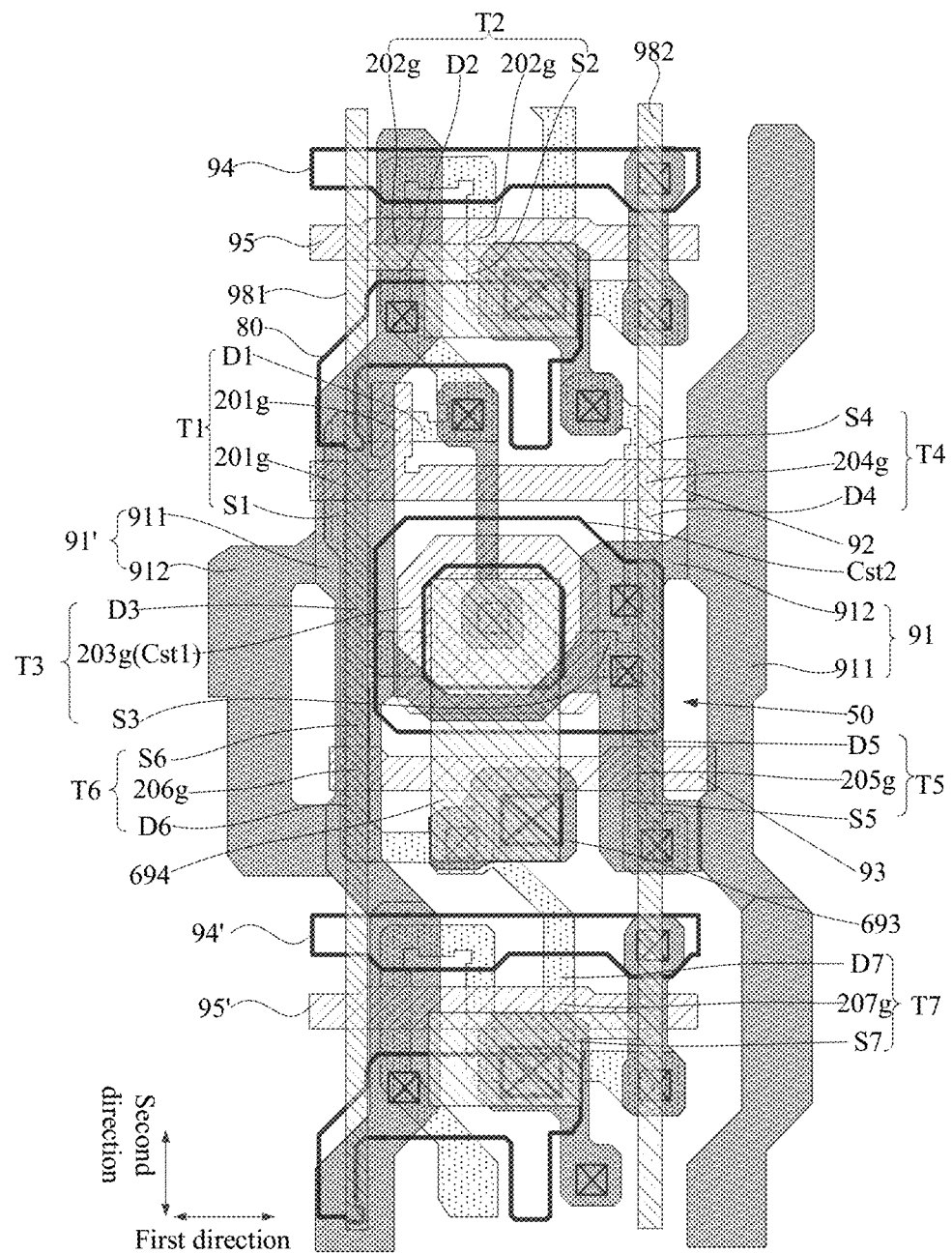
FIG. 30 is a fifth schematic layout diagram of a subpixel according to an embodiment of the present disclosure.

As shown in FIG. 13 and FIG. 30, in some embodiments, the subpixel further includes a reset signal line pattern 95, a gate line pattern 92, and a light-emitting control signal line pattern 93 that are distributed in sequence in the second direction. At least a part of the reset signal line pattern 95 extends in the first direction, at least a part of the gate line pattern 92 extends in the first direction, and at least a part of the light-emitting control signal line pattern 93 extends in the first direction. An orthographic projection of the power compensation pattern 971 onto the base is located between an orthographic projection of the gate line pattern 92 onto the base and an orthographic projection of the light-emitting control signal line pattern 93 onto the base.

Specifically, the subpixel further includes a reset signal line pattern 95, a gate line pattern 92, and a light-emitting control signal line pattern 93 that are distributed in sequence in the second direction. The reset signal line is used for transmitting a reset signal. The gate line pattern 92 is used for transmitting a scan signal. The light-emitting control signal line pattern 93 is used for transmitting a light-emitting control signal.

At least a part of the reset signal line pattern 95 extends in the first direction, and the reset signal line patterns 95 included in subpixels located in the same row in the first direction are electrically connected in sequence, so that an integral structure can be formed. At least a part of the gate line pattern 92 extends in the first direction, and the gate line patterns 92 included in subpixels located in the same row in the first direction are electrically connected in sequence, so that an integral structure can be formed. At least a part of the light-emitting control signal line pattern 93 extends in the first direction, and the light-emitting control signal line patterns 93 included in subpixels located in the same row in the first direction are electrically connected in sequence, so that an integral structure can be formed.

There are a variety of specific layout positions of the power compensation pattern 971. For example, the orthographic projection of the power compensation pattern 971 onto the base does not overlap an orthographic projection of the reset signal line pattern 95 onto the base. The orthographic projection of the power compensation pattern 971 onto the base does not overlap the orthographic projection of the gate line pattern 92 onto the base. The orthographic projection of the power compensation pattern 971 onto the base does not overlap the orthographic projection of the light-emitting control signal line pattern 93 onto the base.

For example, the orthographic projection of the power compensation pattern 971 onto the base is located between the orthographic projection of the gate line pattern 92 onto the base and the orthographic projection of the light-emitting control signal line pattern 93 onto the base.

For example, in the second direction, the minimum distance between the orthographic projection of the power compensation pattern 971 onto the base and the orthographic projection of the gate line pattern 92 onto the base is greater than the minimum distance between the orthographic projection of the power compensation pattern 971 onto the base and the orthographic projection of the light-emitting control signal line pattern 93 onto the base.

For example, the minimum distance between the orthographic projection of the power compensation pattern 971 onto the base and the orthographic projection of the light-emitting control signal line pattern 93 onto the base is greater than 5 µm.

When the power compensation pattern 971 is arranged in the foregoing manner, the power compensation pattern 971 has relatively large distances from all the reset signal line pattern 95, the gate line pattern 92, and the light-emitting control signal line pattern 93, thereby avoiding increasing the load of the reset signal line pattern 95, the gate line pattern 92, and the light-emitting control signal line pattern 93.

As shown in FIG. 5, FIG. 13, FIG. 26, and FIG. 30, in some embodiments, the subpixel further includes a light-emitting control signal line pattern 93. At least a part of the light-emitting control signal line pattern 93 extends in the first direction. The light-emitting control signal line pattern 93 includes a first light-emitting control portion 931 and a second light-emitting control portion 932. An orthographic projection of the first light-emitting control portion 931 onto the base separately overlaps an orthographic projection of the body portion 9120 onto the base, the orthographic projection of the hole 50 onto the base, and an orthographic projection of the first power line portion 911 onto the base. In the second direction, an orthographic projection of the second light-emitting control portion 932 onto the base is opposite to an orthographic projection of the power compensation pattern 971 onto the base. In a plane parallel to the base, in a direction perpendicular to the first direction, a width L4 of the second light-emitting control portion 932 is less than a width L3 of the first light-emitting control portion 931.

Specifically, the light-emitting control signal line pattern 93 includes a first light-emitting control portion 931 and a second light-emitting control portion 932 that are coupled to each other. For example, the first light-emitting control portion 931 and the second light-emitting control portion 932 form an integral structure.

It is provided in the foregoing that in the second direction, the orthographic projection of the second light-emitting control portion 932 onto the base is opposite to an orthographic projection of the power compensation pattern 971 onto the base, and in a plane parallel to the base, in a direction perpendicular to the first direction, the width L4 of the second light-emitting control portion 932 is less than the width L3 of the first light-emitting control portion 931, so that in the second direction, a distance between the power compensation pattern 971 and the second light-emitting control portion 932 is larger, thereby better avoiding increasing the load of the light-emitting control signal line pattern 93.

Figure 14:
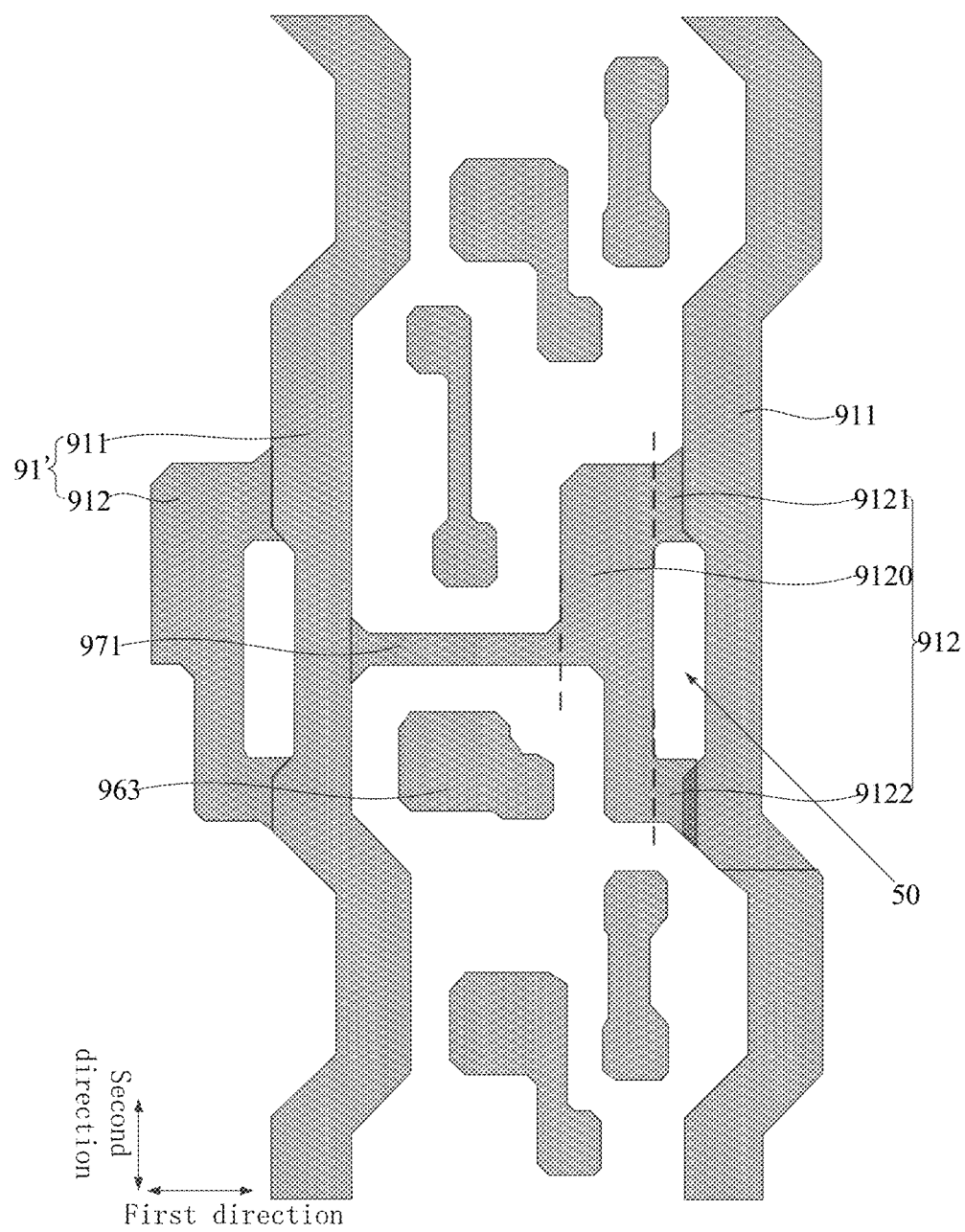
FIG. 14 is a schematic layout diagram of a first source-drain metal layer in FIG. 13.
Figure 15:
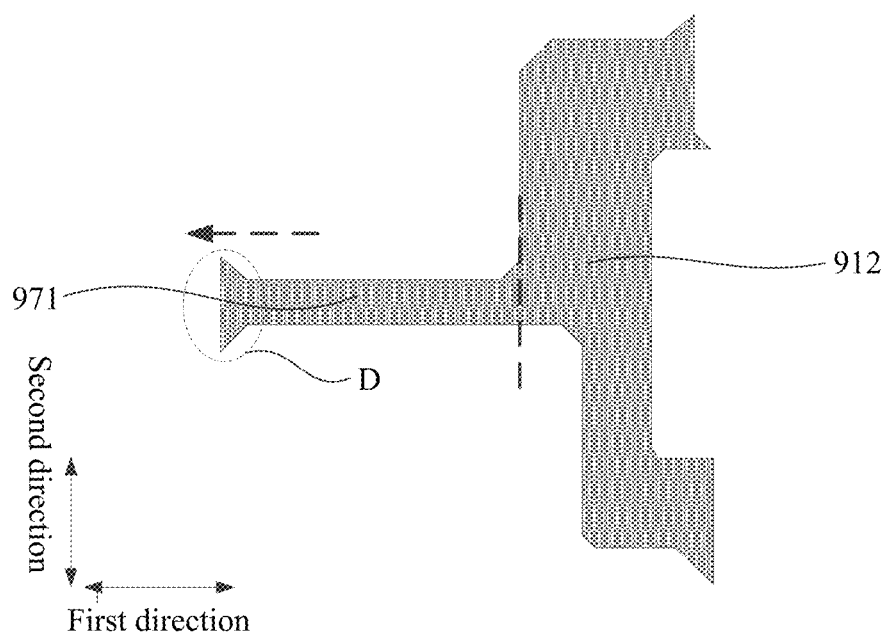
FIG. 15 is a first schematic connection diagram of a power compensation pattern and a second power line portion in FIG. 13.

There are a variety of specific structures of the power compensation pattern 971. As shown in FIG. 14 and FIG. 15, in some embodiments, the power compensation pattern 971 is a strip-like structure extending in the first direction.

Figure 31:
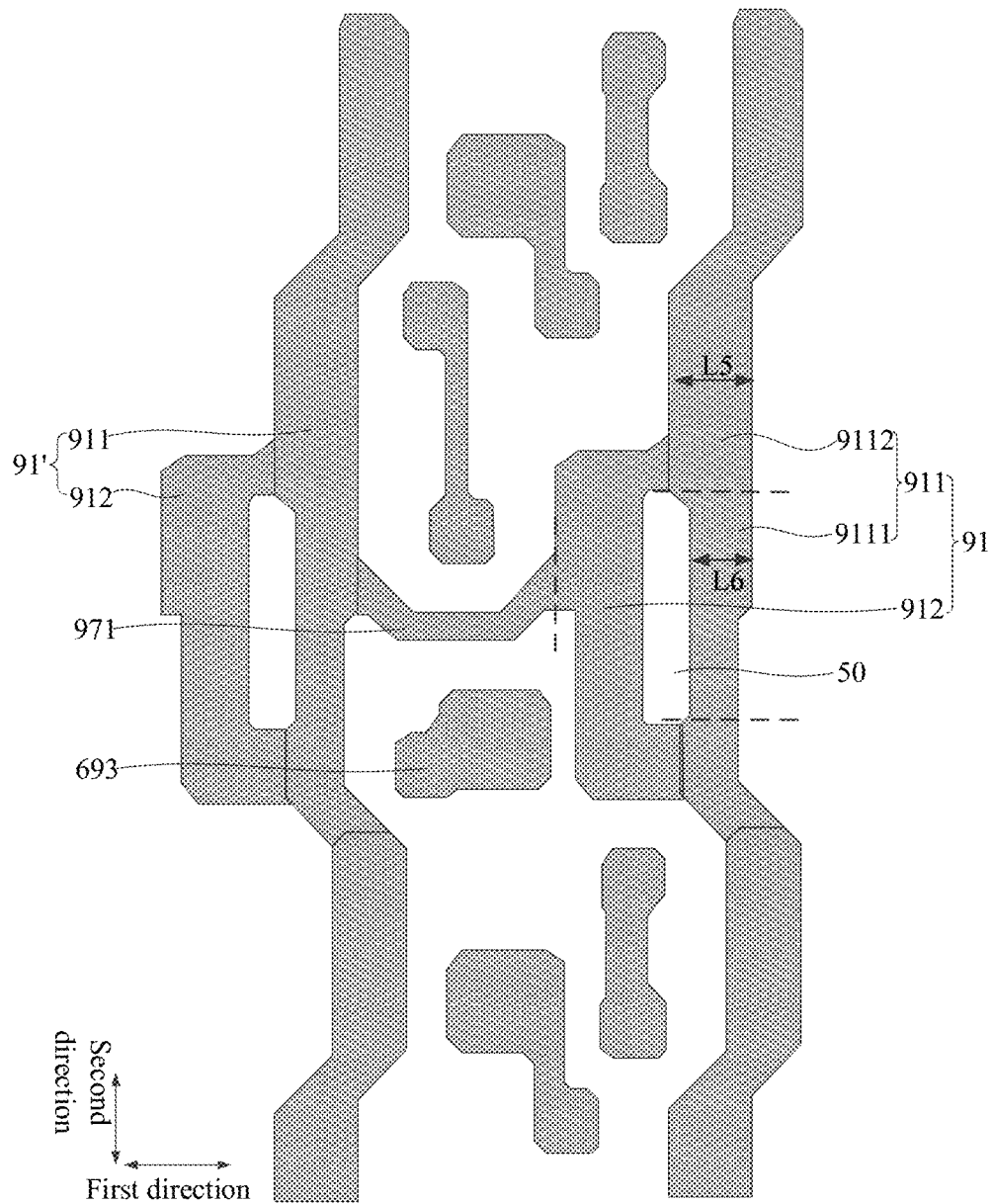
FIG. 31 is a schematic layout diagram of a first source-drain metal layer in FIG. 30.
Figure 32:
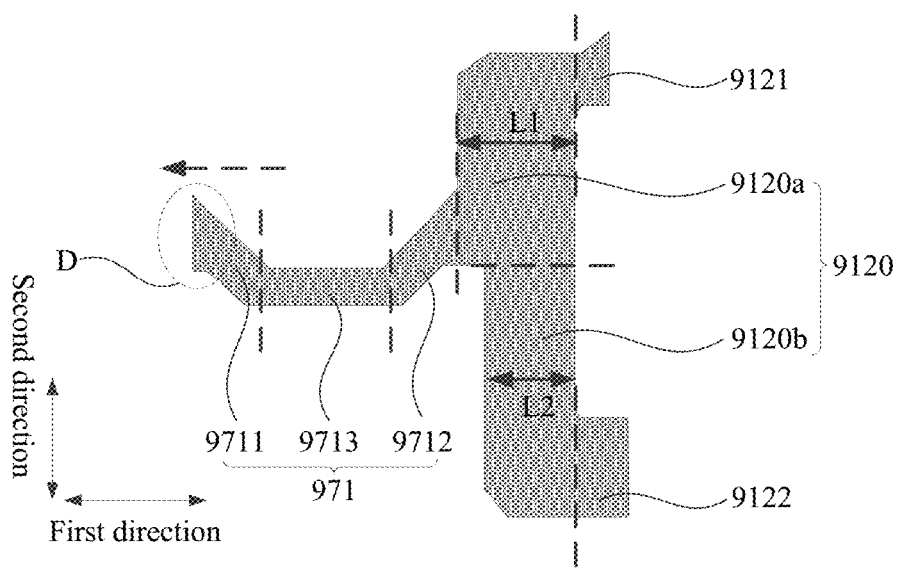
FIG. 32 is a second schematic connection diagram of a power compensation pattern and a second power line portion in FIG. 30.

As shown in FIG. 31 and FIG. 32, in some embodiments, the power compensation pattern 971 includes a first part 9711, a second part 9712, and a third part 9713. The first part 9711 is separately coupled to the first power line portion 911 and one end of the third part 9713. The second part 9712 is separately coupled to the body portion 9120 and the other end of the third part 9713. The third part 9713 extends in the first direction. An extension direction of the first part 9711 and the extension direction of the second part 9712 both intersect the first direction, and both intersect the second direction.

For example, the third part 9713 extends in the first direction. The extension direction of the first part 9711 forms an angle of 45 degrees with respect to the first direction. The extension direction of the second part 9712 forms an angle of 45 degrees with respect to the first direction. An extension direction of the first part 9711 is perpendicular to the extension direction of the second part 9712.

It is provided in the foregoing that the power compensation pattern 971 includes the first part 9711, the second part 9712, and the third part 9713, to enable the power compensation pattern 971 to have a larger area, thereby further reducing the overall resistance of the power signal line pattern 91, to improve the display uniformity of the display substrate.

In addition, it is provided that the power compensation pattern 971 includes the first part 9711, the second part 9712, and the third part 9713, to enable the power compensation pattern 971 to better avoid other conductive structures disposed in the same layer as the power compensation pattern 971, thereby better reducing layout difficulty of the power compensation pattern 971 and improving the reliability of the display substrate, As shown in FIG. 15 and FIG. 32, in some embodiments, in a plane parallel to the base, in a direction perpendicular to the first direction, an end D, directly coupled to the first power line portion 911, of the power compensation pattern 971 has a first width. In a direction toward the first power line portion 911 (for example, the direction pointed by the arrowed dotted-lines in FIG. 15 and FIG. 32), the first width gradually increases.

The foregoing arrangement manner provides better performance of connection between the power compensation pattern 971 and the first power line portion 911, and also further avoids a risk of static electricity caused by a right-angle structure formed at a connection between the power compensation pattern 971 and the first power line portion 911.

As shown in FIG. 18 and FIG. 33, in some embodiments, the subpixel further includes a light-emitting element. The light-emitting element includes an anode pattern 70. The orthographic projection of the anode pattern 70 onto the base overlaps an orthographic projection of the power compensation pattern 971 onto the base.

Specifically, it is provided in the foregoing that the orthographic projection of the anode pattern 70 onto the base overlaps the orthographic projection of the power compensation pattern 971 onto the base, to help to increase a degree of planarization of the anode pattern, thereby mitigating a color shift phenomenon of the display substrate.

As shown in FIG. 2, FIG. 9, and FIG. 24, in some embodiments, the subpixel further includes a light-emitting element, an initialization signal line pattern 94, a reset signal line pattern 95, a gate line pattern 92, and a light-emitting control signal line pattern 93. At least a part of the initialization signal line pattern 94, at least a part of the reset signal line pattern 95, at least a part of the gate line pattern 92, and at least a part of the light-emitting control signal line pattern 93 all extend in a first direction.

The subpixel further includes:
- a first data line pattern 981 and a second data line pattern 982 that are disposed opposite to each other in the first direction, where at least a part of the first data line pattern 981 and at least a part of the second data line pattern 982 both extend in the second direction; and
- a subpixel driving circuit, where the subpixel driving circuit includes a first transistor T1, a second transistor T2, a third transistor T3, a fourth transistor T4, a fifth transistor T5, a sixth transistor T6, a seventh transistor T7, and a storage capacitor Cst.

A gate electrode of the third transistor T3 is coupled to a second electrode of the first transistor T1. A first electrode of the third transistor T3 is coupled to a second electrode of the fifth transistor T5. A second electrode of the third transistor T3 is coupled to a first electrode of the first transistor T1.

A gate electrode of the first transistor T1 is coupled to the gate line pattern 92.

A gate electrode of the second transistor T2 is coupled to the reset signal line pattern 95. A first electrode of the second transistor T2 is coupled to the initialization signal line pattern 94. A second electrode of the second transistor T2 is coupled to the gate electrode of the third transistor T3.

A gate electrode of the fourth transistor T4 is coupled to the gate line pattern 92. A first electrode of the fourth transistor T4 is coupled to the first data line pattern 981 or the second data line pattern 982. A second electrode of the fourth transistor T4 is coupled to the first electrode of the third transistor T3.

A gate electrode of the fifth transistor T5 is coupled to the light-emitting control signal line pattern 93. A first electrode of the fifth transistor T5 is coupled to the power signal line pattern.

A gate electrode of the sixth transistor T6 is coupled to the light-emitting control signal line pattern 93. A first electrode of the sixth transistor T6 is coupled to the second electrode of the third transistor T3. A second electrode of the sixth transistor T6 is coupled to the light-emitting element.

A gate electrode of the seventh transistor T7 is coupled to a reset signal line pattern 95' in a next subpixel adjacent in the second direction. A first electrode of the seventh transistor T7 is coupled to an initialization signal line pattern 94' in the next subpixel adjacent in the second direction. A second electrode of the seventh transistor T7 is coupled to the light-emitting element.

The first plate Cst1 of the storage capacitor Cst is reused as the gate electrode of the third transistor T3. The second plate Cst2 of the storage capacitor Cst is coupled to the power signal line pattern.

Specifically, each subpixel further includes a subpixel driving circuit. One subpixel driving circuit is used as an example. The subpixel driving circuit includes seven thin-film transistors and one capacitor. The transistors included in the subpixel driving circuit are all P-type transistors. A first electrode of each transistor includes a source electrode, and a second electrode of each transistor includes a drain electrode. It needs to be noted that a power signal transmitted on the power signal line pattern 91 is a high-potential direct-current signal. The signal transmitted on a negative power signal line VSS is a low-potential direct-current signal. An initialization signal transmitted by the initialization signal line pattern 94 is a low-potential direct-current signal.

The first transistor T1 is a double-gate structure. A gate electrode 201g of the first transistor T1 is coupled to the gate line pattern 92. A source electrode S1 of the first transistor T1 is coupled to the drain electrode D3 of the third transistor T3 (that is, a driving transistor). A drain electrode D1 of the first transistor T1 is coupled to a gate electrode 203g of the third transistor T3.

The second transistor T2 is a double-gate structure. A gate electrode 202g of the second transistor T2 is coupled to the reset signal line pattern 95. A source electrode S2 of the second transistor T2 is coupled to the initialization signal line pattern 94. A drain electrode D2 of the second transistor T2 is coupled to the gate electrode 203g of the third transistor T3.

A gate electrode 204g of the fourth transistor T4 is coupled to the gate line pattern 92. A source electrode S4 of the fourth transistor T4 is coupled to the first data line pattern 981 or the second data line pattern 982. A drain electrode D4 of the fourth transistor T4 is coupled to a source electrode S3 of the third transistor T3.

A gate electrode 205g of the fifth transistor T5 is coupled to the light-emitting control signal line pattern 93. A source electrode S5 of the fifth transistor T5 is coupled to the power signal line pattern 91. A drain electrode D5 of the fifth transistor T5 is coupled to the source electrode S3 of the third transistor T3.

A gate electrode 206g of the sixth transistor T6 is coupled to the light-emitting control signal line pattern 93. A source electrode S6 of the sixth transistor T6 is coupled to the drain electrode D3 of the third transistor T3. A drain electrode D6 of the sixth transistor T6 is coupled to an anode of the light-emitting element EL.

A gate electrode 207g of the seventh transistor T7 is coupled to a reset signal line pattern 95' in a next subpixel adjacent in the second direction. A drain electrode D7 of the seventh transistor T7 is coupled to the anode of the corresponding light-emitting element EL. A source electrode S7 of the seventh transistor T7 is coupled to the initialization signal line pattern 94' in the next subpixel adjacent in the second direction.

The first plate Cst1 of the storage capacitor Cst is reused as the gate electrode 203g of the third transistor T3. The second plate Cst2 of the storage capacitor Cst is coupled to the power signal line pattern 91.

As shown in FIG. 16 to FIG. 19, in some embodiments, the subpixel driving circuit further includes a sixth transistor T6, and a first electrode of the sixth transistor T6 is connected to a second electrode of the driving transistor (that is, the third transistor).

The subpixel further includes a third conductive connection portion 963, a fourth conductive connection portion 964, and a light-emitting element that are laminated in sequence in a direction away from the base. The light-emitting element includes an anode pattern 70.

An orthographic projection of a second electrode of the sixth transistor T6 onto the base and an orthographic projection of the third conductive connection portion 963 onto the base have a third overlapping region. The second electrode of the sixth transistor T6 is coupled to the third conductive connection portion 963 in the third overlapping region.

The orthographic projection of the third conductive connection portion 963 onto the base and an orthographic projection of the fourth conductive connection portion 964 onto the base have a fourth overlapping region. The third conductive connection portion 963 is coupled to the fourth conductive connection portion 964 in the fourth overlapping region.

The orthographic projection of the fourth conductive connection portion 964 onto the base and an orthographic projection of the anode pattern onto the base have a fifth overlapping region. The fourth conductive connection portion 964 is coupled to the anode pattern in the fifth overlapping region.

For example, the subpixel driving circuit further includes a sixth transistor T6. A gate electrode of the sixth transistor T6 is coupled to the light-emitting control signal line pattern 93. A first electrode of the sixth transistor T6 is coupled to the second electrode of the driving transistor. The orthographic projection of a second electrode of the sixth transistor T6 onto the base and the orthographic projection of the third conductive connection portion 963 onto the base have a third overlapping region. The second electrode of the sixth transistor T6 is coupled to the third conductive connection portion 963 through a first via hole 61 provided in the third overlapping region.

The orthographic projection of the third conductive connection portion 963 onto the base and the orthographic projection of the fourth conductive connection portion 964 onto the base have a fourth overlapping region. The third conductive connection portion 963 is coupled to the fourth conductive connection portion 964 through a second via hole 62 provided in the fourth overlapping region.

The orthographic projection of the fourth conductive connection portion 964 onto the base and the orthographic projection of the anode pattern 70 onto the base have a fifth overlapping region. The fourth conductive connection portion 964 is coupled to the anode pattern through a third via hole 63 provided in the fifth overlapping region.

In a light-emitting period, the sixth transistor T6 transmits a driving signal outputted by the second electrode of the driving transistor to the anode pattern 70 of the light-emitting element through the third conductive connection portion 963 and the fourth conductive connection portion 964 in sequence.

In the display substrate provided in the foregoing embodiment, it is provided that the second electrode of the sixth transistor T6 is coupled in sequence to the anode pattern through the third conductive connection portion 963 and the fourth conductive connection portion 964, to better ensure the coupling performance between the second electrode of the sixth transistor T6 and the anode pattern.

Figure 20:
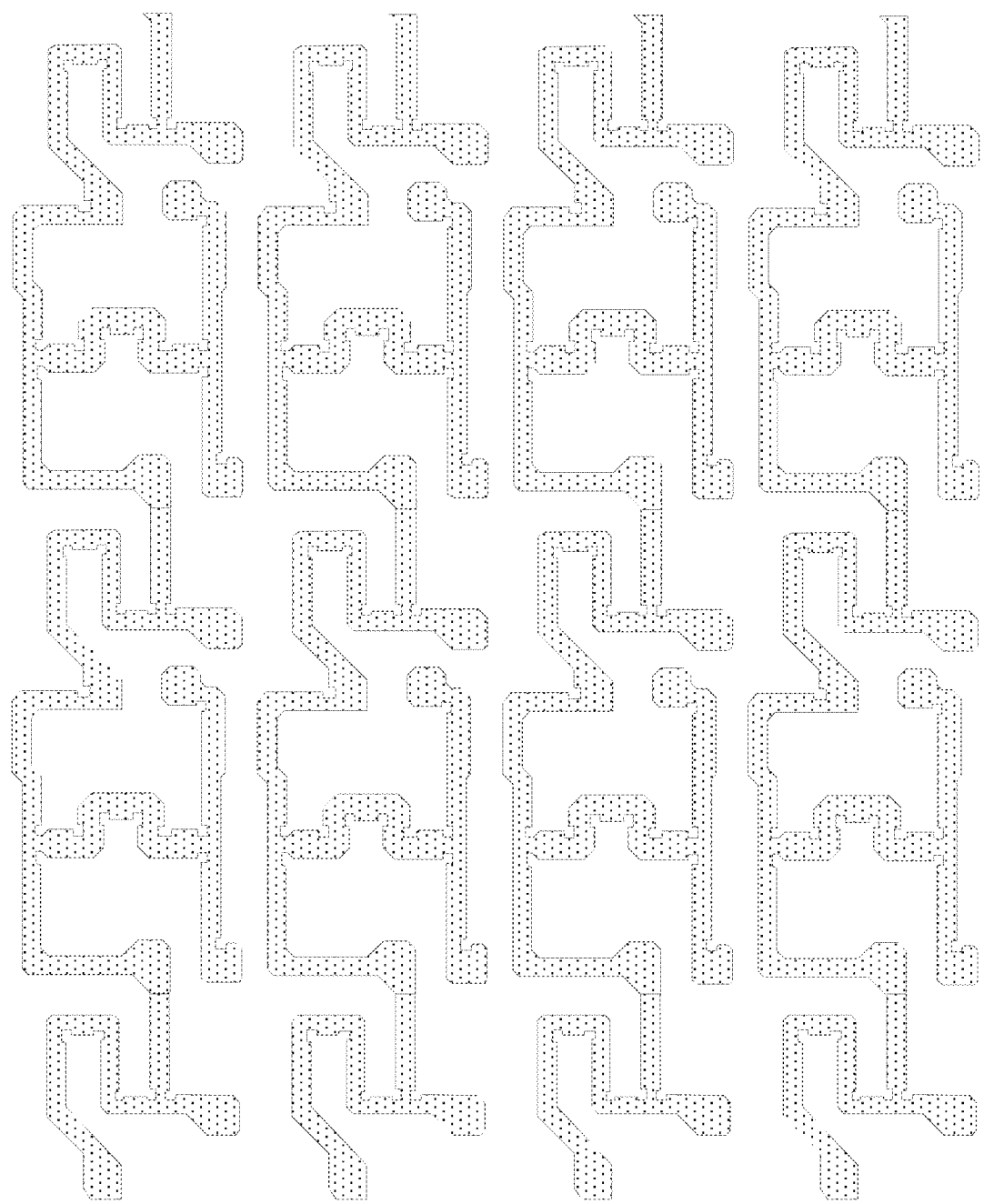
FIG. 20 is a schematic layout diagram of an active layer in FIG. 16.
Figure 21:
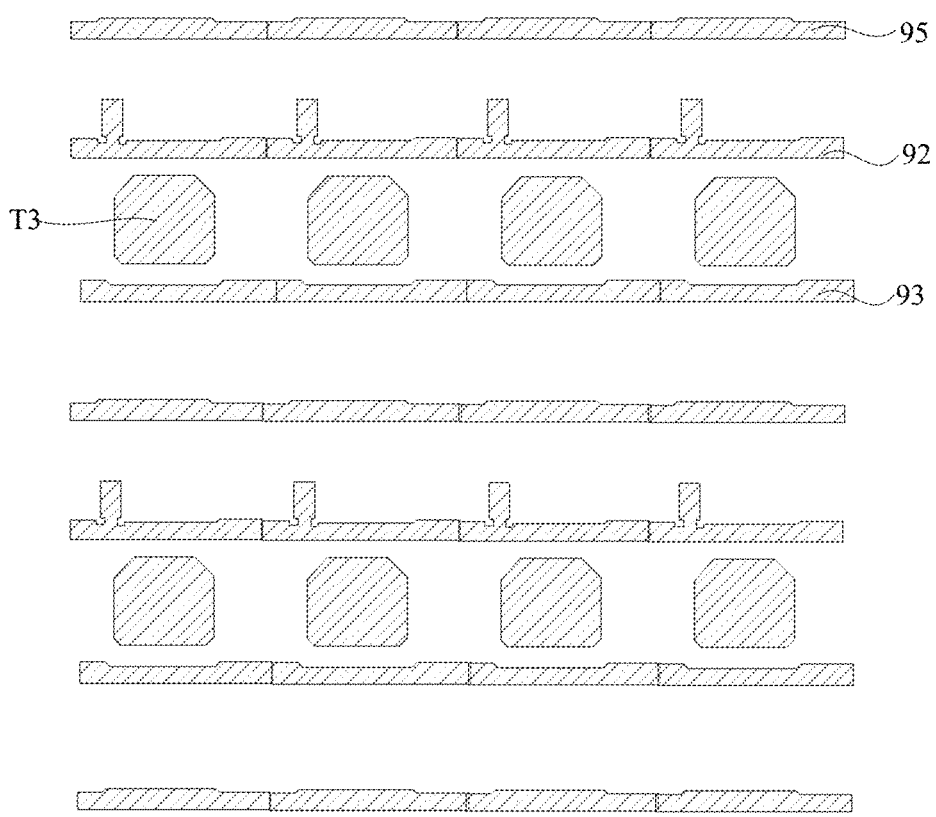
FIG. 21 is a schematic layout diagram of a first gate metal layer in FIG. 16.
Figure 22:
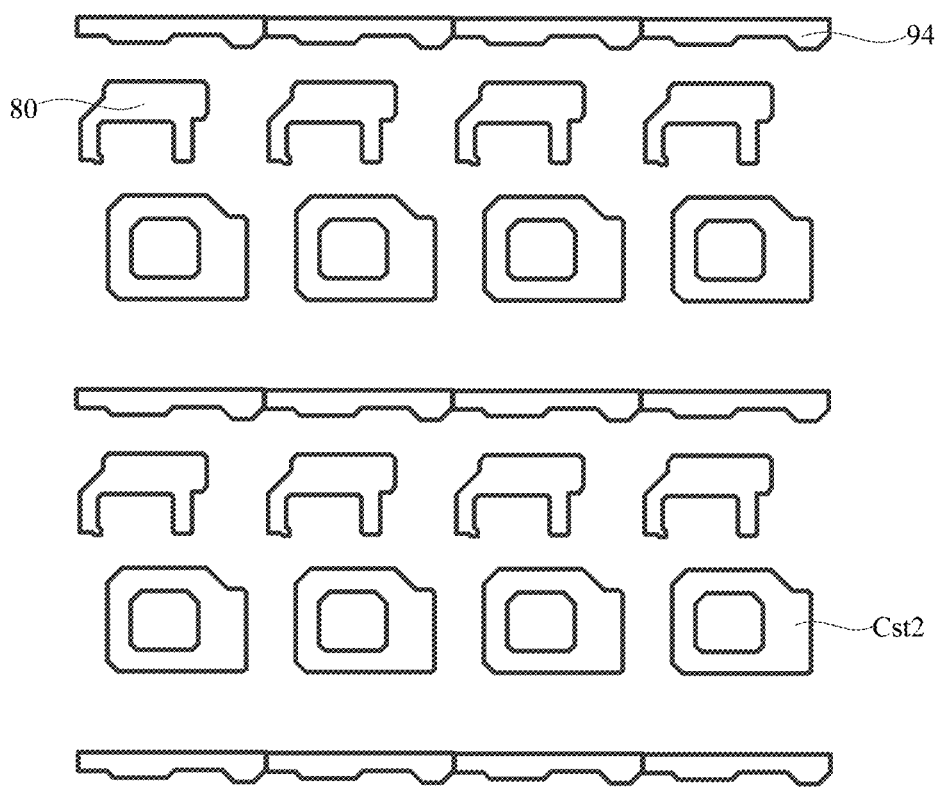
FIG. 22 is a schematic layout diagram of a second gate metal layer in FIG. 16.
Figure 23:
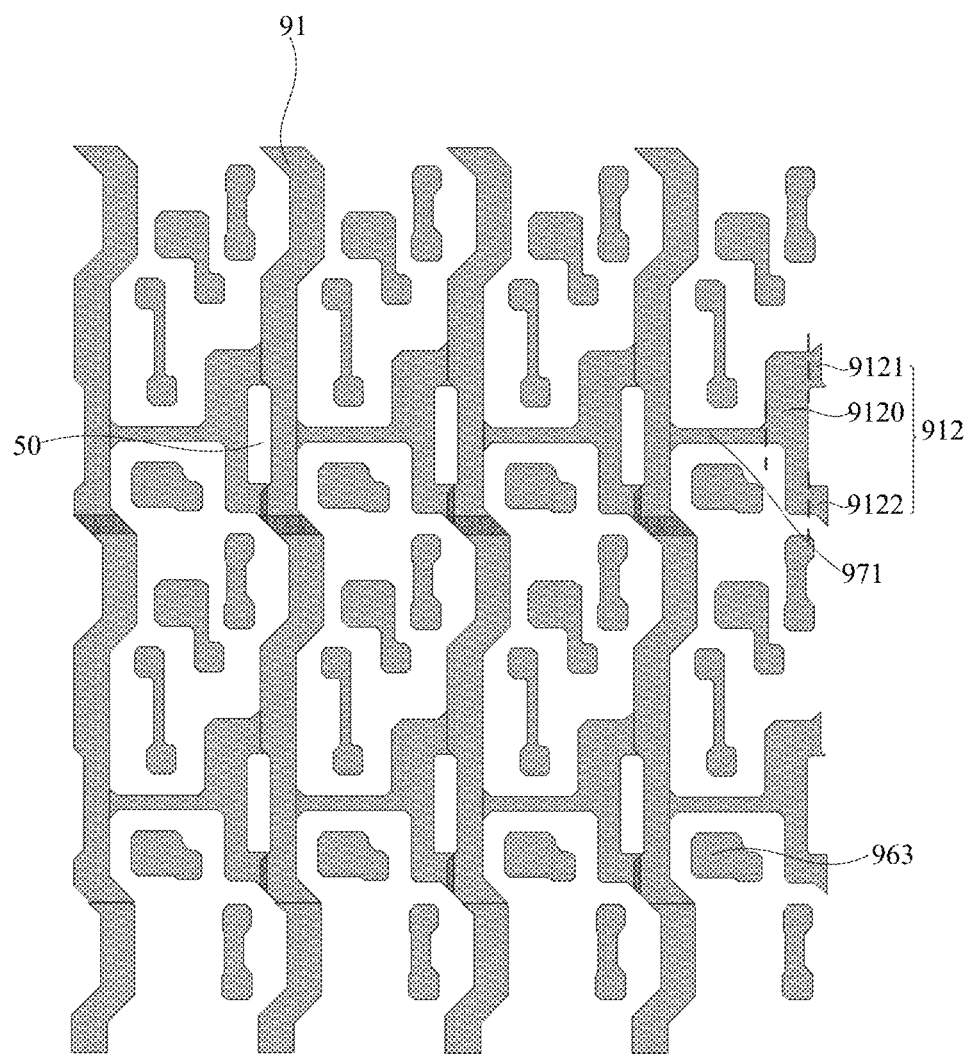
FIG. 23 is a schematic layout diagram of a first source-drain metal layer in FIG. 16.

It needs to be noted that in the drawings provided in the present disclosure, a small box with a cross represents a via hole. In FIG. 4, FIG. 9, and FIG. 13, the same active layer, first gate metal layer, second gate metal layer, and second source-drain metal layer are provided. That is, FIG. 5 shows the active layer and the first gate metal layer in FIG. 4, FIG. 9, and FIG. 13. FIG. 6 shows the second gate metal layer in FIG. 4, FIG. 9, and FIG. 13. FIG. 8 shows the second source-drain metal layer in FIG. 4, FIG. 9, and FIG. 13. FIG. 20 shows a layout of an active layer in FIG. 16. FIG. 21 shows the first gate metal layer in FIG. 16. FIG. 22 shows the second gate metal layer in FIG. 16. FIG. 23 shows a first source-drain metal layer in FIG. 16.

Figure 26:
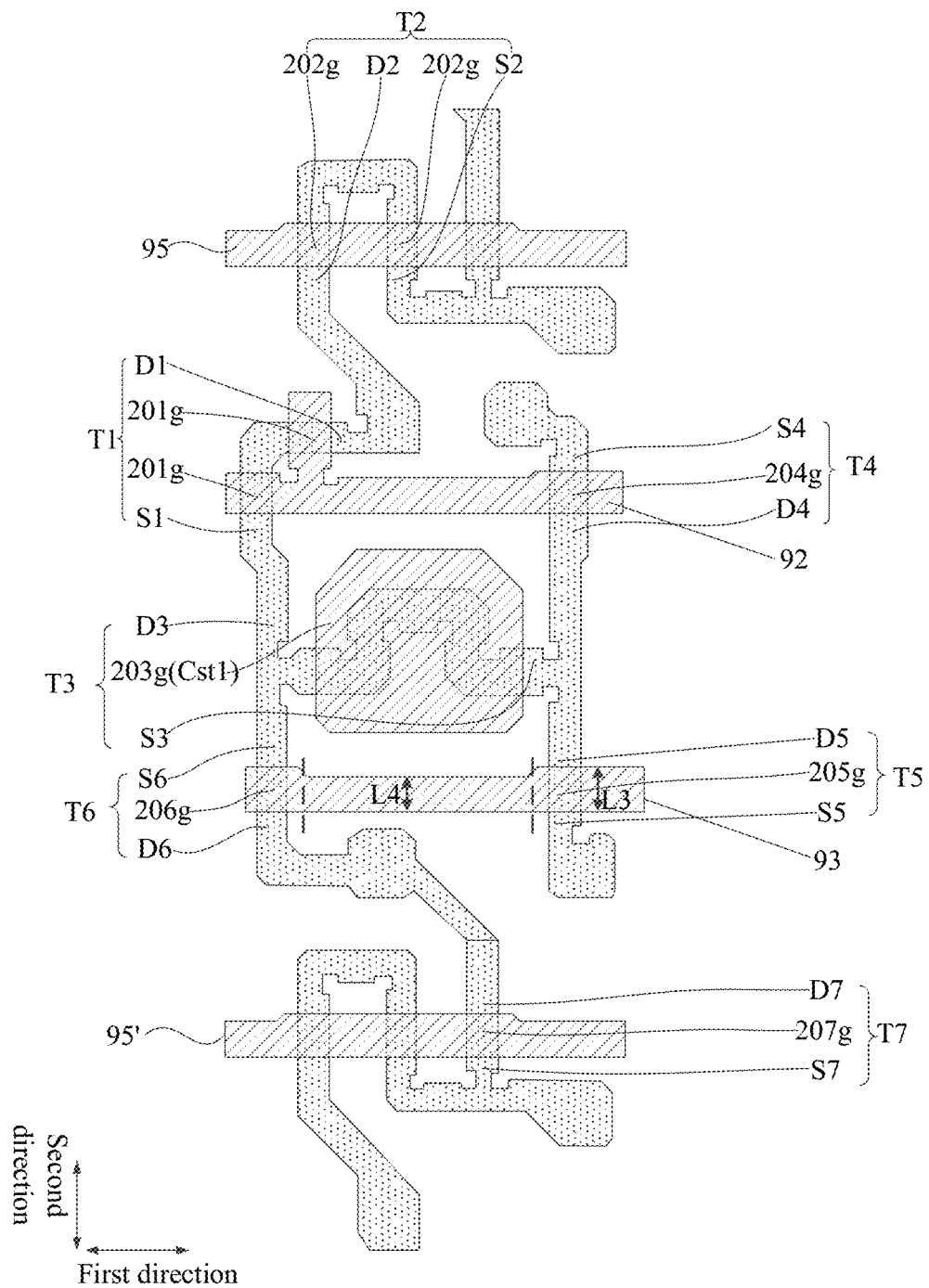
FIG. 26 is a schematic layout diagram of a first source-drain metal layer in FIG. 24.
Figure 35:
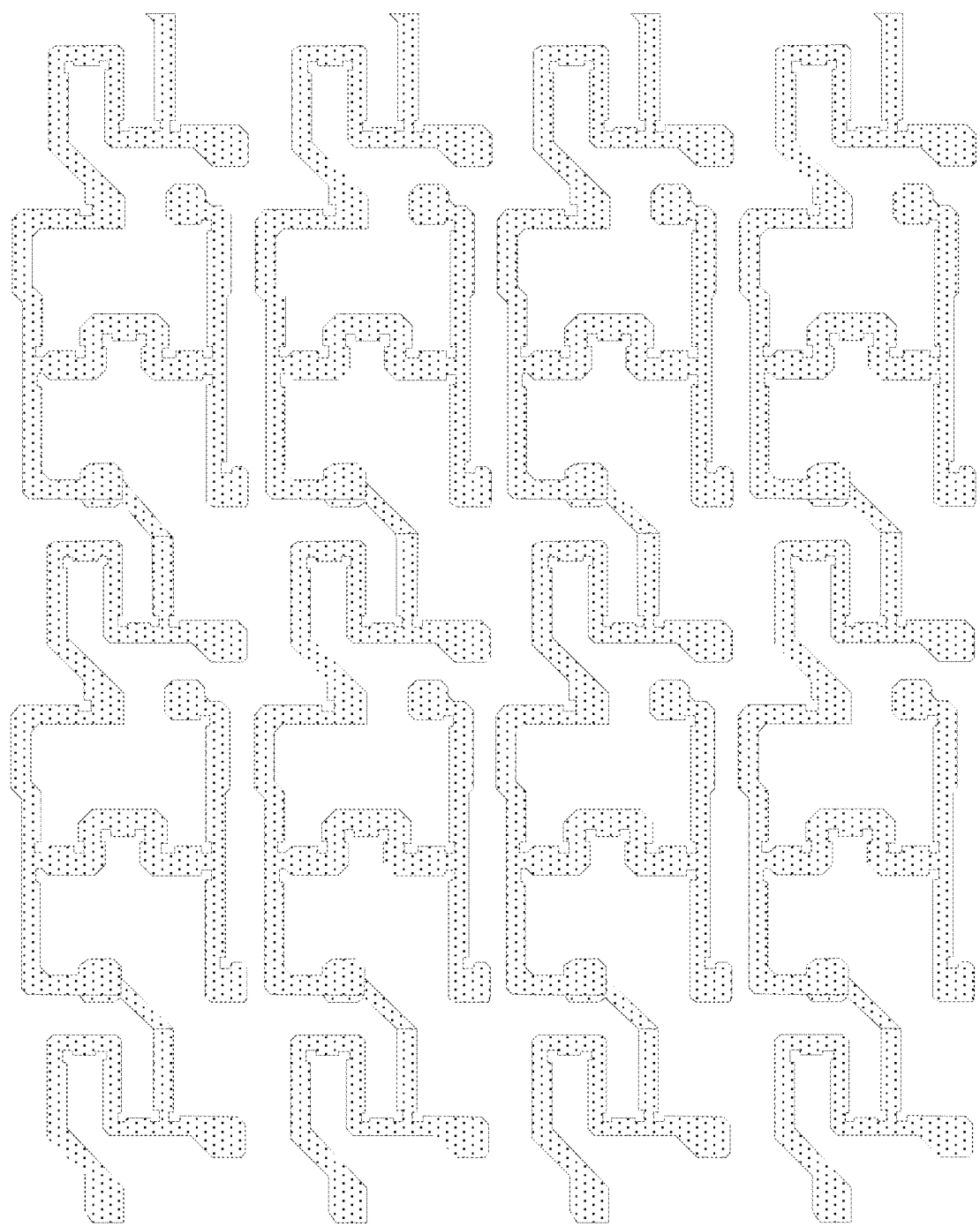
FIG. 35 is a schematic layout diagram of an active layer in FIG. 33.
Figure 36:
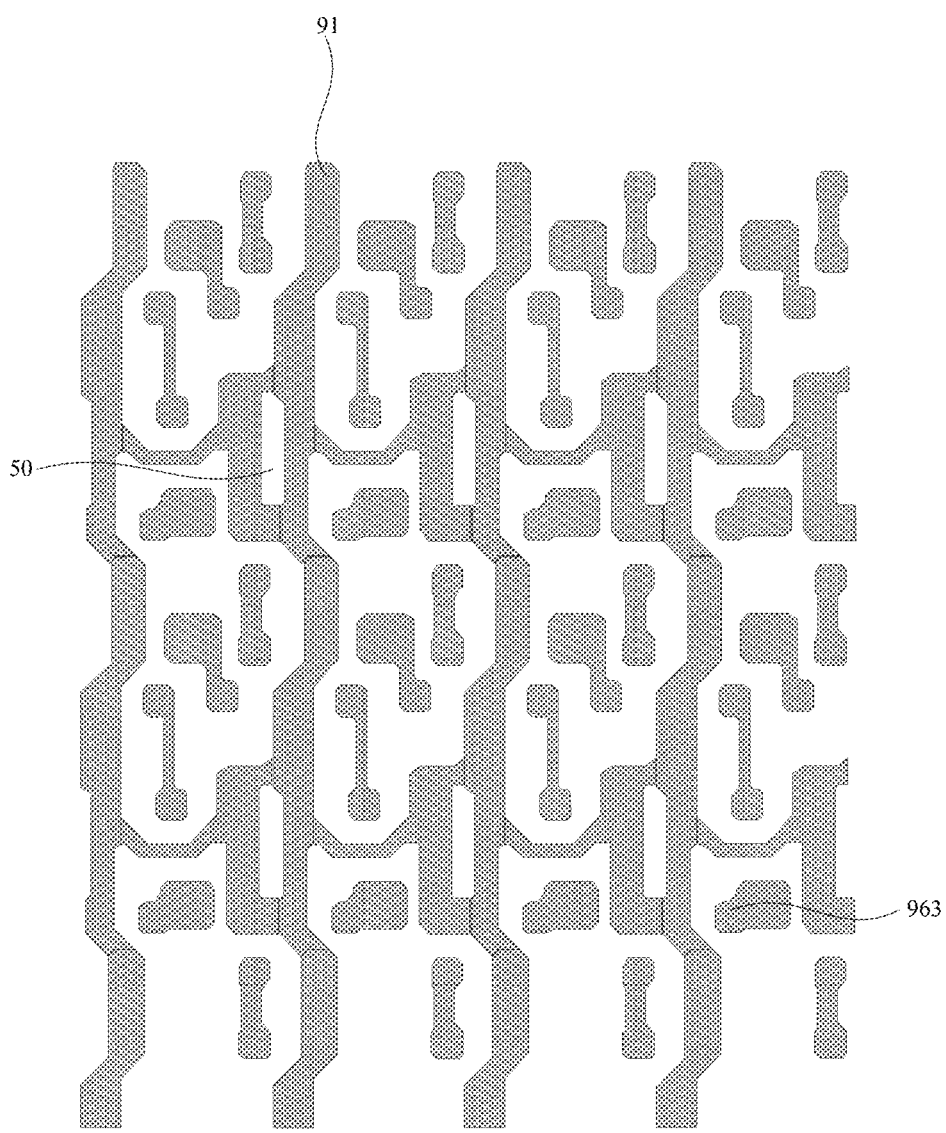
FIG. 36 is a schematic layout diagram of a first source-drain metal layer in FIG. 33.

In FIG. 24 and FIG. 30, the same active layer, first gate metal layer, second gate metal layer, and second source-drain metal layer are provided. That is, FIG. 26 shows the active layer and the first gate metal layer in FIG. 24 and FIG. 30. FIG. 28 shows the second source-drain metal layer in FIG. 24 and FIG. 30. It needs to be noted that a layout of the second gate metal layer in FIG. 24 and FIG. 30 is basically the same as that in FIG. 6. FIG. 35 shows a layout of an active layer in FIG. 33. FIG. 36 shows a layout of a first source-drain metal layer in FIG. 33. FIG. 37 shows a layout of the second source-drain metal layer and an anode layer in FIG. 33.

An embodiment of the present disclosure further provides a display apparatus, including the display substrate provided in the foregoing embodiments.

In the display substrate provided in the foregoing embodiments, it is provided that the overlapping area between the anode pattern of the first subpixel and the power signal line pattern 91 is larger than the overlapping area between the anode pattern of the second subpixel and the power signal line pattern 91, and it is provided that the overlapping area between the anode pattern of the first subpixel and the first power line portion 911 is larger than the overlapping area between the anode pattern of the first subpixel and the second power line portion 912, so that in a direction perpendicular to the base, the anode pattern of the first subpixel can have a relatively large overlapping area with the power signal line pattern 91, thereby adequately reducing an area, blocked by the anode pattern of the first subpixel, of other region than the region in which the power signal line pattern 91 is located, to effectively increase the light transmittance of the display substrate. Therefore, when the display substrate provided in the embodiments of the present disclosure is compatible with an optical fingerprint recognition technology, an adequate condition can be provided for the acquisition of a light signal by the sensor, thereby effectively improving the speed and accuracy of fingerprint recognition.

In addition, in the display substrate provided in the foregoing embodiment, only a layout position of the anode pattern of the first subpixel is adjusted, and operations of reducing a line width of metal wiring other than the power signal line pattern 91, shrinking the size of a light-emitting element, shrinking the size of a transistor or a capacitor, and the like are not performed. Therefore, while the resolution is increased, the display substrate provided in the embodiments of the present disclosure does not tend to cause negative impact on the performance of the display substrate.

When the display apparatus provided in the embodiments of the present disclosure includes the foregoing display substrate, the foregoing beneficial effects are also achieved. Details are not described herein again.

It needs to be noted that the display apparatus may be a television, a display, a digital photo frame, a mobile phone, a tablet computer, or any product or component having a display function.

An embodiment of the present disclosure further provides a method of manufacturing a display substrate, applied to the manufacture of the display substrate provided in the foregoing embodiments. The foregoing manufacturing method includes: manufacturing, on a base, a plurality of subpixels distributed in an array, where the plurality of subpixels include a first subpixel and a second subpixel, and steps of manufacturing each subpixel specifically include:

manufacturing a power signal line pattern, where the power signal line pattern includes a first power line portion and a second power line portion; and at least a part of the first power line portion extends in a second direction; and manufacturing a light-emitting element, where the light-emitting element includes an anode pattern; and in the display substrate:

an overlap between the anode pattern of the first subpixel and the power signal line pattern is larger in area than an overlap between the anode pattern of the second subpixel and the power signal line pattern, and an overlap between the anode pattern of the first subpixel and the first power line portion is larger in area than an overlap between the anode pattern of the first subpixel and the second power line portion.

In the display substrate manufactured by using the manufacturing method provided in the embodiments of the present disclosure, it is provided that the overlapping area between the anode pattern of the first subpixel and the power signal line pattern 91 is larger than the overlapping area between the anode pattern of the second subpixel and the power signal line pattern 91, and it is provided that the overlapping area between the anode pattern of the first subpixel and the first power line portion 911 is larger than the overlapping area between the anode pattern of the first subpixel and the second power line portion 912, so that in a direction perpendicular to the base, the anode pattern of the first subpixel can overlap the power signal line pattern 91 in a relatively large area, thereby adequately reducing an area, blocked by the anode pattern of the first subpixel, of other region than the region in which the power signal line pattern 91 is located, to effectively increase the light transmittance of the display substrate. Therefore, when the display substrate provided in the embodiments of the present disclosure is compatible with an optical fingerprint recognition technology, an adequate condition can be provided for the acquisition of a light signal by the sensor, thereby effectively improving the speed and accuracy of fingerprint recognition.

In addition, in the display substrate manufactured by using the manufacturing method provided in the embodiments of the present disclosure, only a layout position of the anode pattern of the first subpixel is adjusted, and operations of reducing a line width of metal wiring other than the power signal line pattern 91, shrinking the size of a light-emitting element, shrinking the size of a transistor or a capacitor, and the like are not performed. Therefore, while the resolution is increased, the display substrate provided in the embodiments of the present disclosure does not tend to cause negative impact on the performance of the display substrate.

It needs to be noted that various embodiments in the specification are described in a progressive manner. For the same or similar parts between the embodiments, reference may be made to each other. In each embodiment, a part that is different from other embodiments is concentrated and described. In particular, with respect to the method embodiment, since it is substantially similar to the product embodiment, brief description is given. For the related parts, reference may be made to the description of the parts in the product embodiment.

Unless otherwise defined, the technical terms and scientific terms used in the present disclosure have the same meaning as how they are generally understood by those of ordinary skill in the art to which the present disclosure pertains. Terms such as "first" and "second" used in the present disclosure are only used to distinguish different components and do not intend to indicate any order, number or importance. Similar terms such as "comprise" or "include" means that an element or object in front of the term covers elements or objects listed behind the term but do not exclude other elements or objects. Terms such as "connection", "coupling", and "connected" are not limited to a physical or mechanical connection, and may include an electrical connection, which may be a direct electrical connection or an indirect electrical connection. "Up", "down", "left", "right", and the like are only used to represent a relative location relationship. The relative location relationship may be correspondingly changed after the absolute locations of described objects are changed.

It may be understood that when an element such as a layer, a film, an area or a substrate is located "on" or "under" another element, the element may be "directly" located "on" or "under" the another element or there may be an intervening element.

In the description of the foregoing implementation, specific features, structures, materials or characteristics may be combined in an appropriate manner in any one or more embodiments or examples.

The foregoing descriptions are merely specific implementations of the present disclosure, but are not intended to limit the scope of the present disclosure. Any variation or replacement that may readily occur to a person skilled in the art within the technical scope disclosed in the present disclosure shall fall within the scope of the present disclosure. Therefore, the scope of the present disclosure shall be defined by the scope of the claims.

What is claimed is:

1. A display substrate, comprising a base and a plurality of subpixels distributed in an array on the base, wherein the plurality of subpixels comprise a first subpixel and a second subpixel, each of the subpixels comprises:
    a power signal line pattern, wherein the power signal line pattern comprises a first power line portion and a second power line portion; and at least a part of the first power line portion extends in a second direction; and
    a light-emitting element, wherein the light-emitting element comprises an anode pattern;
    wherein the second power line portion comprises a body portion, a first end portion, and a second end portion, the body portion is spaced from the first power line portion in a first direction, the first direction intersects the second direction, the first end portion and the second end portion are disposed opposite to each other in the second direction, the first end portion is separately coupled to one end of the body portion and the first power line portion, the second end portion is separately coupled to an other end of the body portion and the first power line portion, and a hole is provided between the first power line portion and the second power line portion;
    each of the subpixels further comprises a power compensation pattern, and the power compensation pattern forms an integral structure with the body portion and the first power line portion.

2. The display substrate according to claim 1, wherein at least a part of the power compensation pattern extends in the first direction, and the power compensation pattern is separately coupled to the body portion and the first power line portion in the subpixel adjacent in the first direction to the subpixel to which the power compensation pattern belongs.

3. The display substrate according to claim 2, wherein the power compensation pattern is a strip-like structure extending in the first direction.

4. The display substrate according to claim 2, wherein in a plane parallel to the base, in a direction perpendicular to the first direction, an end of the power compensation pattern that is directly coupled to the first power line portion has a first width, and the first width gradually increases in a direction toward the first power line portion.

5. The display substrate according to claim 2, wherein the subpixel further comprises a reset signal line pattern, a gate line pattern, and a light-emitting control signal line pattern that are distributed in sequence in the second direction; at least a part of the reset signal line pattern extends in the first direction, at least a part of the gate line pattern extends in the first direction, and at least a part of the light-emitting control signal line pattern extends in the first direction;

an orthographic projection of the power compensation pattern onto the base is located between an orthographic projection of the gate line pattern onto the base and an orthographic projection of the light-emitting control signal line pattern onto the base.

6. The display substrate according to claim 5, wherein, in the second direction, a minimum distance between the orthographic projection of the power compensation pattern onto the base and the orthographic projection of the gate line pattern onto the base is greater than a minimum distance between the orthographic projection of the power compensation pattern onto the base and the orthographic projection of the light-emitting control signal line pattern onto the base.

7. The display substrate according to claim 2, wherein the power compensation pattern comprises a first part, a second part, and a third part; the first part is separately coupled to the first power line portion and one end of the third part, the second part is separately coupled to the body portion and an other end of the third part, the third part extends in the first direction, an extension direction of the first part and an extension direction of the second part both intersect the first direction, and both intersect the second direction.

8. The display substrate according to claim 7, wherein the third part extends in the first direction, the extension direction of the first part forms an angle of 45 degrees with respect to the first direction, the extension direction of the second part forms an angle of 45 degrees with respect to the first direction, the extension direction of the first part is perpendicular to the extension direction of the second part.

9. The display substrate according to claim 2, wherein each of the subpixels further comprises a light-emitting element, the light-emitting element comprises an anode pattern, an orthographic projection of the anode pattern onto the base overlaps an orthographic projection of the power compensation pattern onto the base.

10. The display substrate according to claim 9, wherein the light-emitting control signal line pattern comprises a first light-emitting control portion and a second light-emitting control portion, and an orthographic projection of the first light-emitting control portion onto the base separately overlaps an orthographic projection of the body portion onto the base, an orthographic projection of the hole onto the base, and an orthographic projection of the first power line portion onto the base; in the second direction, an orthographic projection of the second light-emitting control portion onto the base is opposite to the orthographic projection of the power compensation pattern onto the base; and in a plane parallel to the base, in a direction perpendicular to the first direction, a width of the second light-emitting control portion is less than a width of the first light-emitting control portion.

11. The display substrate according to claim 2, wherein each of the subpixels further comprises a light-emitting control signal line pattern, and at least a part of the light-emitting control signal line pattern extends in the first direction; an orthographic projection of the light-emitting control signal line pattern onto the base partially overlaps an orthographic projection of the hole onto the base.

12. The display substrate according to claim 1, wherein the body portion comprises a first body portion and a second body portion, the first body portion is close to the first end portion, the second body portion is close to the second end portion, and in a plane parallel to the base, in a direction perpendicular to the second direction, a width of the first body portion is greater than a width of the second body portion;

each of the subpixels further comprises a subpixel driving circuit, the subpixel driving circuit comprises a driving transistor and a storage capacitor, a first plate of the storage capacitor is coupled to a gate electrode of the driving transistor, an orthographic projection of a second plate of the storage capacitor onto the base overlaps an orthographic projection of the first body portion onto the base, and the second plate of the storage capacitor is coupled to the first body portion through a via hole provided at the overlap.

13. The display substrate according to claim 12, wherein an orthographic projection of the second plate of the storage capacitor onto the base does not overlap an orthographic projection of the hole onto the base.

14. The display substrate according to claim 1, wherein the plurality of subpixels are divided into a plurality of rows of subpixels, and each row of subpixels comprises plural subpixels arranged in sequence in the first direction; and each of the subpixels further comprises:
a first data line pattern and a second data line pattern that are disposed opposite to each other in the first direction, wherein at least a part of the first data line pattern and at least a part of the second data line pattern both extend in the second direction; and
an orthographic projection of the first data line pattern onto the base overlaps an orthographic projection of a first power line portion in a subpixel, adjacent in the first direction to the subpixel to which the first data line pattern belongs, onto the base, and an orthographic projection of the second data line pattern onto the base overlaps an orthographic projection of the body portion onto the base.

15. The display substrate according to claim 14, wherein the orthographic projection of the first data line pattern onto the base does not overlap an orthographic projection of the hole onto the base; and/or the orthographic projection of the second data line pattern onto the base does not overlap the orthographic projection of the hole onto the base.

16. The display substrate according to claim 1, wherein the first power line portion comprises a second sub-portion and a first sub-portion that is used for defining the hole, and in a plane parallel to the base, in a direction perpendicular to the second direction, a width of the first sub-portion is less than a width of the second sub-portion.

17. The display substrate according to claim 1, wherein each of the subpixels further comprises the light-emitting element, an initialization signal line pattern, a reset signal line pattern, a gate line pattern, and a light-emitting control signal line pattern; and at least a part of the initialization signal line pattern, at least a part of the reset signal line pattern, at least a part of the gate line pattern, and at least a part of the light-emitting control signal line pattern all extend in the first direction; and
each of the subpixels further comprises:
a first data line pattern and a second data line pattern that are disposed opposite to each other in the first direction, wherein at least a part of the first data line pattern and at least a part of the second data line pattern both extend in the second direction; and
a subpixel driving circuit, wherein the subpixel driving circuit comprises a first transistor, a second transistor, a third transistor, a fourth transistor, a fifth transistor, a sixth transistor, a seventh transistor, and a storage capacitor,
wherein a gate electrode of the third transistor is coupled to a second electrode of the first transistor, a first electrode of the third transistor is coupled to a second electrode of the fifth transistor, and a second electrode of the third transistor is coupled to a first electrode of the first transistor;

a gate electrode of the first transistor is coupled to the gate line pattern;

a gate electrode of the second transistor is coupled to the reset signal line pattern, a first electrode of the second transistor is coupled to the initialization signal line pattern, and a second electrode of the second transistor is coupled to the gate electrode of the third transistor;

a gate electrode of the fourth transistor is coupled to the gate line pattern; and a first electrode of the fourth transistor is coupled to the first data line pattern or the second data line pattern, and a second electrode of the fourth transistor is coupled to the first electrode of the third transistor;

a gate electrode of the fifth transistor is coupled to the light-emitting control signal line pattern, and a first electrode of the fifth transistor is coupled to the power signal line pattern;

a gate electrode of the sixth transistor is coupled to the light-emitting control signal line pattern, a first electrode of the sixth transistor is coupled to the second electrode of the third transistor, and a second electrode of the sixth transistor is coupled to the light-emitting element;

a gate electrode of the seventh transistor is coupled to the reset signal line pattern of a next subpixel adjacent in the second direction, a first electrode of the seventh transistor is coupled to the initialization signal line pattern of the next subpixel adjacent in the second direction, and a second electrode of the seventh transistor is coupled to the light-emitting element; and a first plate of the storage capacitor is reused as the gate electrode of the third transistor, and the second plate of the storage capacitor is coupled to the power signal line pattern.

18. A display apparatus, comprising a display substrate, wherein the display substrate comprises a base and a plurality of subpixels distributed in an array on the base, the plurality of subpixels comprise a first subpixel and a second subpixel, each of the subpixels comprises:

a power signal line pattern, wherein the power signal line pattern comprises a first power line portion and a second power line portion; and at least a part of the first power line portion extends in a second direction; and a light-emitting element, wherein the light-emitting element comprises an anode pattern;

wherein the second power line portion comprises a body portion, a first end portion, and a second end portion, the body portion is spaced from the first power line portion in a first direction, the first direction intersects the second direction, the first end portion and the second end portion are disposed opposite to each other in the second direction, the first end portion is separately coupled to one end of the body portion and the first power line portion, the second end portion is separately coupled to an other end of the body portion and the first power line portion, and a hole is provided between the first power line portion and the second power line portion;

the subpixel further comprises a power compensation pattern, and the power compensation pattern forms an integral structure with the body portion and the first power line portion.

* * * * *